United States Patent
Haneda et al.

(10) Patent No.: US 8,709,896 B2
(45) Date of Patent: Apr. 29, 2014

(54) SEMICONDUCTOR DEVICE AND FABRICATION METHOD

(75) Inventors: Masaki Haneda, Yokohama (JP); Yuka Kase, Yokohama (JP); Masanori Terahara, Yokohama (JP); Takayuki Aoyama, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/440,506

(22) Filed: Apr. 5, 2012

(65) Prior Publication Data

US 2012/0256264 A1 Oct. 11, 2012

(30) Foreign Application Priority Data

Apr. 5, 2011 (JP) .................................. 2011-084093
Jan. 5, 2012 (JP) .................................. 2012-000836

(51) Int. Cl.
*H01L 21/336* (2006.01)
(52) U.S. Cl.
USPC .................................. 438/280; 257/E21.431
(58) Field of Classification Search
USPC .......................... 438/280, 294–296, 299–300; 257/E21.431
See application file for complete search history.

(56) References Cited

U.S. PATENT DOCUMENTS

| 7,919,378 B2 * | 4/2011 | Yoon et al. ..................... 438/280 |
| 2009/0011570 A1 * | 1/2009 | Mizushima et al. .......... 438/429 |
| 2010/0320546 A1 * | 12/2010 | Tamura .......................... 257/408 |

FOREIGN PATENT DOCUMENTS

| JP | 2009-10040 A | 1/2009 |
| JP | 2011-3788 A | 1/2011 |

OTHER PUBLICATIONS

Kim, Y.S. et al., "Suppresion of Defect Formation and Their Impact on Short Channel Effects and Driveability of pMOSFET with SiGe Source/Drain" IEDM Tech, Dig., pp. 871-874, 2006.

* cited by examiner

*Primary Examiner* — Matthew W Such
*Assistant Examiner* — Ali Naraghi
(74) *Attorney, Agent, or Firm* — Westerman, Hattori, Daniels & Adrian, LLP

(57) ABSTRACT

A semiconductor device includes a semiconductor substrate including a well having a first conductivity type defined by a device isolation region, a gate insulating film formed on the semiconductor substrate, a gate electrode formed on the gate insulating film and including a first side surface and a second side surface facing the first side surface, and a first side wall insulating film formed on the first side surface and a second side wall insulating film formed on the second side surface.

11 Claims, 74 Drawing Sheets

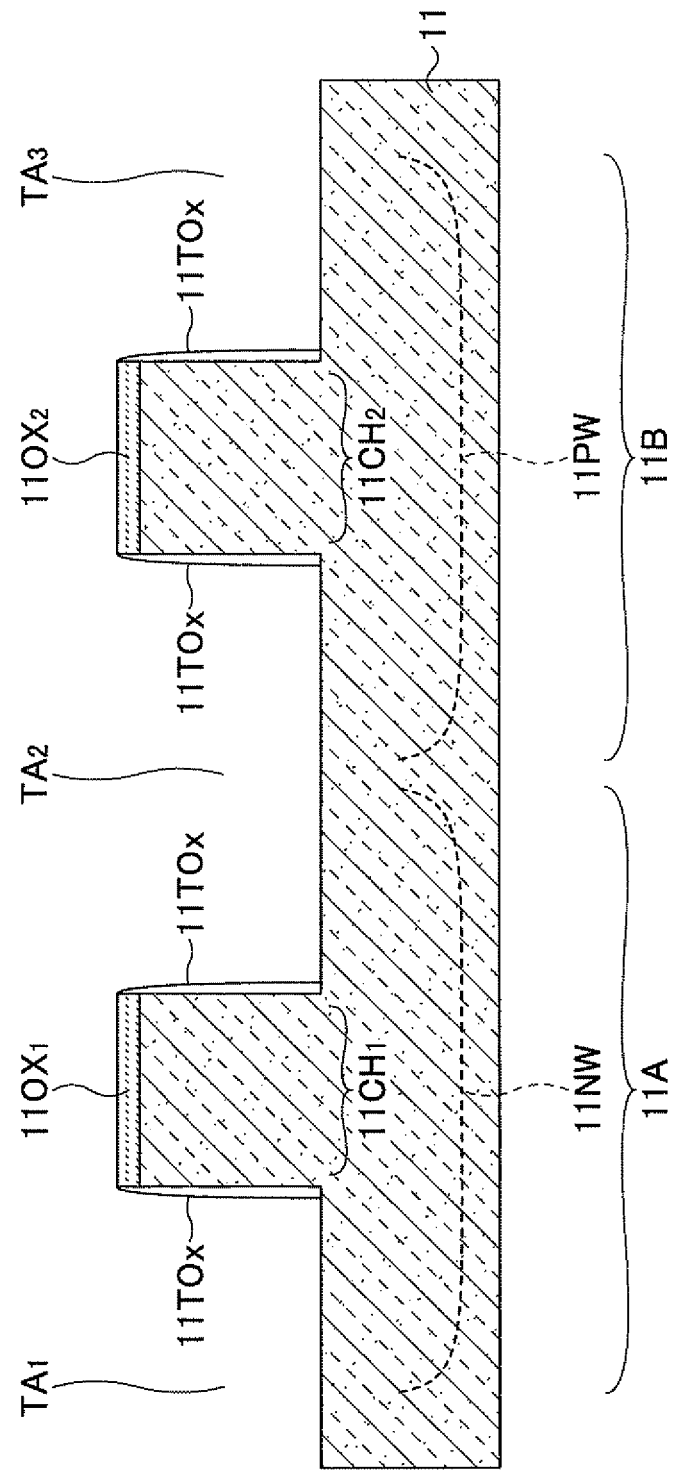

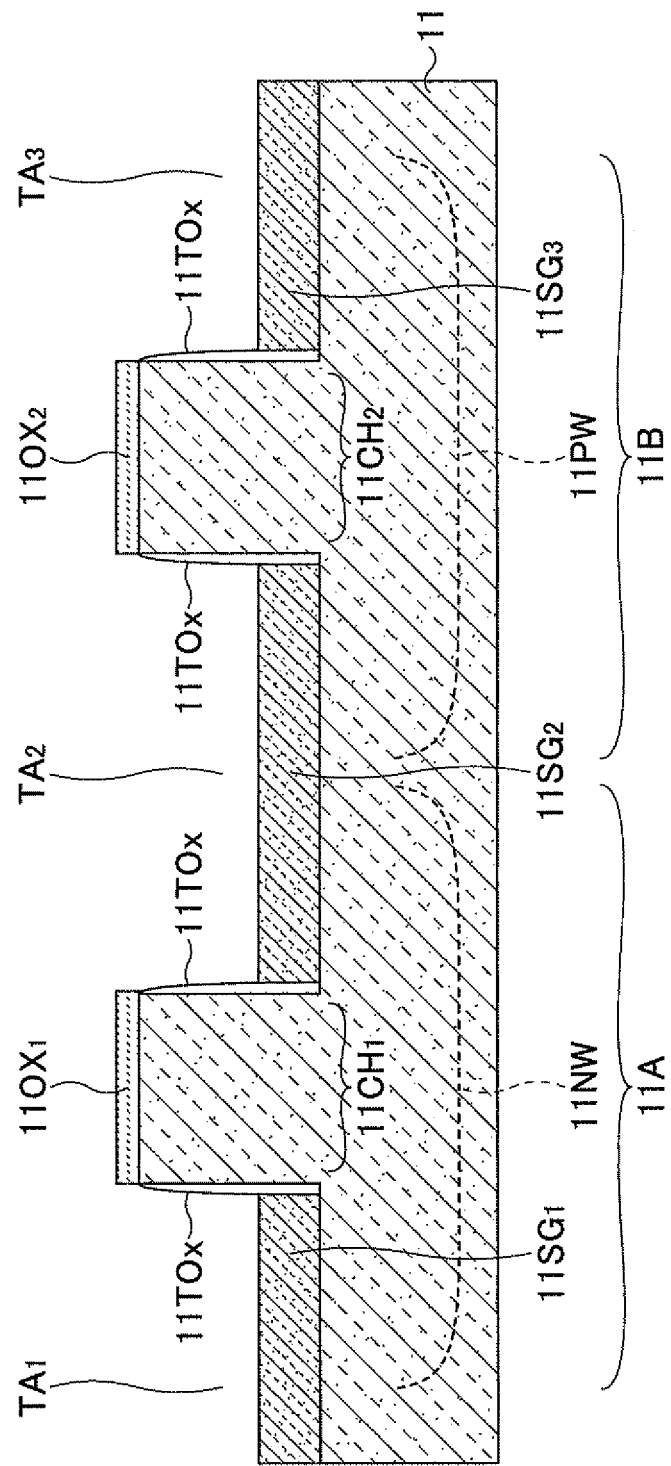

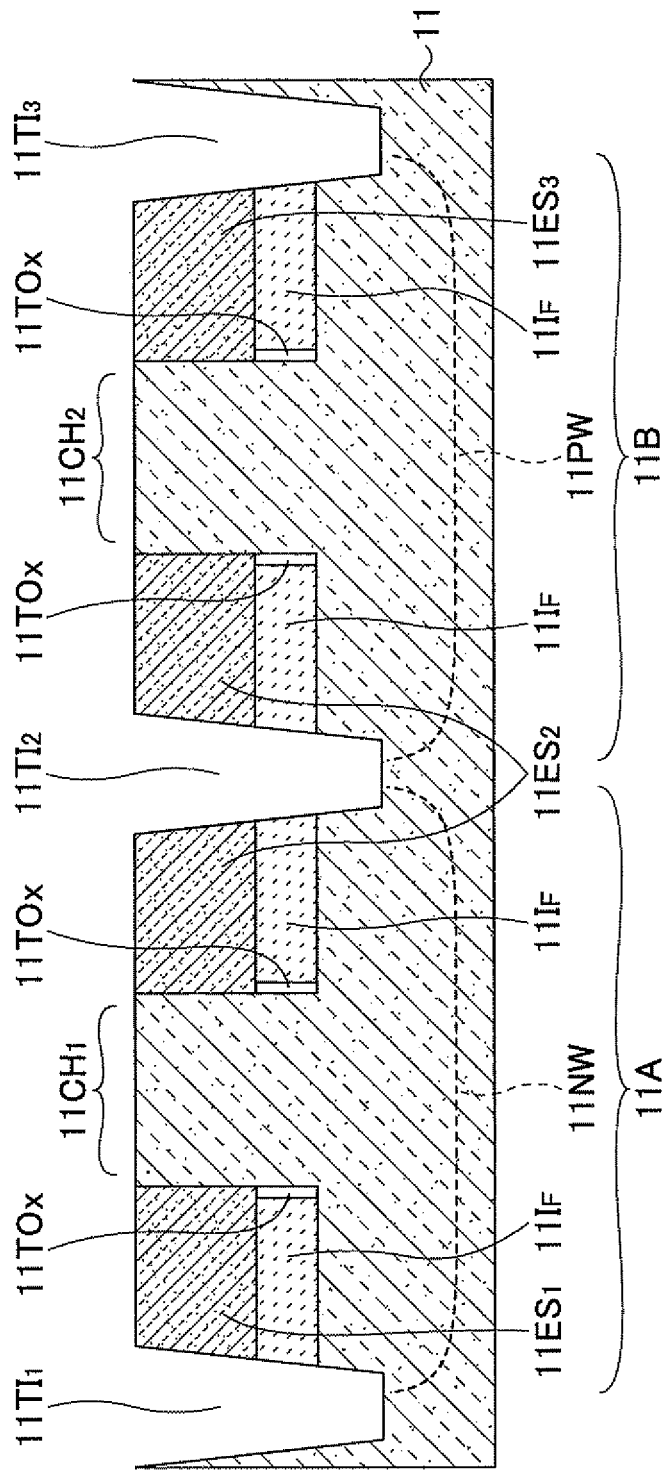

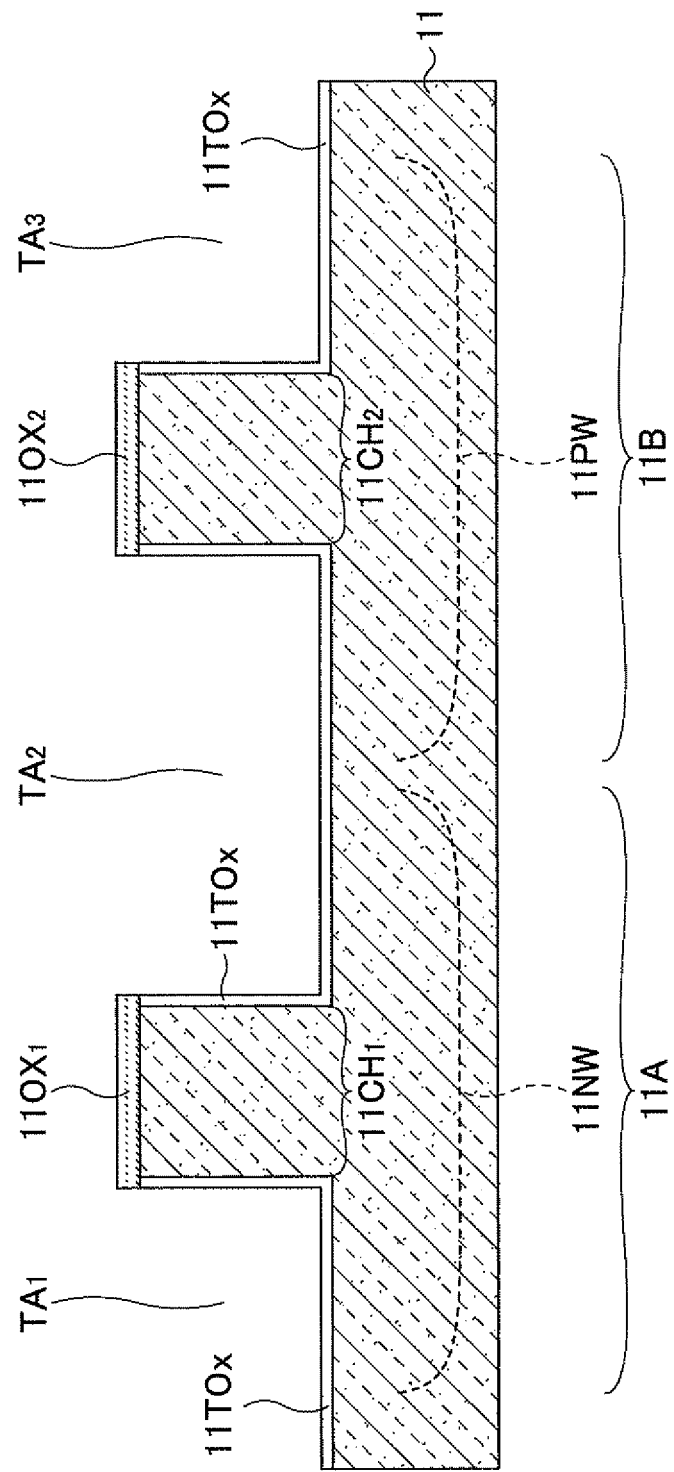

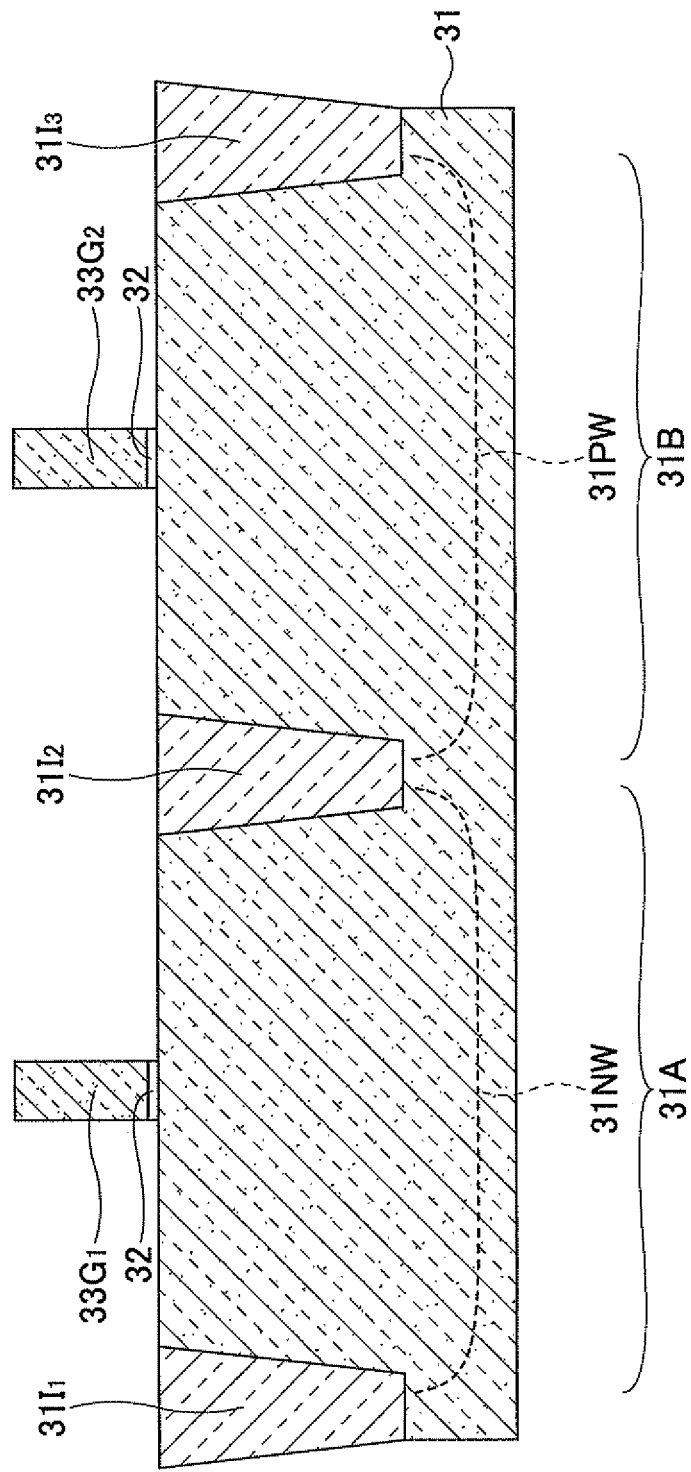

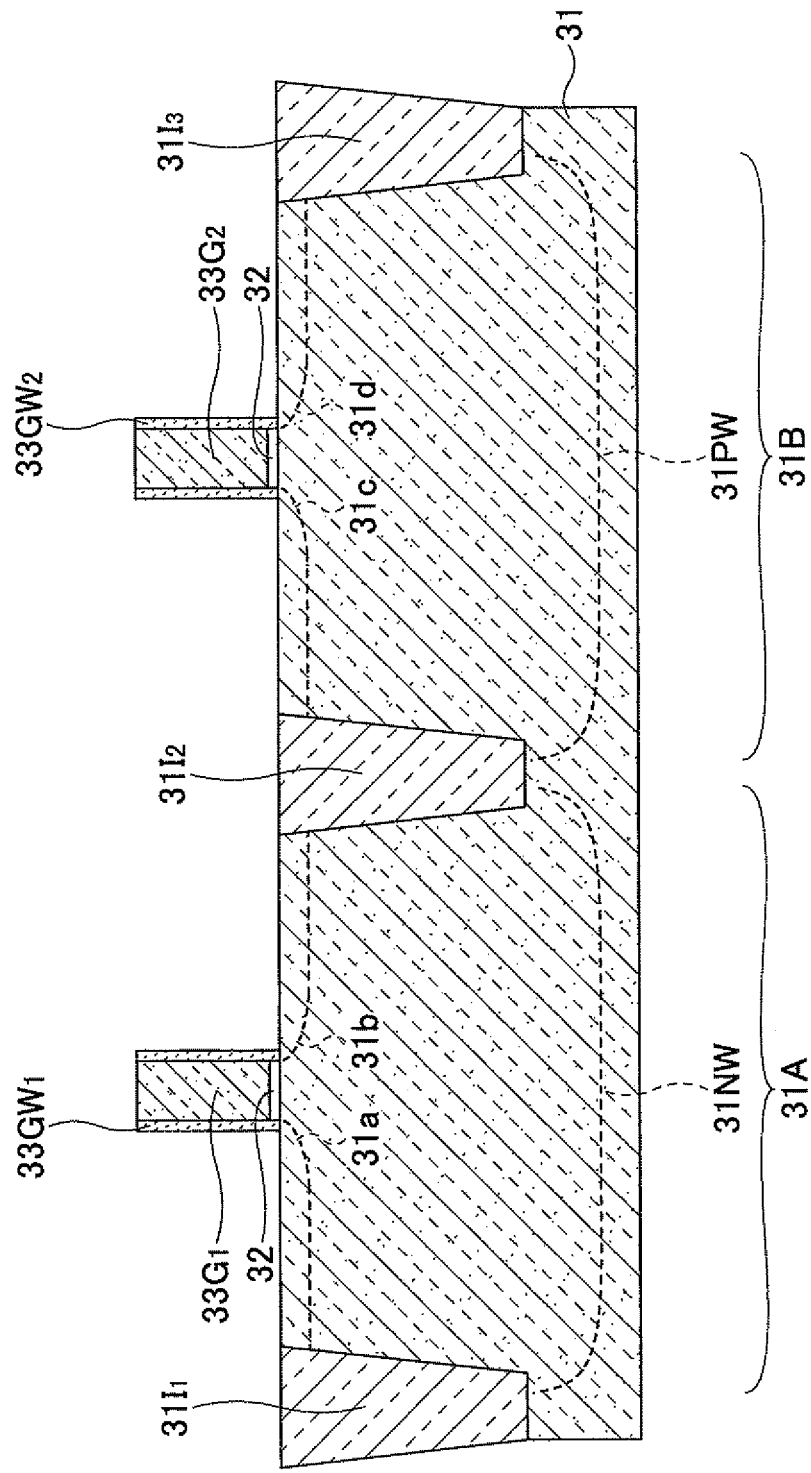

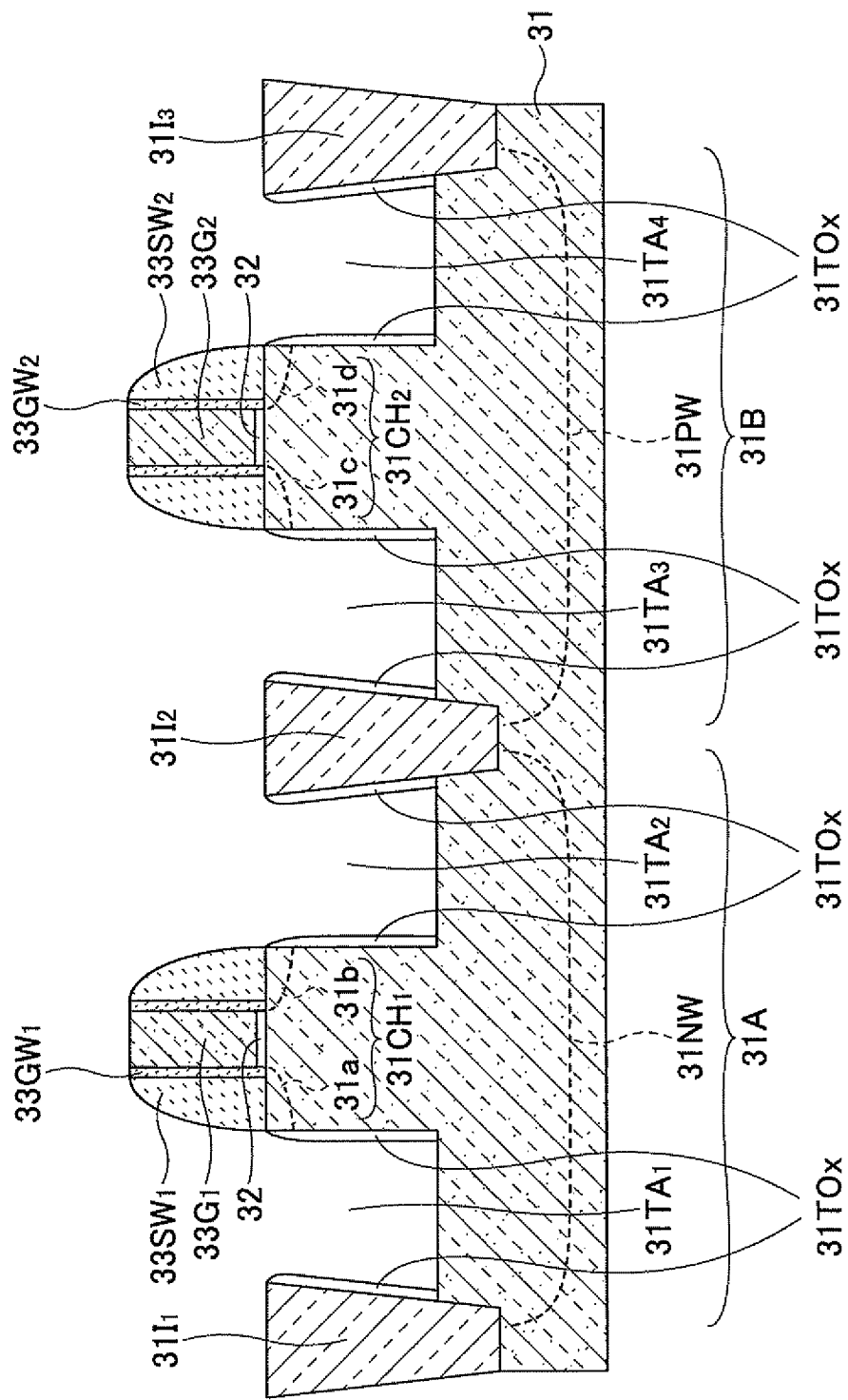

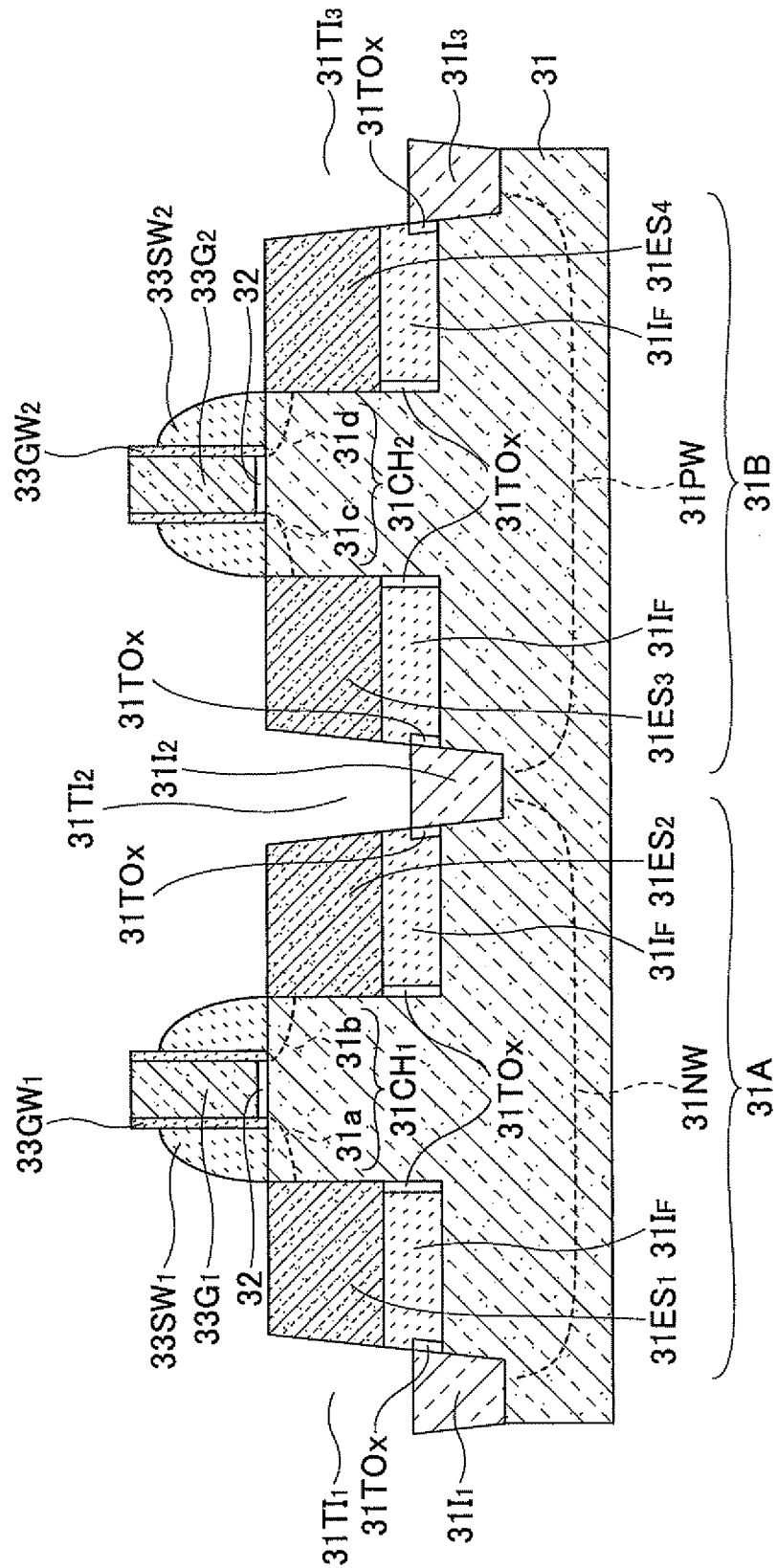

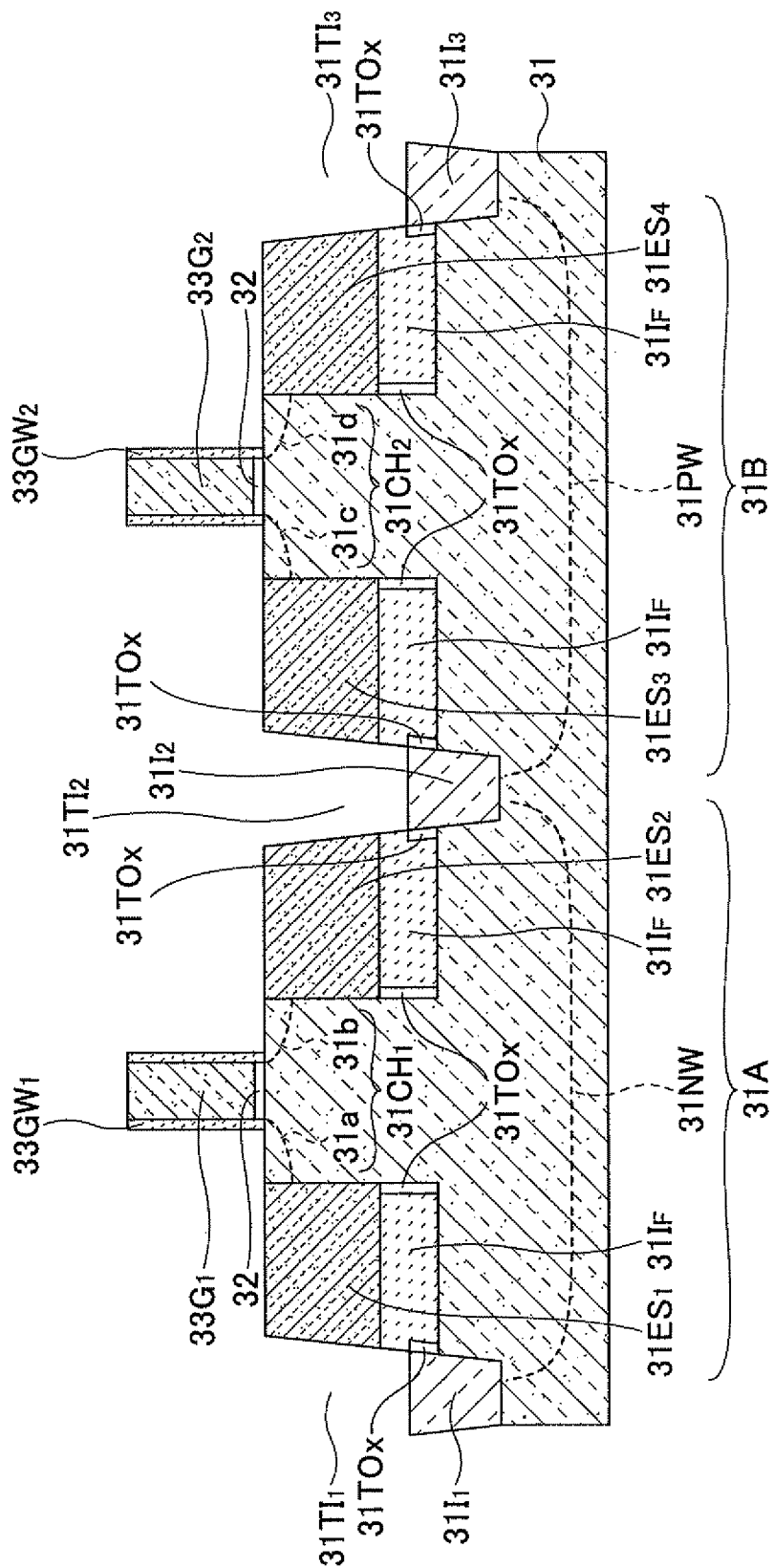

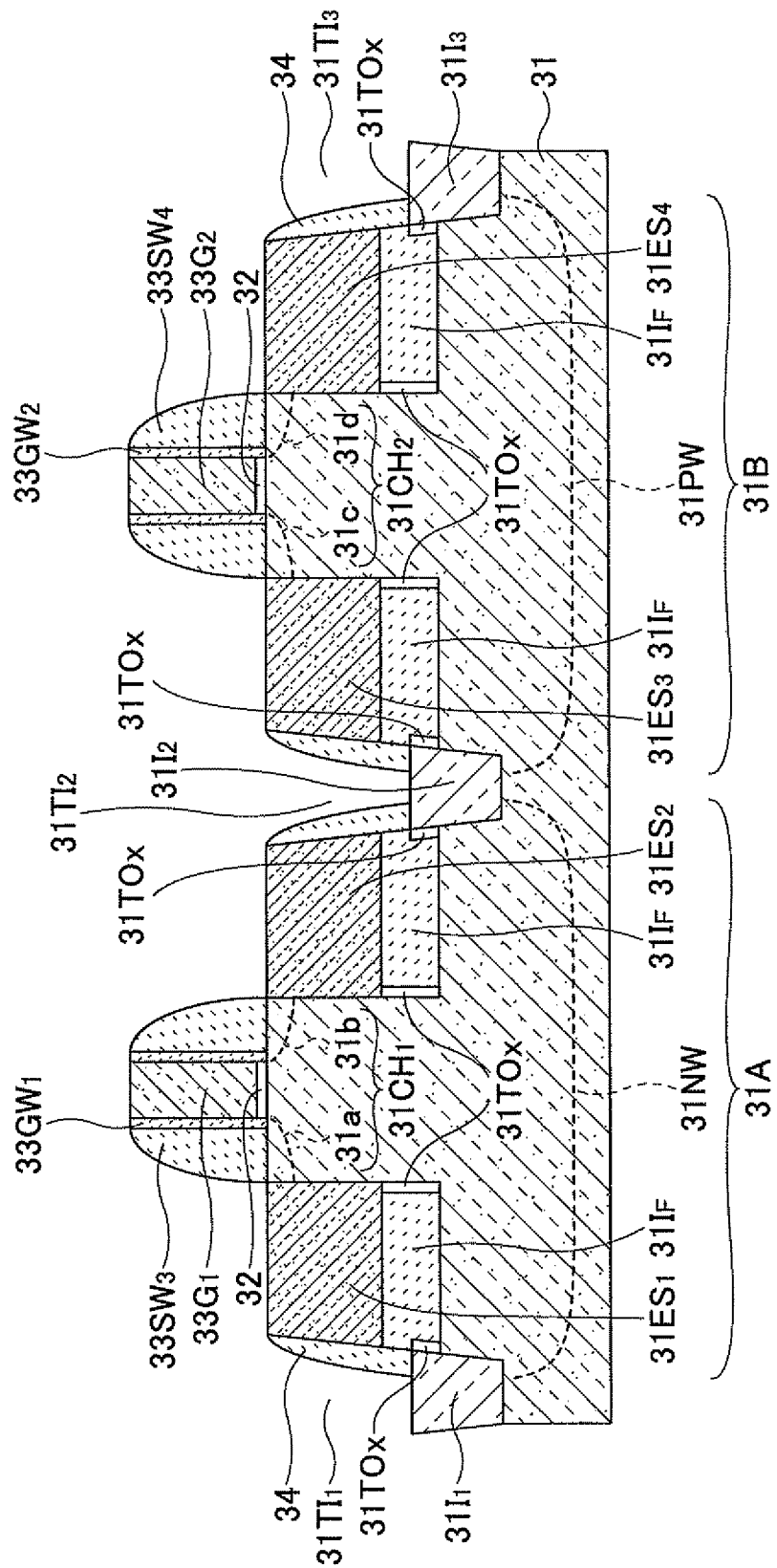

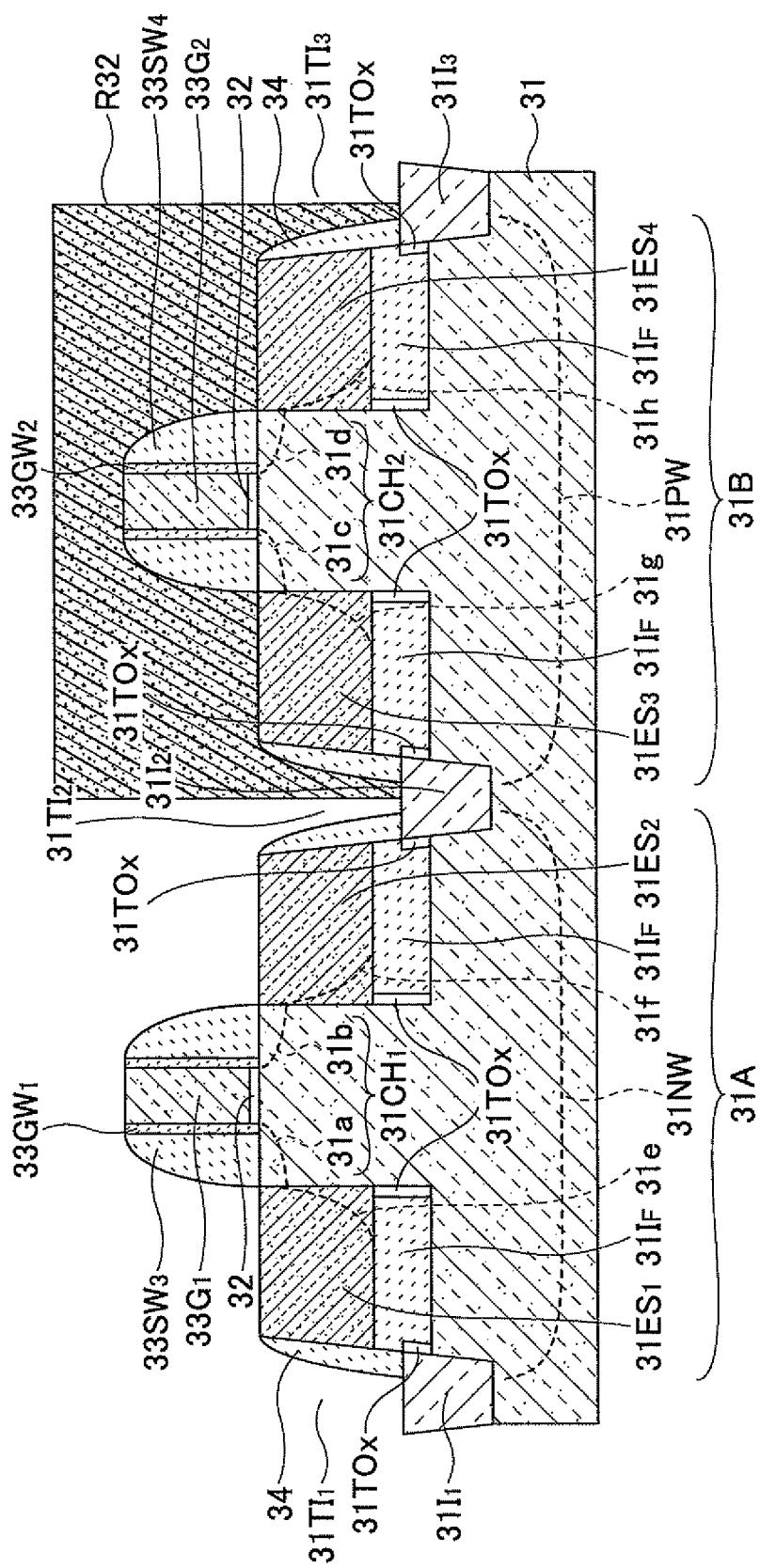

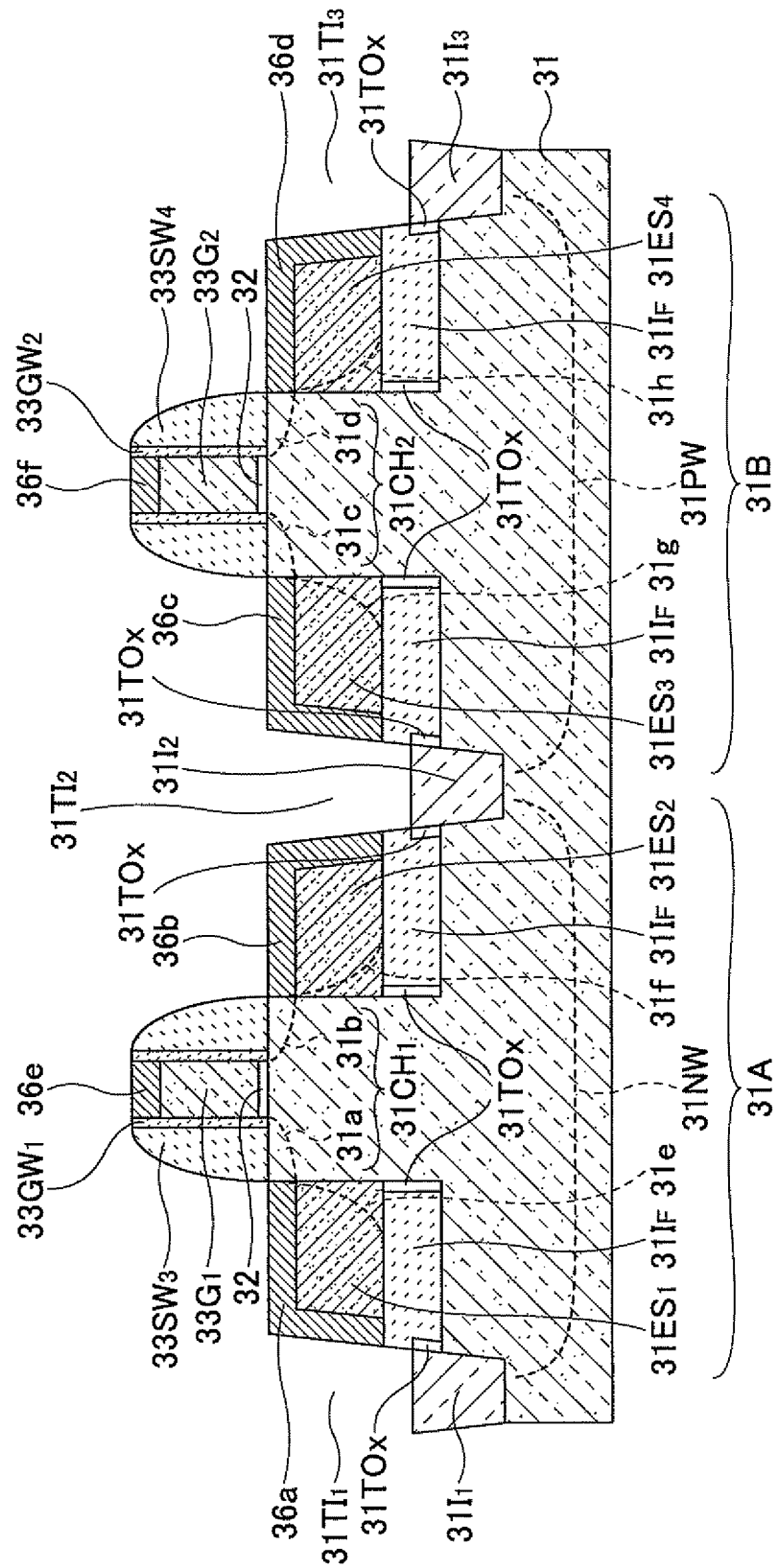

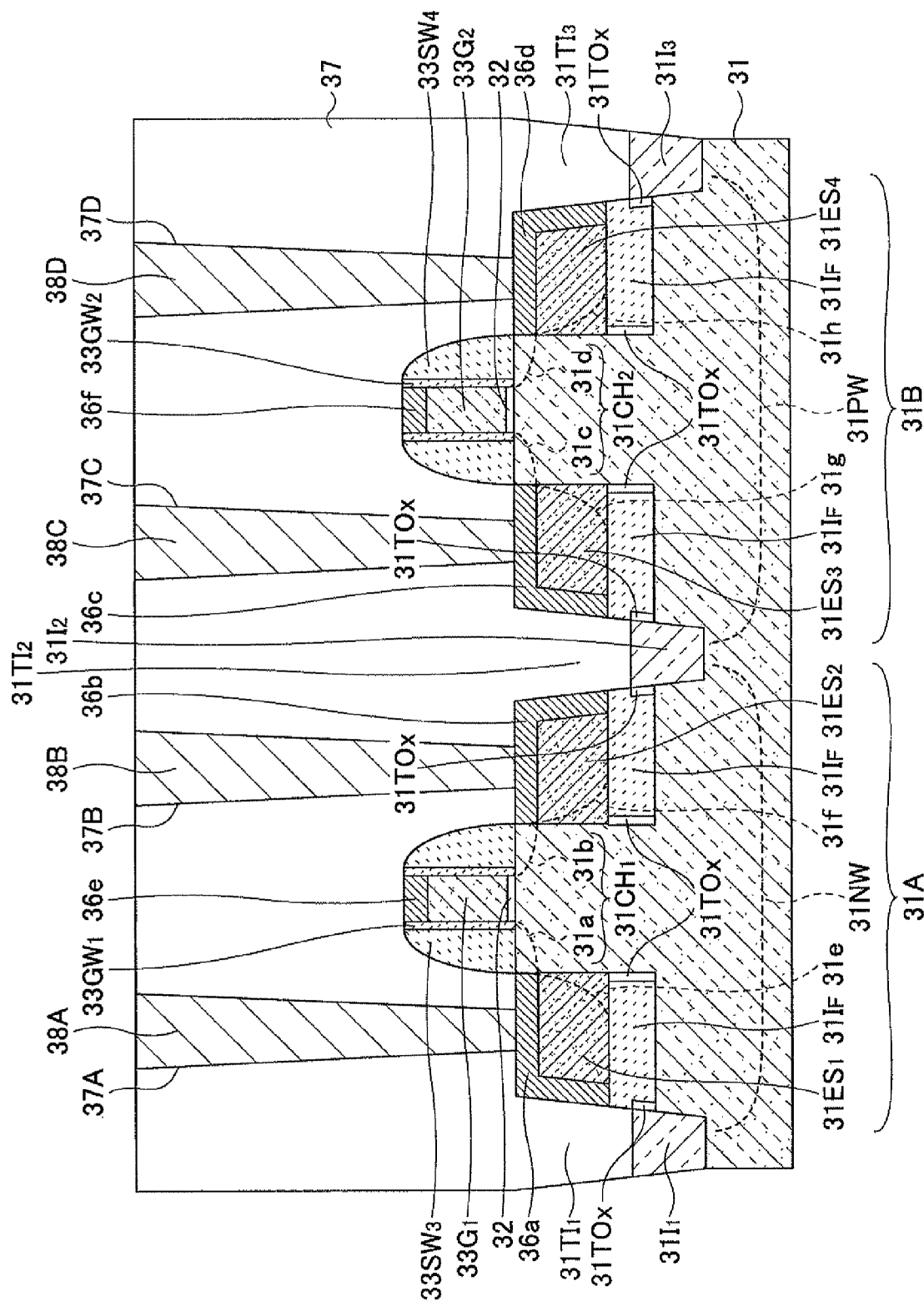

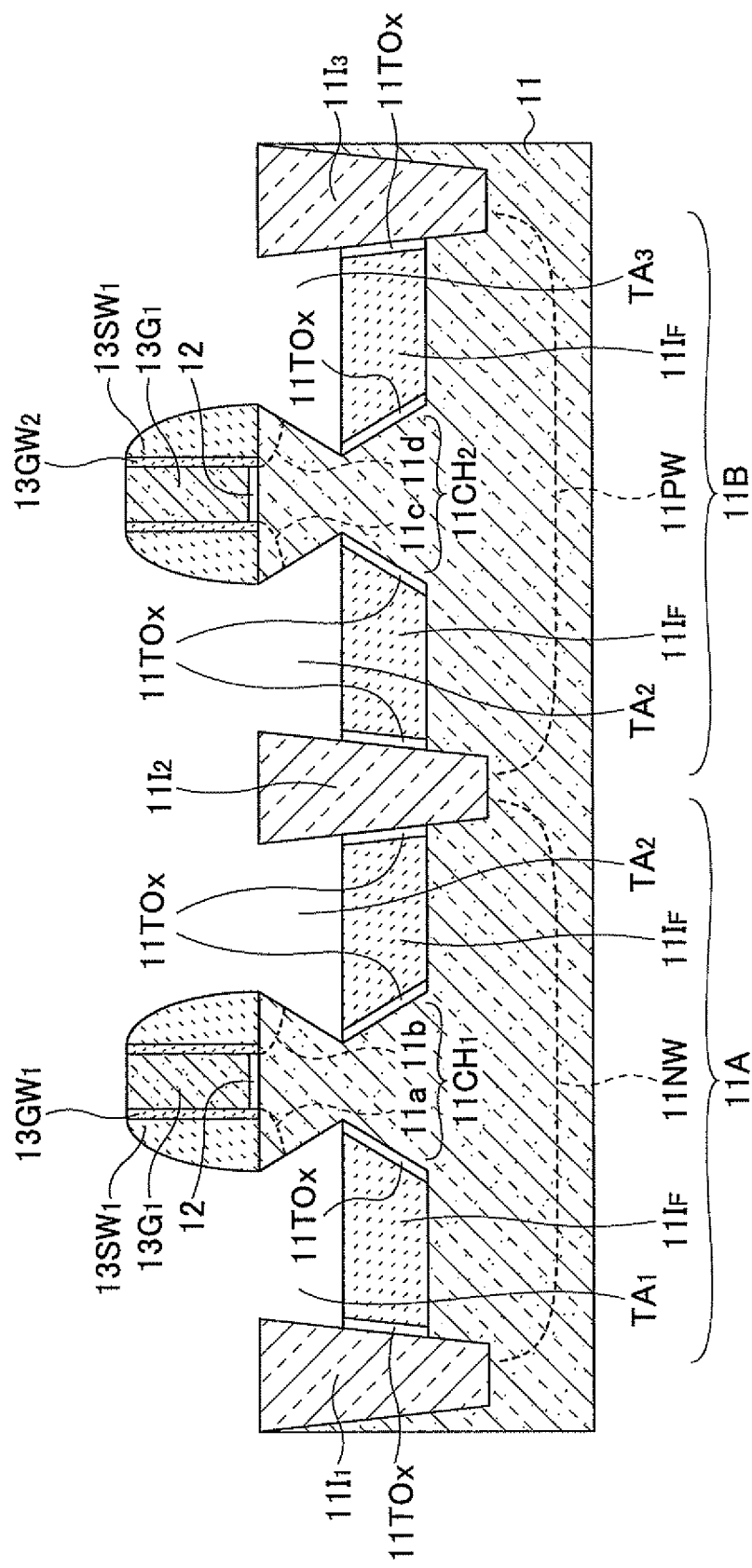

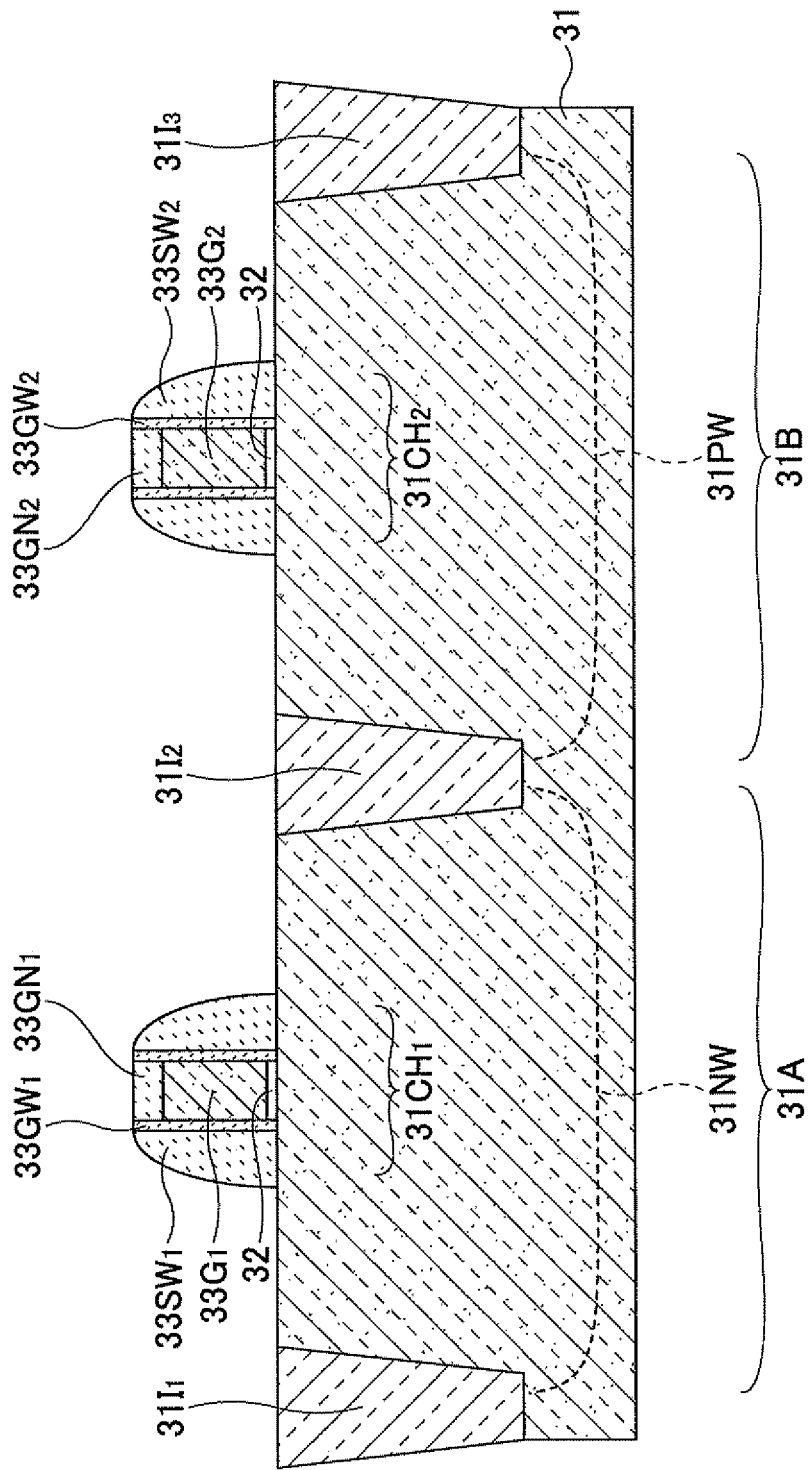

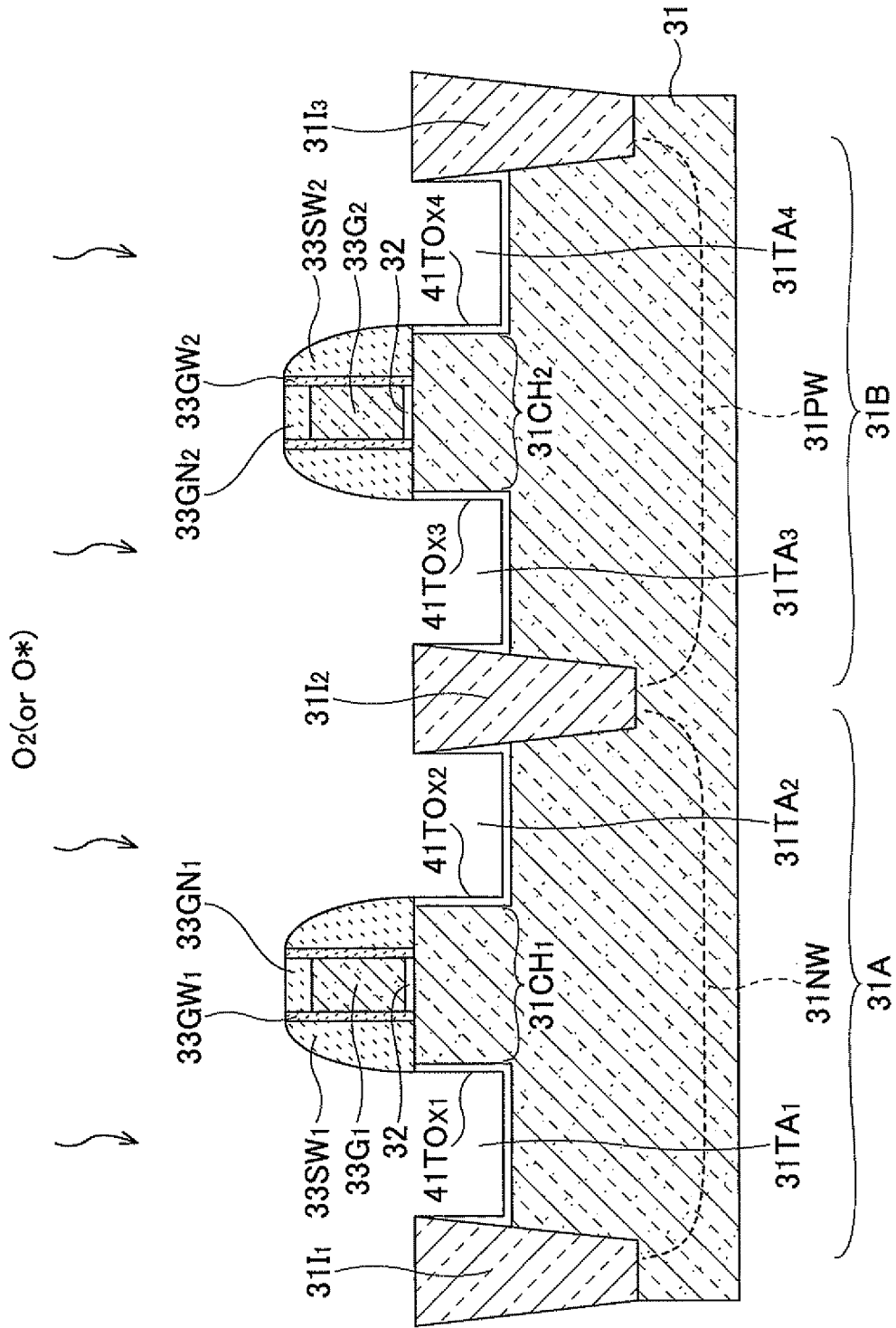

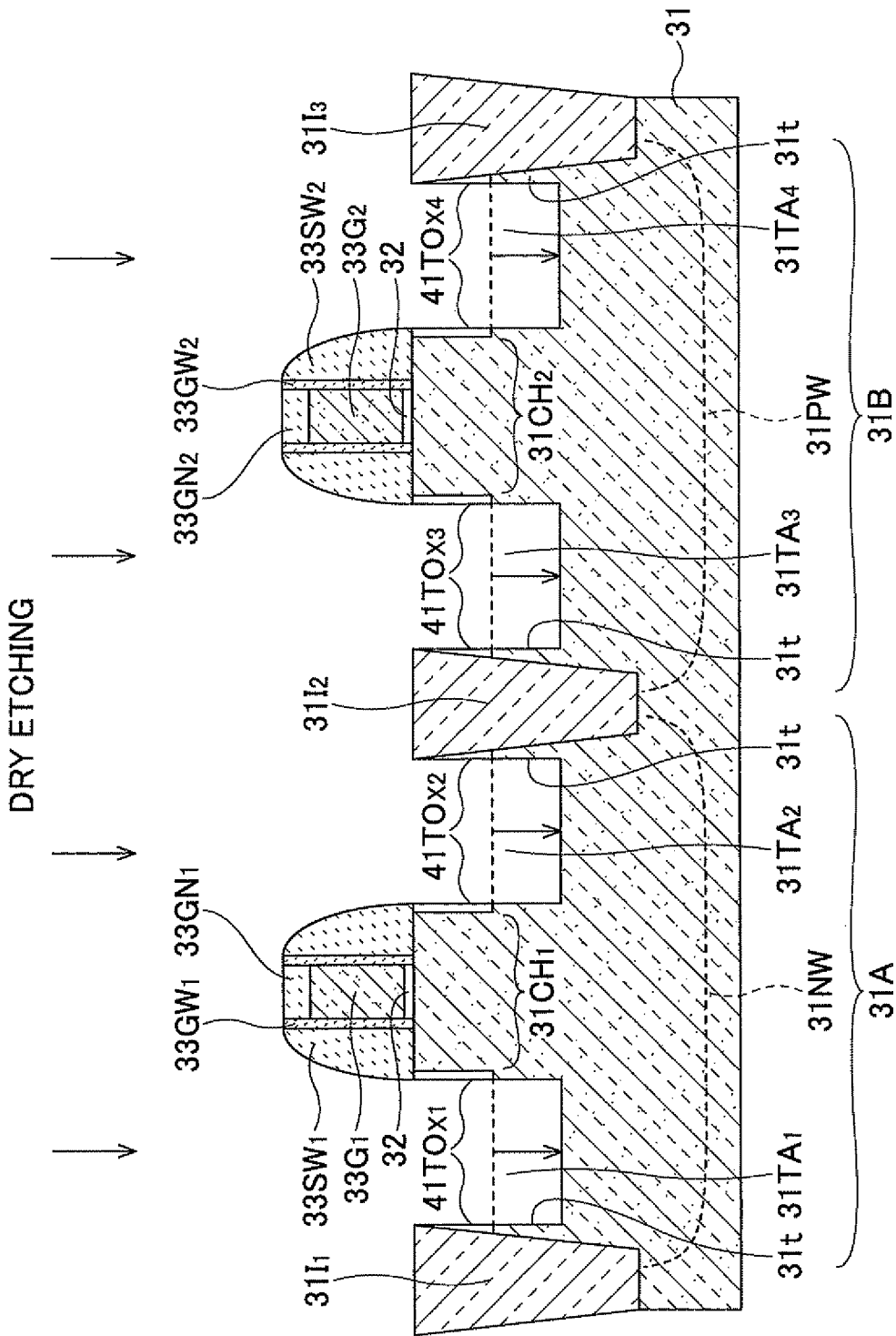

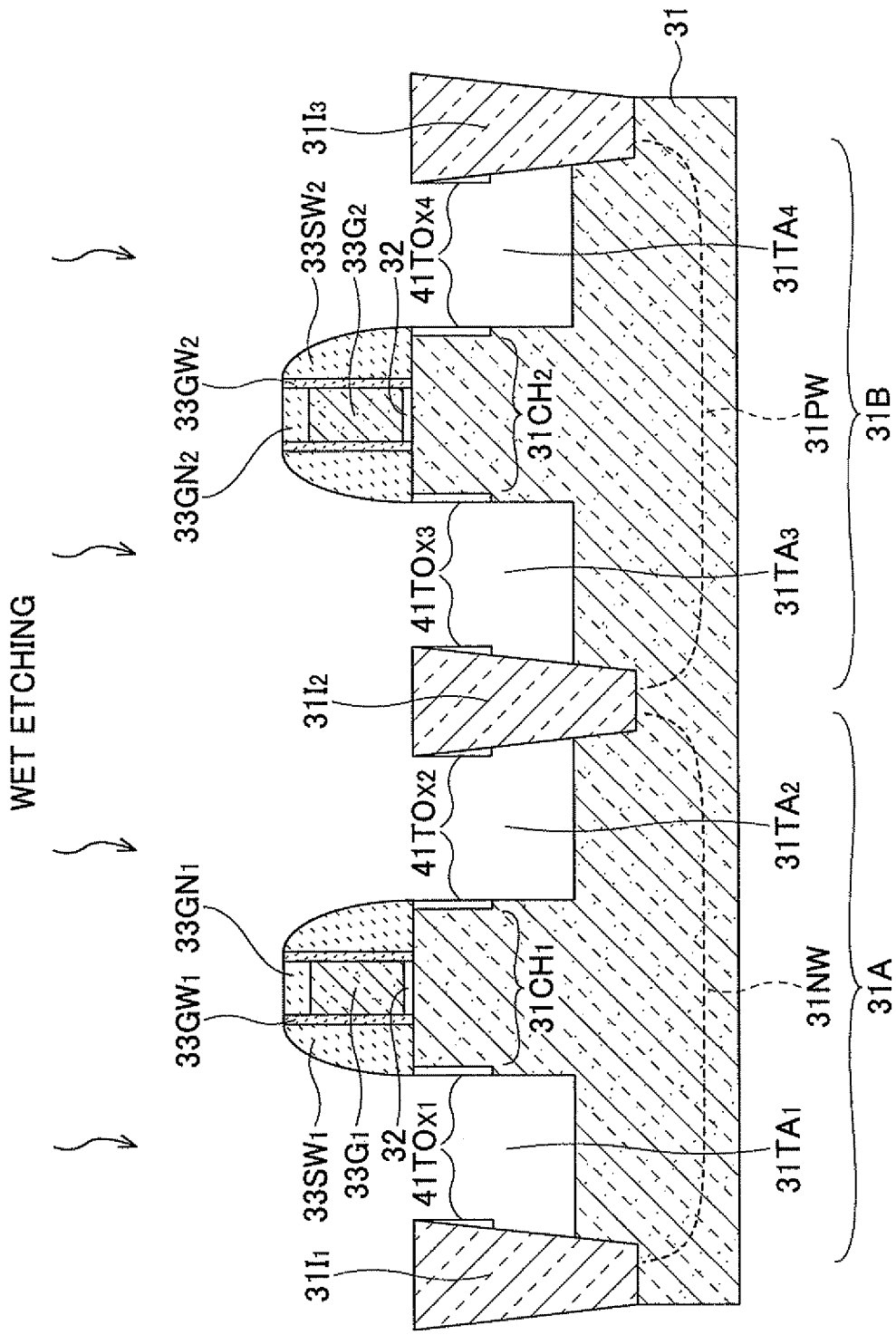

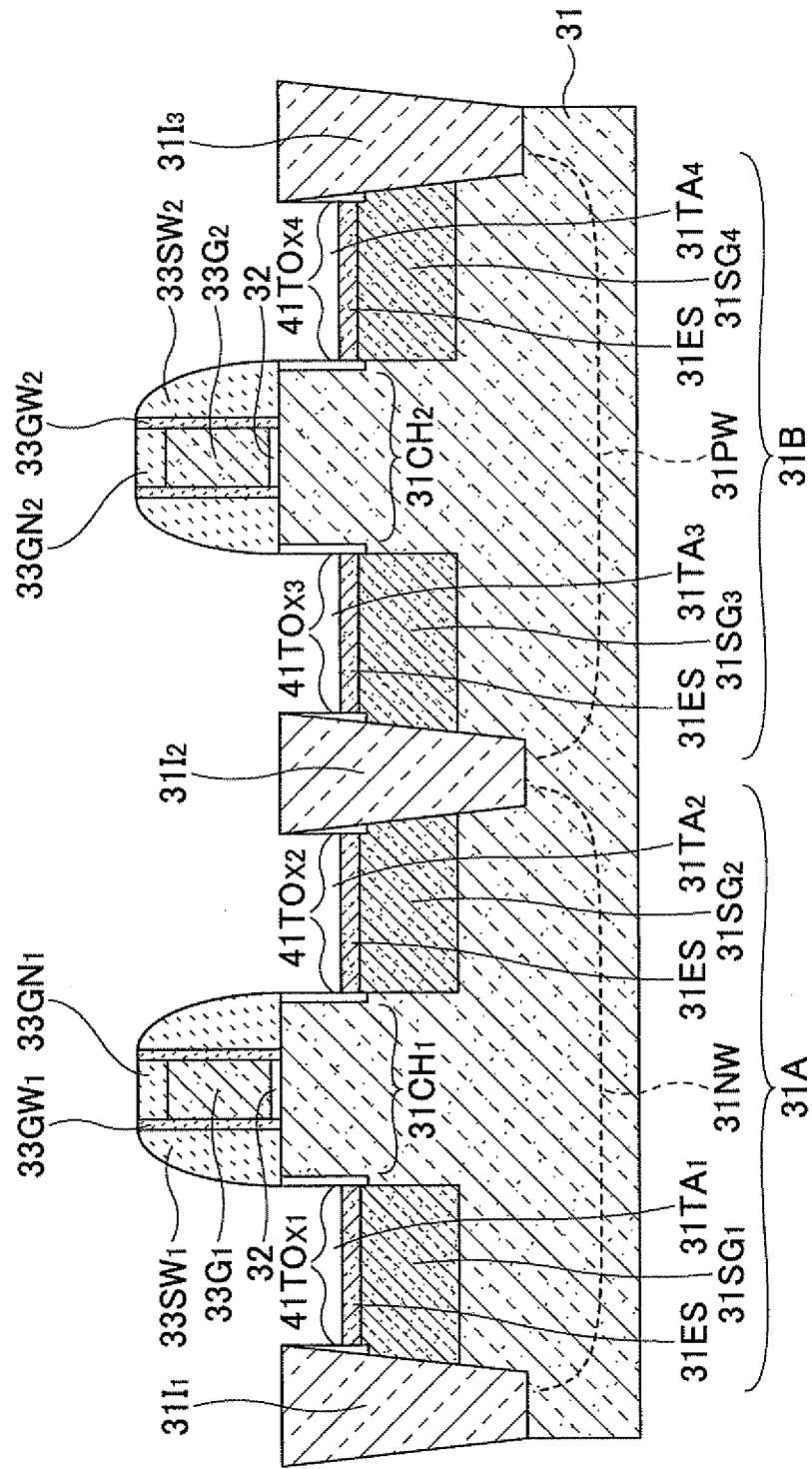

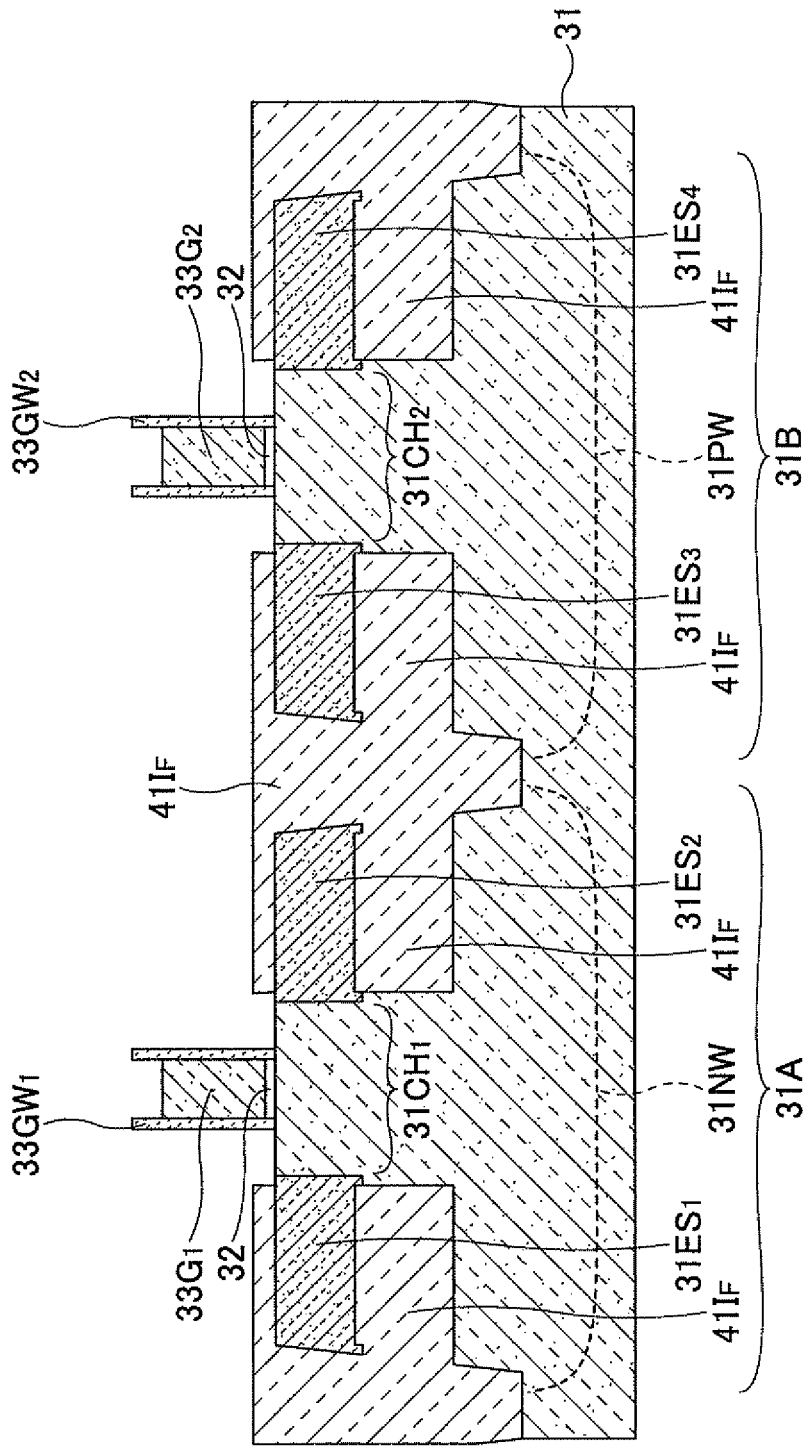

SEMICONDUCTOR DEVICE AND FABRICATION METHOD

CROSS-REFERENCE TO RELATED APPLICATION

This patent application is based upon, and claims the benefit of priority of Japanese Patent Application No. 2011-84093 filed on Apr. 5, 2011, and Japanese Patent Application No. 2012-000836 filed on Jan. 5, 2012, the entire contents of which are incorporated herein by reference.

FIELD

The embodiments discussed herein are related to a semiconductor device and a method for fabricating the semiconductor device.

BACKGROUND

In a typical metal-oxide semiconductor (MOS) transistor, one of a source region and a drain region is formed in a reverse conducting well that forms a device region. In such a configuration, the source region or the drain region is isolated by a p-n junction from the well formed at an interface between the source region and the well or between the drain region and the well.

However, in the typical MOS transistor, an operating speed may be reduced due to a parasitic capacitance of the p-n junction and current leakage may be easily generated.

Thus, there is proposed a metal-oxide-semiconductor (MOS) transistor structure in which wells are separated by an insulator structure such as oxide films, nitride films or voids that are locally formed beneath the source region or the drain region in the device region. Such a MOS transistor structure may be capable of reducing the junction capacitance or reducing the leakage of current.

Japanese Laid-open Patent Publication No. 2009-10040 disposes an example of a process for forming the MOS transistor structure. The disclosed process for forming the MOS transistor structure includes forming a layered structure having a SiGe mixed crystal layer and a Si layer on the SiGe mixed crystal layer, and removing the SiGe mixed crystal layer alone utilizing the etching rate difference between the Si layer and the SiGe mixed crystal layer. Silicon oxide film embedded regions may be locally formed immediately beneath the source region or the drain region by filing the voids after the SiGe mixed crystal layer has been removed, and hence, the silicon-on-insulator (SOI) structure may be formed locally.

RELATED ART DOCUMENT

Patent Document 1: Japanese Laid-open Patent Publication No. 2009-10040
Patent Document 2: Japanese Laid-open Patent Publication No. 2011-3788
Non-Patent Document 1: Kim, Y. S., et. al., IEDM Tech. Dig., pp. 871-874, 2006

In an example, a trench is formed on each side of a channel region in a silicon substrate, the trenches are filled with the layered structure having a SiGe mixed crystal layer formed on the Si layer, and then the SiGe mixed crystal layer is selectively removed by etching.

However, with such a process in the example, side surfaces of the trench may be covered while the SiGe mixed crystal layer is formed. As a result, the Si layer formed on the SiGe mixed crystal layer may not directly be formed on the side walls of the trench but indirectly be formed on the side walls of the trench via the SiGe mixed crystal layer.

If the SiGe mixed crystal layer is selectively removed in such a structure, the Si layer formed on the SiGe mixed crystal layer may lose a mechanical support, and the Si layer may be formed corresponding to the SiGe mixed crystal layer such that the Si layer falls in the voids where the oxide film is yet to be embedded.

SUMMARY

According to an aspect of an embodiment, a semiconductor device that includes a semiconductor substrate including a well having a first conductivity type, the well being defined by a device isolation region; a gate insulating film formed on the semiconductor substrate; a gate electrode formed on the gate insulating film, the gate electrode including a first side surface and a second side surface facing the first side surface; and a first side wall insulating film formed on the first side surface and a second side wall insulating film formed on the second side surface. In the semiconductor device, the semiconductor substrate includes a mesa structure located below the first side wall insulating film, the gate electrode and the second side wall insulating film, the mesa structure includes a first side surface and a second side surface, a first semiconductor layer having the second conductivity type that form a source region is formed outside of the first side surface of the mesa structure, with the first semiconductor layer being connected to the semiconductor substrate on the first side surface, a second semiconductor layer having the second conductivity type that form a drain region is formed outside of the second side surface of the mesa structure, with the second semiconductor layer being connected to the semiconductor substrate on the second side surface, a first embedded insulating region formed of a first insulating film is formed beneath the first semiconductor layer and a second embedded insulating region formed of the first insulating film is formed beneath the second semiconductor layer, and a second insulating film is formed between the first embedded insulating region and the first side surface of the mesa structure, and a third insulating film is formed between the second embedded insulating region and the second side surface of the mesa structure.

The object and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

Additional objects and advantages of the embodiments will be set forth in part in the description which follows, and in part will be obvious from the description or may be learned by practice of the invention.

BRIEF DESCRIPTION OF THE DRAWINGS

FIG. 1D is a cross-sectional diagram illustrating the method for fabricating the semiconductor device according to the first embodiment;

FIG. 1E is a cross-sectional diagram illustrating the method for fabricating the semiconductor device according to the first embodiment;

FIG. 1K is a cross-sectional diagram illustrating the method for fabricating the semiconductor device according to the first embodiment;

FIG. 1O is a cross-sectional diagram illustrating the method for fabricating the semiconductor device according to the first embodiment;

FIG. 2A is a cross-sectional diagram illustrating a method for fabricating a semiconductor device according to a modification of the first embodiment;

FIG. 3C is a cross-sectional diagram illustrating the method for fabricating the semiconductor device according to the second embodiment;

FIG. 3D is a cross-sectional diagram illustrating the method for fabricating the semiconductor device according to the second embodiment;

FIG. 3G is a cross-sectional diagram illustrating the method for fabricating the semiconductor device according to the second embodiment;

FIG. 3N is a cross-sectional diagram illustrating the method for fabricating the semiconductor device according to the second embodiment;

FIG. 3O is a cross-sectional diagram illustrating the method for fabricating the semiconductor device according to the second embodiment;

FIG. 3Q is a cross-sectional diagram illustrating the method for fabricating the semiconductor device according to the second embodiment;

FIG. 3S is a cross-sectional diagram illustrating the method for fabricating the semiconductor device according to the second embodiment;

FIG. 3U is a cross-sectional diagram illustrating the method for fabricating the semiconductor device according to the second embodiment;

FIG. 3X is a cross-sectional diagram illustrating the method for fabricating the semiconductor device according to the second embodiment;

FIG. 6A is a cross-sectional diagram illustrating a method for fabricating a semiconductor device according to a modification of the first embodiment;

FIG. 7A is a cross-sectional diagram illustrating a method for fabricating a semiconductor device according to a fourth embodiment;

FIG. 7C is a cross-sectional diagram illustrating the method for fabricating the semiconductor device according to the fourth embodiment;

FIG. 7D is a cross-sectional diagram illustrating the method for fabricating the semiconductor device according to the fourth embodiment;

FIG. 7E is a cross-sectional diagram illustrating the method for fabricating the semiconductor device according to the fourth embodiment;

FIG. 7G is a cross-sectional diagram illustrating the method for fabricating the semiconductor device according to the fourth embodiment;

FIG. 7O is a cross-sectional diagram illustrating the method for fabricating the semiconductor device according to the fourth embodiment;

DESCRIPTION OF EMBODIMENTS

In the following, a description is given, with reference to the accompanying drawings, of embodiments. Initially, a method for fabricating a MOS transistor according a first embodiment is described with reference to FIGS. 1A to 1T.

[First Embodiment]

Figure 1A:
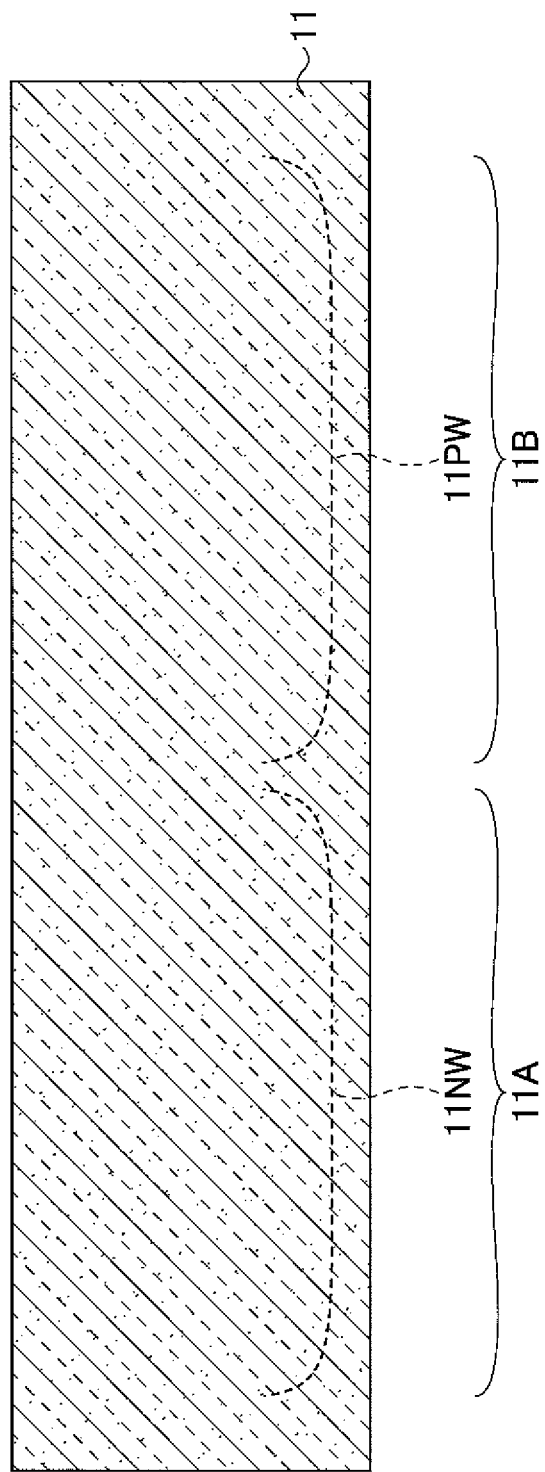
FIG. 1A is a cross-sectional diagram illustrating a method for fabricating a semiconductor device according to a first embodiment.

As illustrated in FIG. 1A, a p-well 11PW is formed in a flat substrate surface, such as a (100) plane, of a silicon substrate 11 formed of single crystal bulk silicon by doping boron (B) or the like in a device region 11B of the silicon substrate 11 in which an n-channel MOS transistor is to be formed at an accelerating energy of 300 keV or lower at a dose of $5 \times 10^{13}$ or lower, or preferably at an accelerating energy of 150 keV at a dose of $3 \times 10^{13}$, while a device region 11A of the silicon substrate 11 in which a p-channel MOS transistor is to be formed is covered with a not illustrated photoresist pattern. The ions may be implanted at any tilt and in one or more incident directions (directions of twist), and examples of the ions to be implanted may be one or more types of ions such as $BF_2$ and In other than B.

In this case, B may be doped in the device region 11B of the silicon substrate 11 at an accelerating energy of 150 keV or lower at a dose of $1 \times 10^{13}$ $cm^{-2}$ or lower, or preferably at an accelerating energy of 30 keV at a dose of $5 \times 10^{12}$ $cm^{-2}$ so as to perform channel stop implantation. The ions may be implanted to perform the channel stop implantation at any tilt and in one or more incident directions (directions of twist), and examples of the ions to be implanted may be one or more types of ions such as $BF_2$ and In other than B.

Next, ions are implanted for adjusting a threshold of the n-channel MOS transistor. For example, B may be doped at an accelerating energy of 40 keV or lower at a dose of $3 \times 10^{13}$ $cm^{-2}$ or lower, or preferably at an accelerating energy of 20 keV at a dose of $1 \times 10^{13}$ $cm^{-2}$. In this case, the ions may be implanted at any tilt and in one or more incident directions (directions of twist). Further, examples of the ions to be implanted may be one or more types of other B molecular ions such as In, $BF_2$ and $B_{10}Hx$ other than B.

The photoresist pattern formed in the device region 11A of the silicon substrate 11 is subsequently removed by an asking process or a wet process utilizing a sulfuric acid hydrogen peroxide mixture (SPM) or the like. Thereafter, an n-well 11NW is formed in the device region 11A of the silicon substrate 11 while the device region 11B of the silicon substrate 11 is covered with the photoresist pattern, in a similar manner as a process of forming the p-well 11PW.

More specifically, the n-well 11NW is formed by doping phosphorus (P) or the like as an impurity element in the device region 11A of the silicon substrate 11 at an accelerating energy of 600 keV or lower at a dose of $5 \times 10^{13}$ $cm^{-2}$ or lower, or preferably at an accelerating energy of 350 keV at a dose of $3\times10^{13}$ cm$^{-2}$. The ions may be implanted at any tilt and in one or more incident directions (directions of twist), and examples of the ions to be implanted may be one or more types of ions such as arsenic (As) and antimony (Sb) other than P.

In this case, As may be doped in the device region 11A of the silicon substrate 11 at an accelerating energy of 300 keV or lower at a dose of $1\times10^{13}$ cm$^{-2}$ or lower, or preferably at an accelerating energy of 100 keV at a dose of $5\times10^{12}$ cm$^{-2}$ so as to perform channel stop implantation. The ions may be implanted at any tilt and in one or more incident directions (directions of twist), and examples of the ions to be implanted may be one or more types of ions such as As and Sb other than P.

Next, ions are implanted for adjusting a threshold of the p-channel MOS transistor. For example, As may be doped at an accelerating energy of 200 keV or lower at a dose of $3\times10^{13}$ cm$^{-2}$ or lower, or preferably at an accelerating energy of 130 keV at a dose of $3\times10^{13}$ cm$^{-2}$. The ions may be implanted at any tilt and in one or more incident directions (directions of twist), and examples of the ions to be implanted may be one or more types of ions such as P, As and Sb.

The photoresist pattern formed in the device region 11B of the silicon substrate 11 is subsequently removed by an asking process or a wet process utilizing a sulfuric acid hydrogen peroxide mixture (SPM) or the like. Thereafter, the silicon substrate 11 is spike annealed at 1000° C. or the like for approximately 10 sec to activate the impurity element such as B, P or As doped in the silicon substrate 11.

Note that in the above description, the well implantation or the channel implantation is initially performed in the process illustrated in FIG. 1A; however, the well implantation or the channel implantation may be performed after forming the later-described a shallow trench isolation (STI) structure.

Figure 1B:
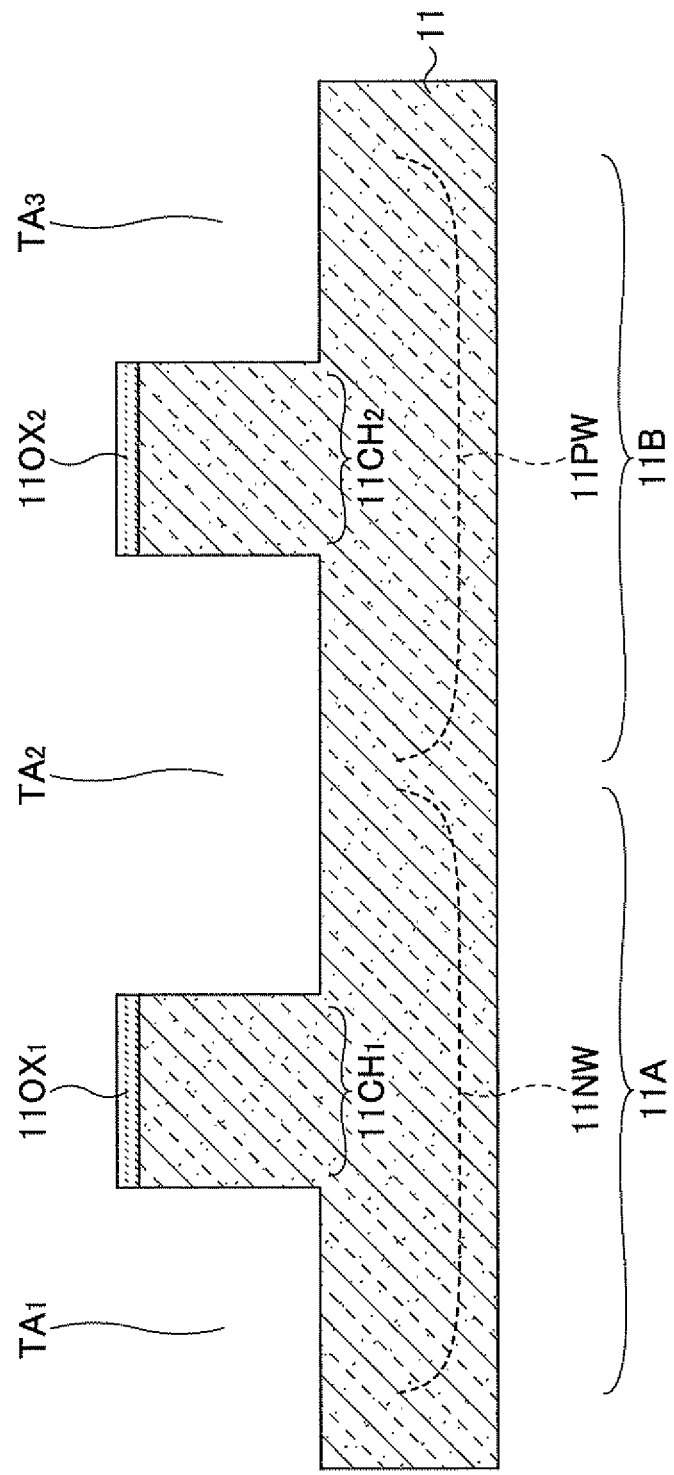
FIG. 1B is a cross-sectional diagram illustrating the method for fabricating the semiconductor device according to the first embodiment.

Next, as illustrated in FIG. 1B, an oxide film is formed on the silicon substrate 11 by chemical vapor deposition (CVD) process, and the oxide film is then patterned to thereby form oxide film patterns 11Ox$_1$ and 11Ox$_2$ in a substrate part 11CH$_1$ forming a channel region of the p-channel MOS transistor and a substrate part 11CH$_2$ forming a channel region of the n-channel MOS transistor, respectively. Further, the silicon substrate 11 is subject to dry etching utilizing an etching gas such as Cl$_2$ or HCl while utilizing the oxide film patterns 11Ox$_1$ and 11Ox$_2$ as a mask. As a result, trenches TA$_1$ to TA$_3$ having a depth range of 40 to 150 nm are formed at each side of the substrate part 11CH$_1$ and each side of the substrate part 11CH$_2$ of the silicon substrate 11. In FIG. 1B, each of the substrate part 11CH$_1$ and the substrate part 11CH$_2$ may have a width range of 30 to 100 nm.

As a result of having formed the trenches TA$_1$ to TA$_3$, the substrate part 11CH$_1$ and the substrate part 11CH$_2$, on which the oxide film patterns 11Ox$_1$ and 11Ox$_2$ are respectively formed, each form a mesa structure. Note that the substrate part 11CH$_1$ and the substrate part 11CH$_2$ extend upwardly from the silicon substrate 11 as a part of the silicon substrate 11.

Figure 1C:
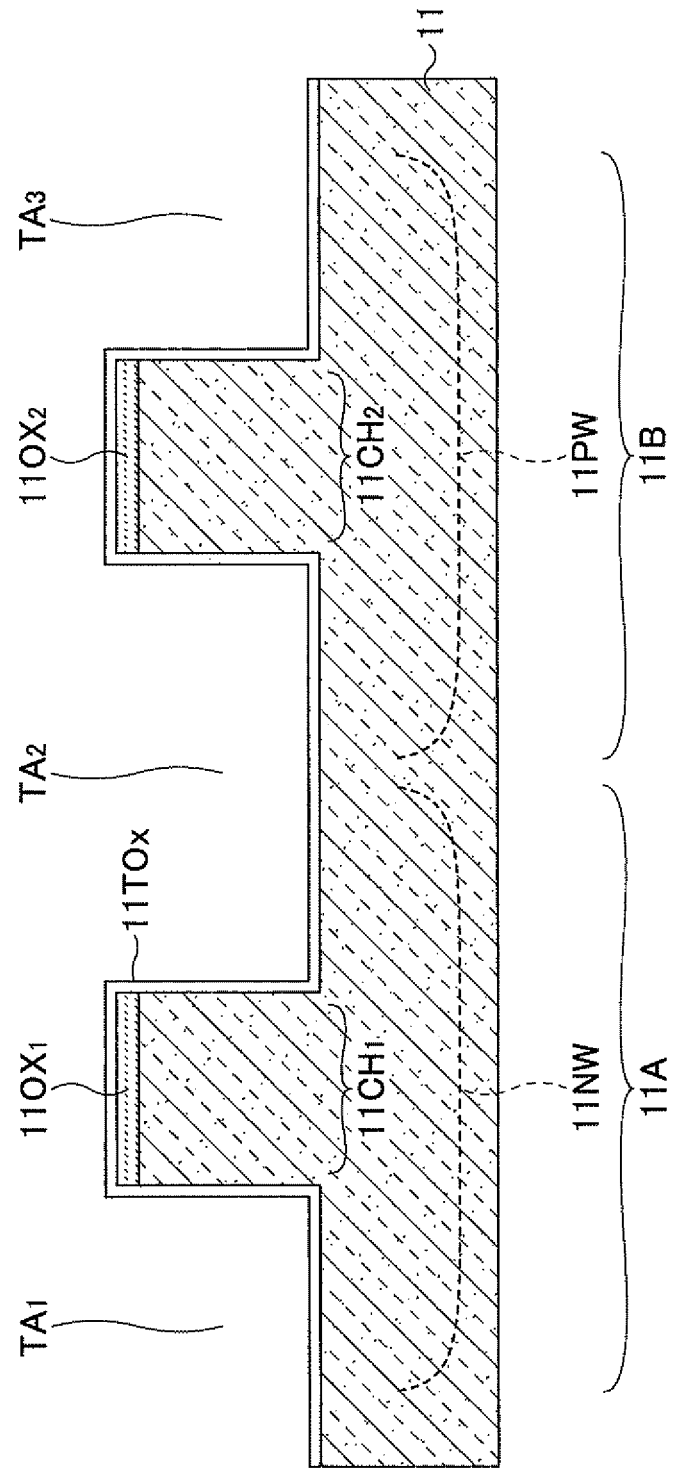
FIG. 1C is a cross-sectional diagram illustrating the method for fabricating the semiconductor device according to the first embodiment.

Next, as illustrated in FIG. 1C, an insulating film 11TOx such as a silicon oxide film, a silicon nitride film or a silicon oxynitride (SiON) film is uniformly deposited on the obtained structure illustrated in FIG. 1B by a vapor-phase deposition process such as the CVD process or an atomic layer deposition (ALD) process. The insulating film 11TOx may preferably have a film thickness of 10 nm or less. Note that a film thickness of 2 nm may be a sufficient thickness of the insulating film 11TOx. The insulating film 11TOx is uniformly formed such that surfaces of the oxide film patterns 11Ox$_1$ and 11Ox$_2$, and bottom surfaces and side surfaces of trenches TA$_1$, TA$_2$ and TA$_3$ are covered with a uniform thickness of the insulating film 11TOx.

Next, as illustrated in FIG. 1D, anisotropic etching is performed on the obtained structure illustrated in FIG. 1C by reactive-ion etching (RIE) that reacts approximately perpendicular to the surface of the silicon substrate 11. As a result, the insulating film 11TOx is removed from the bottom surfaces of the trenches TA$_1$ to TA$_3$ such that the silicon substrate 11 is exposed from the bottom surfaces of the trenches TA$_1$ to TA$_3$. Note that in the obtained structure illustrated in FIG. 1D, the insulating film 11TOx is removed from the surfaces of the oxide film patterns 11Ox$_1$ and 11Ox$_2$, and hence, the insulating film 11TOx remains only on the side surfaces of the trenches TA$_1$, TA$_2$ and TA$_3$.

Next, as illustrated in FIG. 1E, SiGe mixed crystal layers 11SG$_1$ to 11SG$_3$ having a thickness range of, for example, 20 to 80 nm selectively and epitaxially grow on the exposed surface of the silicon substrate 11, namely, the bottom surfaces of the trenches TA$_1$ to TA$_3$ by the CVD process utilizing a mixed gas of silane (SiH$_4$), dichlorosilane (SiH2Cl$_2$), monogermane (GeH$_4$), hydrogen chloride (HCl) and hydrogen (H$_2$) while utilizing the oxide film patterns 11Ox$_1$ and 11Ox$_2$ as a mask. Note that in the present specification, the SiGe mixed crystal layer indicates a mixed crystal layer that may further include other elements in addition to Si and Ge. Likewise, the SiC mixed crystal layer indicates a mixed crystal layer that may further include other elements in addition to Si and C.

For example, the SiGe mixed crystal layers 11SG$_1$ to 11SG$_3$ may epitaxially grow at a growth rate of 45 nm/min at a substrate temperature range of 650 to 750° C., or preferably at a substrate temperature of 700° C. by setting a partial pressure range of the hydrogen gas to 4000 to 6000 Pa, or preferably to 5300 Pa, by setting a partial pressure range of the dichlorosilane to 20 to 30 Pa, or preferably setting a partial pressure to 26, by setting a partial pressure range of the monogermane to 10 to 15 Pa, or preferably setting a partial pressure to 12 Pa, and by setting a partial pressure range of the hydrogen chloride to 10 to 15 Pa, or preferably setting a partial pressure to 12 Pa under a pressure range of 1330 to 13300 Pa (i.e., 10 to 100 Torr), or preferably under a pressure of 5320 Pa (i.e., 40 Torr).

Examples of the SiGe mixed crystal layers 11SG$_1$ to 11SG$_3$ include the atomic fraction of Ge of approximately 20%. However, the Ge composition may be increased within a range that allows the SiGe mixed crystal layers 11SG$_1$ to 11SG$_3$ to epitaxially grow on the exposed surface of the silicon substrate 11. For example, the SiGe mixed crystal having the atomic fraction of Ge of approximately 40% may be utilized as the SiGe mixed crystal layers 11SG$_1$ to 11SG$_3$. In addition, the SiGeC mixed crystal layer obtained by further adding C to the SiGe mixed crystal may also be utilized as the SiGe mixed crystal layers 11SG$_1$ to 11SG$_3$.

As illustrated in FIG. 1E, in the first embodiment, the side surfaces of the trenches TA$_1$, TA$_2$ and TA$_3$ are covered with the insulating film 11TOx. Accordingly, the SiGe mixed crystal layers 11SG$_1$ to 11SG$_3$ may not have to cover the side surfaces of the trenches TA$_1$, TA$_2$ and TA$_3$.

Figure 1F:
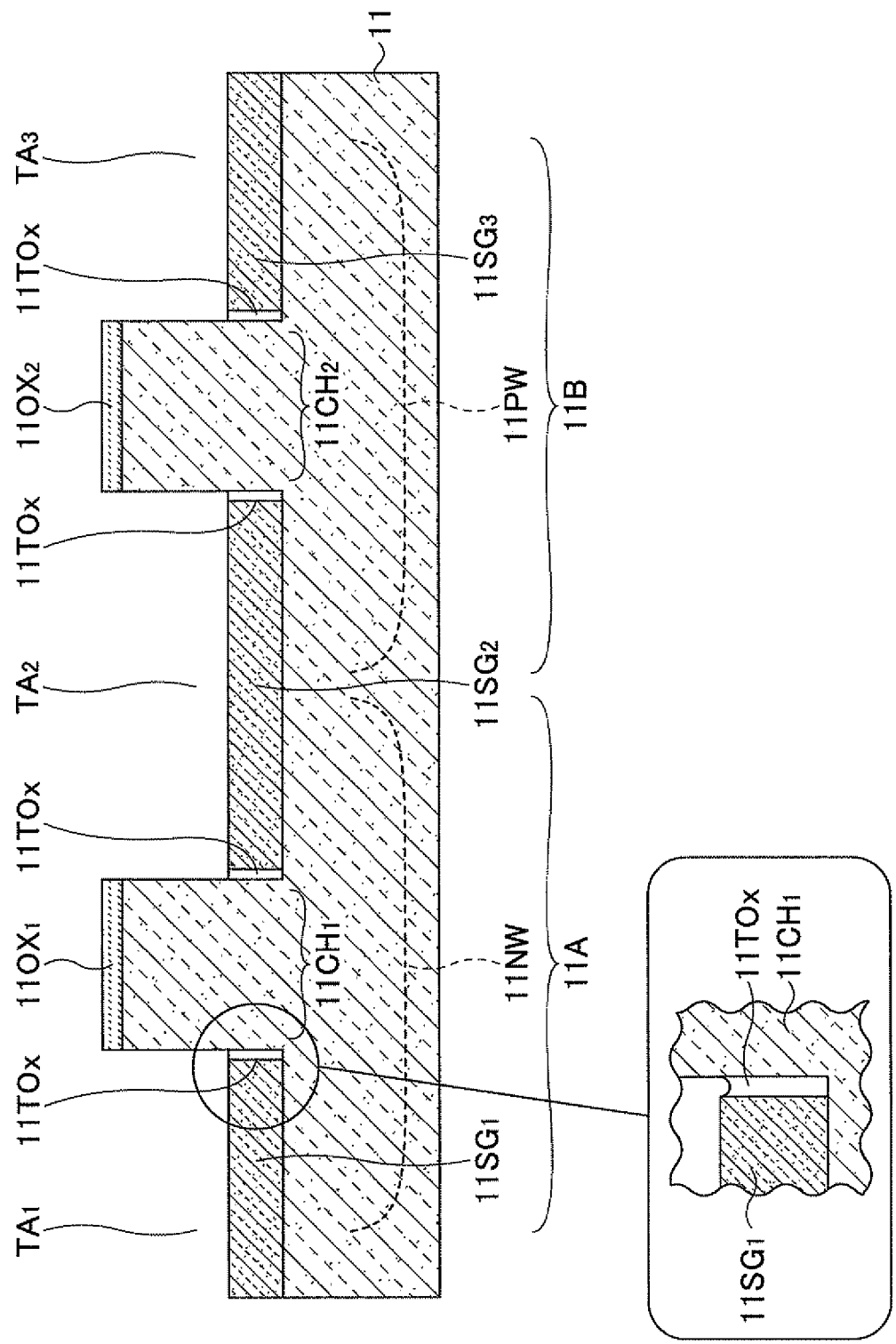
FIG. 1F is a cross-sectional diagram illustrating the method for fabricating the semiconductor device according to the first embodiment.

Next, as illustrated in FIG. 1F, exposed parts of the insulating film 11TOx, which covers the side surfaces of the trenches TA$_1$, TA$_2$ and TA$_3$, are removed by wet etching or dry etching so as to expose the silicon substrate 11 from the side surfaces of the trenches TA$_1$, TA$_2$ and TA$_3$. As a result, as illustrated in an enlarged diagram indicated by a circle in FIG. 1F, an upper end of the insulating film 11TOx is located at a slightly depressed position from an upper end of the SiGe mixed crystal layers $11SG_1$ to form a recess.

Figure 1G:
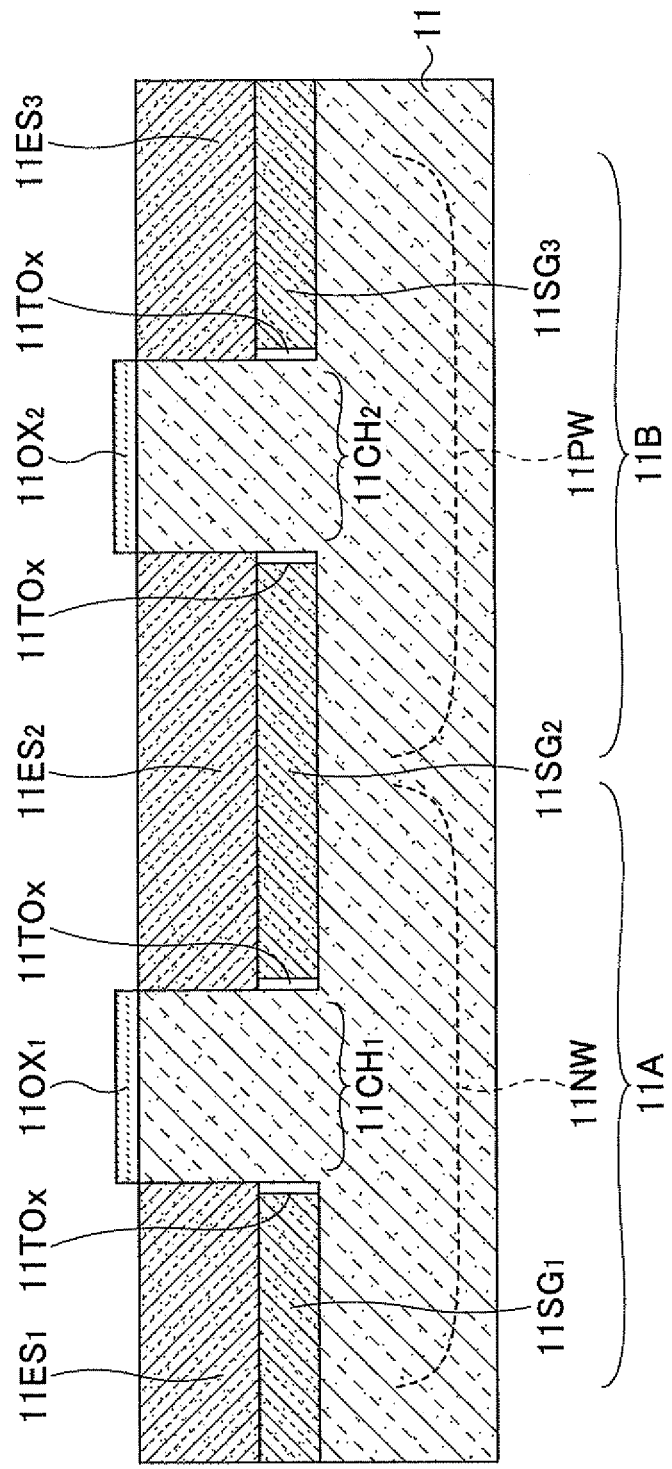
FIG. 1G is a cross-sectional diagram illustrating the method for fabricating the semiconductor device according to the first embodiment.

Next, as illustrated in FIG. 1G, silicon epitaxial layers $11ES_1$ to $11ES_3$ are grown on the SiGe mixed crystal layers $11SG_1$ to $11SG_3$, respectively, utilizing a silane gas or a mixed gas of hydrogen chloride and hydrogen as a raw material so as to substantially fill the trenches $TA_1$, $TA_2$ and $TA_3$.

For example, the silicon epitaxial layers $11ES_1$ to $11ES_3$ may epitaxially grow at a growth rate of 0.7 nm/min at a substrate temperature range of 650 to 750° C., or preferably at a substrate temperature of 700° C. by setting a partial pressure range of the hydrogen gas to 4000 to 6000 Pa, or preferably to 5300 Pa, by setting a partial pressure range of the dichlorosilane to 15 to 25 Pa, or preferably setting a partial pressure to 21, and by setting a partial pressure range of the hydrogen chloride to 3 to 10 Pa, or preferably setting a partial pressure to 5 Pa under a pressure range of 1330 to 13300 Pa (i.e., 10 to 100 Torr), or preferably under a pressure of 5320 Pa (i.e., 40 Torr).

As a result, a layered structure composed of the SiGe mixed crystal layers $11SG_1$ to $11SG_3$ and the silicon epitaxial layers $11ES_1$ to $11ES_3$ is filled in the space on each side of the substrate part $11CH_1$ and the substrate part $11CH_2$ each forming the mesa structure.

Thus formed silicon epitaxial layers $11ES_1$ to $11ES_3$ are epitaxially bonded with the silicone substrate 11 and with the side surfaces of the trenches $TA_1$ to $TA_3$.

Figure 1H:
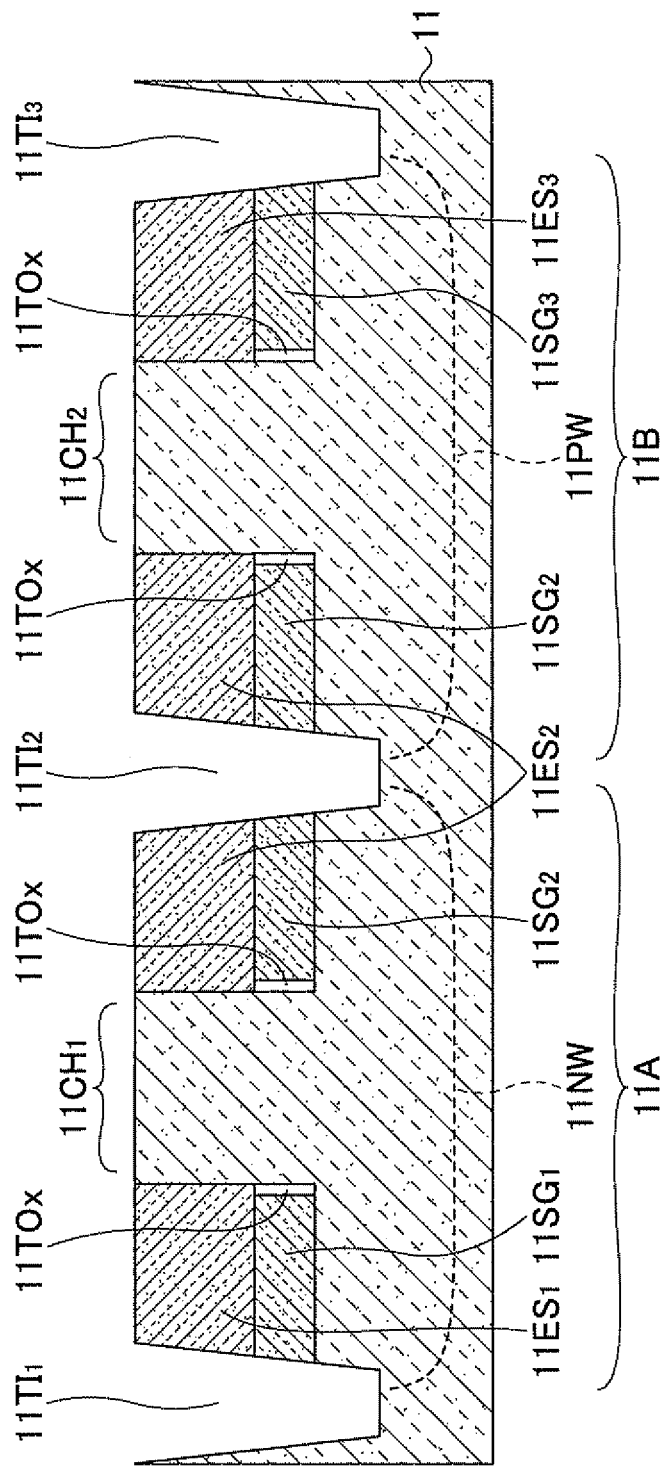
FIG. 1H is a cross-sectional diagram illustrating the method for fabricating the semiconductor device according to the first embodiment.

Next, as illustrated in FIG. 1H, the oxide film patterns $11Ox_1$ and $11Ox_2$ are removed and device isolation trenches $11TI_1$ to $11TI_3$ are formed in predetermined device isolation regions by dry etching such that device isolation trenches $11TI_1$ to $11TI_3$ are formed deeper than bottom surfaces of the SiGe mixed crystal layers $11SG_1$ to $11SG_3$ to reach the silicon substrate 11 beneath the SiGe mixed crystal layers $11SG_1$ to $11SG_3$. As a result, the SiGe mixed crystal layers $11SG_1$ to $11SG_3$ are exposed from side surfaces of the device isolation trenches $11TI_1$ to $11TI_3$. Note that the device isolation trenches $11TI_1$ to $11TI_3$ illustrated in FIG. 1H are formed at an etching cone angle of several degrees towards a depth direction (of the substrate 11). However, since the etching cone angle results from an etching condition, the device isolation trenches $11TI_1$ to $11TI_3$ may be formed in a vertical direction. that is, at the etching cone angle of 0 degrees. Further, the device isolation trenches $11TI_1$ to $11TI_3$ may be formed in a wedge shape by growing crystal surfaces as described later with reference to FIGS. 6A and 6B.

Figure 1I:
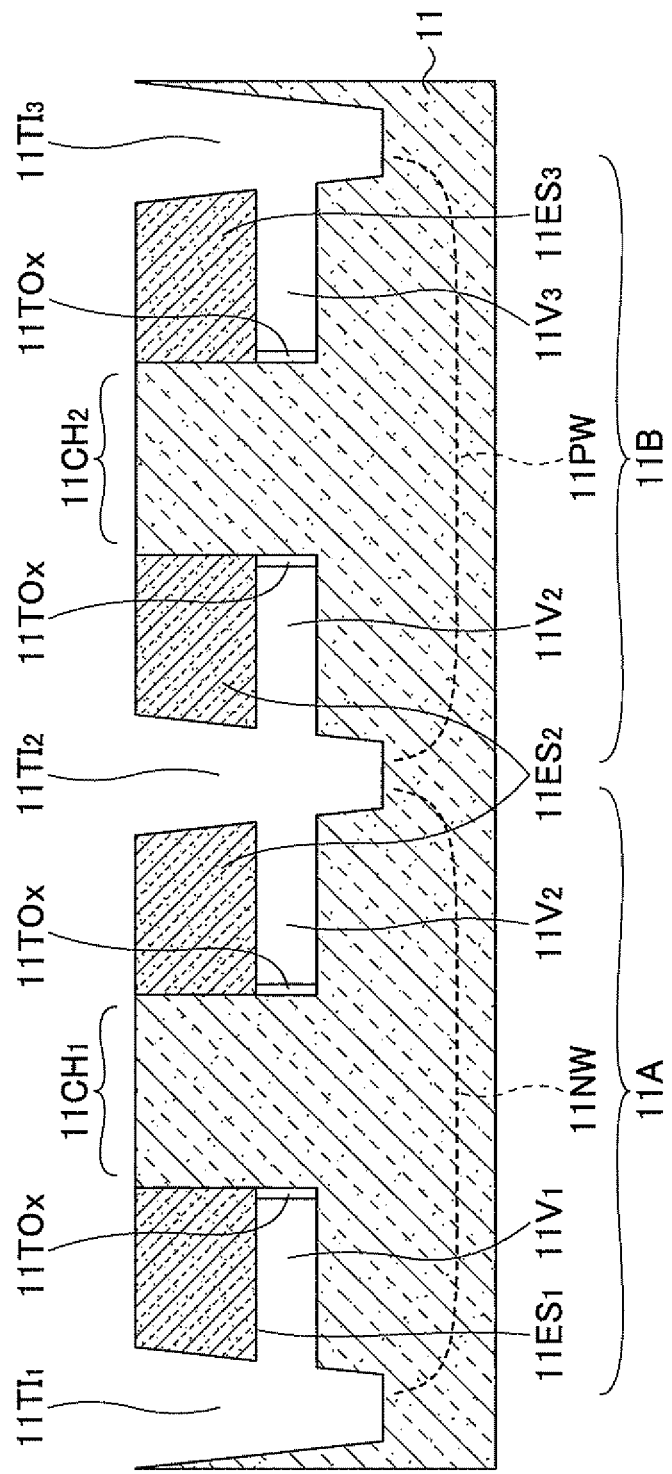
FIG. 1I is a cross-sectional diagram illustrating the method for fabricating the semiconductor device according to the first embodiment.

Next, as illustrated in FIG. 1I, the SiGe mixed crystal layers $11SG_1$ to $11SG_3$ are selectively removed from the silicon epitaxial layers $11ES_1$ to $11ES_3$ above the SiGe mixed crystal layers $11SG_1$ to $11SG_3$ or from the substrate 11 beneath the SiGe mixed crystal layers $11SG_1$ to $11SG_3$ by dry etching utilizing a mixed gas of hydrogen chloride (HCl) and hydrogen ($H_2$). Such dry etching may be performed for 120 sec under a noble gas (e.g., Ar) plasma at a pressure of 50 Pa and a temperature of 750° C. while supplying the HCl gas at a flow rate of 1 slm and the $H_2$ gas at a flow rate of 10 slm.

In addition, the SiGe mixed crystal layers $11SG_1$ to $11SG_3$ may also be selectively etched by utilizing a chlorine ($Cl_2$) gas. Further, the SiGe mixed crystal layers $11SG_1$ to $11SG_3$ may also be selectively etched by wet etching.

Alternatively, the SiGe mixed crystal layers $11SG_1$ to $11SG_3$ may be selectively etched by dry etching utilizing a fluorocarbon ($CF_4$) gas as an etching gas. In this case, desired etching may be performed for 30 sec under a noble gas (e.g., Ar) plasma at a pressure of 100 Pa while supplying the $CF_4$ gas at a flow rate of 1 slm.

As a result of selective etching of the SiGe mixed crystal layers $11SG_1$ to $11SG_3$, voids $11V_1$ to $11V_3$ are formed corresponding to the SiGe mixed crystal layers $11SG_1$ to $11SG_3$ in the substrate 11. Note that as illustrated in FIG. 1E, the void $11V_2$ is divided into two parts via the device isolation trench $11TI_2$.

Note that in the process illustrated in FIG. 1I, the device isolation trenches $11TI_1$ to $11TI_3$ may not necessarily reach the silicon substrate 11. The device isolation trenches $11TI_1$ to $11TI_3$ may be formed such that the SiGe mixed crystal layers $11SG_1$ to $11SG_3$ are partially exposed.

In the first embodiment, since the side surfaces of the trenches $TA_1$ to $TA_3$ are covered with the thin insulating film $11TOx$ in the process of FIG. 1D, the SiGe mixed crystal layers $11SG_1$ to $11SG_3$ will not be brought into contact with the side surfaces of the trenches $TA_1$ to $TA_3$ in the process of FIG. 1F. In the process of FIG. 1I, the silicon epitaxial layers $11ES_1$ to $11ES_3$ are epitaxially bonded with the silicon substrate 11 forming the side surfaces of the trenches $TA_1$, $TA_2$ and $TA_3$. That is, the silicon epitaxial layers $11ES_1$ to $11ES_3$ are directly bonded with the side surfaces of the trenches $TA_1$, $TA_2$ and $TA_3$ formed of the silicon substrate 11 in a lattice matched configuration. Accordingly, even if the voids $11V_1$ to $11V_3$ are formed by etching of the SiGe mixed crystal layers $11SG_1$ to $11SG_3$, the silicon epitaxial layers $11ES_1$ to $11ES_3$ will not fall off of the silicon substrate 11 forming the side surfaces of the trenches $TA_1$, $TA_2$ and $TA_3$, which may retain a stable structure of FIG. 1I.

Figure 1J:
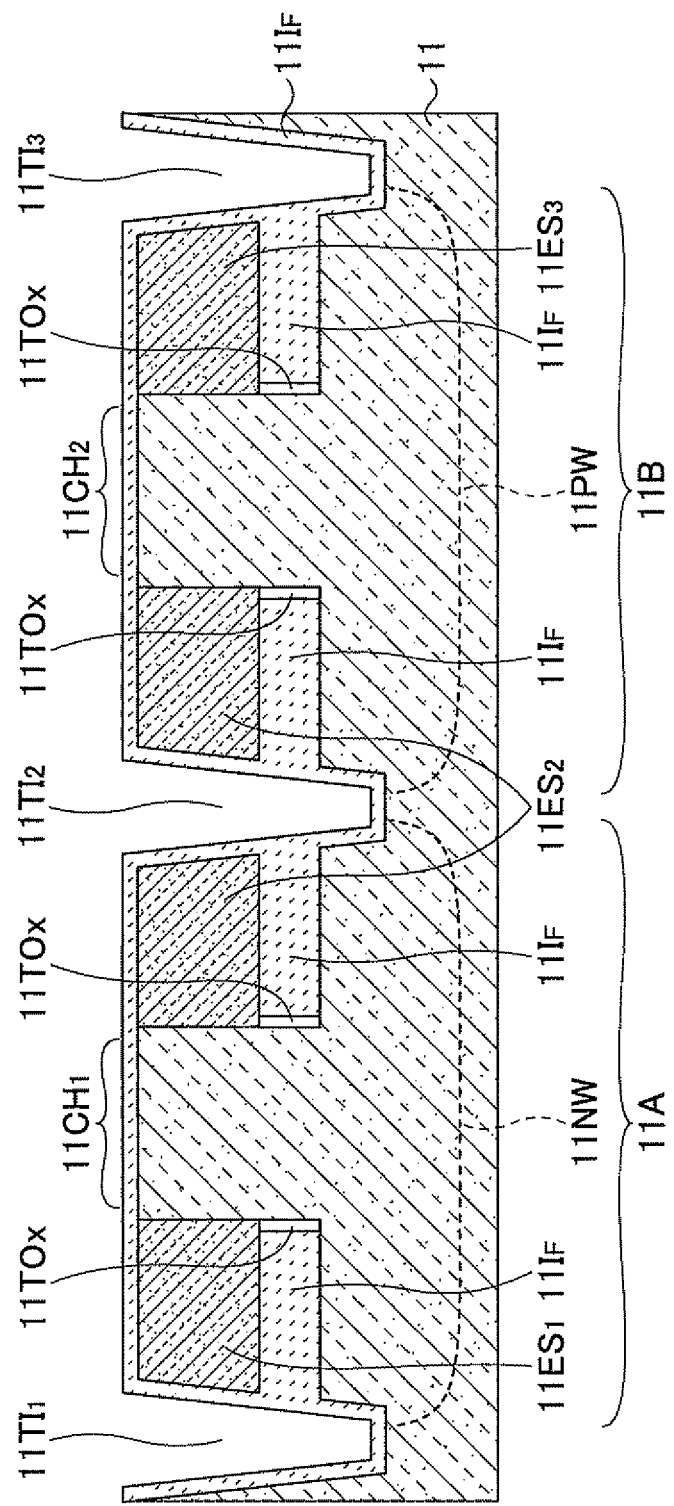
FIG. 1J is a cross-sectional diagram illustrating the method for fabricating the semiconductor device according to the first embodiment.

As illustrated in 1J, an embedded insulating film $11I_F$ is deposited on the obtained structure of FIG. 1I to fill the voids $11V_1$ to $11V_3$ with the embedded insulating film $11I_F$. The embedded insulating film $11I_F$ includes a silicon oxide film or a silicon nitride film as a major component, and preferable examples of the deposition process include the ALD process, the CVD process and a spin-on-dielectric (SOD) process, which exhibit excellent step coverage (i.e., silicon trench step coverage). FIG. 1J illustrates an example in which the embedded insulating film $11I_F$ having the silicon oxide film as a major component is deposited by the ALD process such that the voids $11V_1$ to $11V_3$ are filled by the embedded insulating film $11I_F$. The ALD process may be performed at a temperature range of 300 to 600° C. by utilizing tetradimethylaminosilane (TDMASi) or ozone ($O_3$) as a raw material gas. Bis (tertiary-butylamino) silane (BTBAS) or oxygen ($O_2$) may also be utilized as the raw material gas for the ALD process. The embedded insulating film $11I_F$ is deposited on an entire surface of the obtained structure of FIG. 1I in a conformal fashion so as to substantially fill the voids $11V_1$ to $11V_3$ with the embedded insulating film $11I_F$. Note that the voids $11V_1$ to $11V_3$ may not have to be completely filled with the embedded insulating film $11I_F$, and the voids $11V_1$ to $11V_3$ filled with the embedded insulating film $11I_F$ may have unfilled parts (i.e., spaces). If the voids $11V_1$ to $11V_3$ filled with the embedded insulating film $11I_F$ have unfilled spaces, a preferable effect of lowering the relative dielectric constant of the entire embedded insulating film $11I_F$ may be obtained.

Further, in the process of FIG. 1J, the embedded insulating film $11I_F$ may be deposited by a combination of the ALD process and the CVD process or a combination of the ALD process and the SOD process. Note that the embedded insulating film $11I_F$ filling the voids $11V_1$ to $11V_3$ may include spaces. If it is preferable that the embedded insulating film $11I_F$ filling the voids $11V_1$ to $11V_3$ include spaces, the embedded insulating film $11I_F$ may be deposited by the CVD process or the SOD process.

Figure 1L:
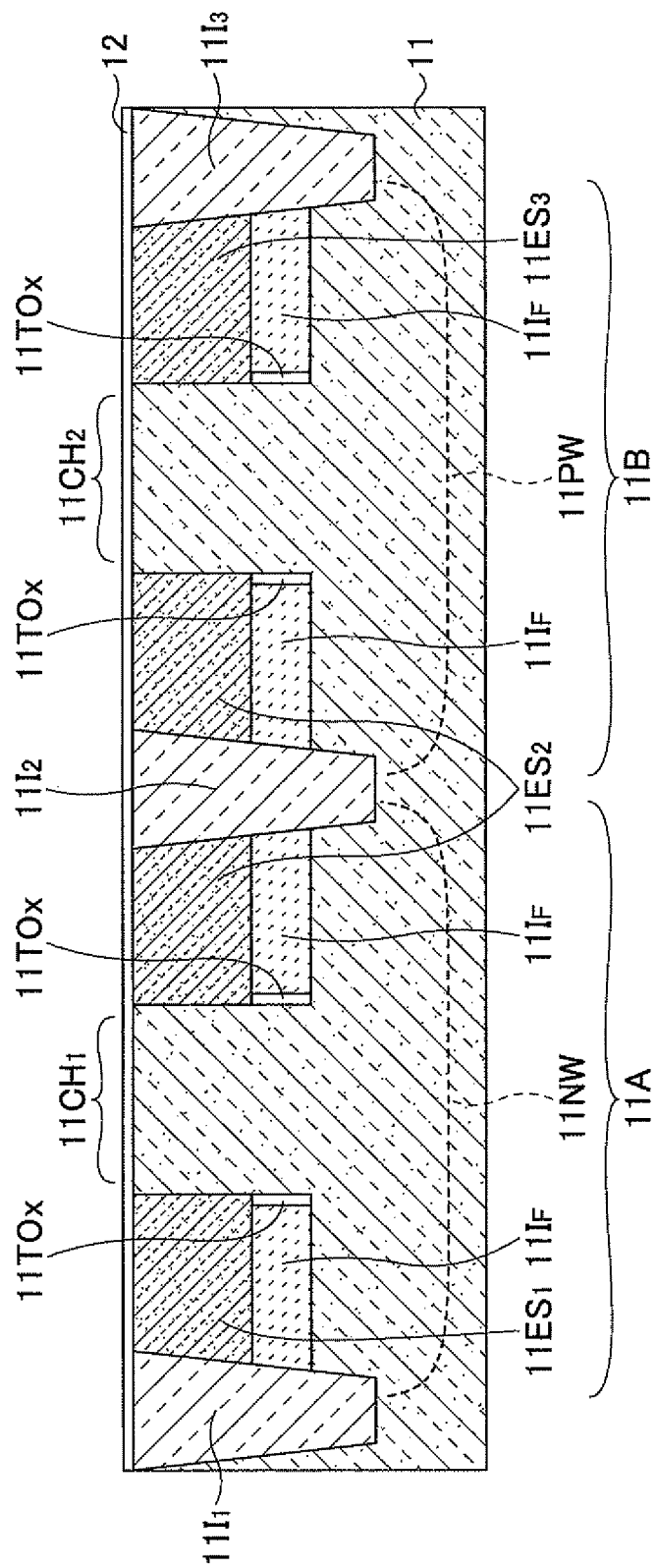
FIG. 1L is a cross-sectional diagram illustrating the method for fabricating the semiconductor device according to the first embodiment.

As illustrated in FIG. 1K, the embedded insulating film $11I_F$ deposited in the process of FIG. 1J is removed from the surface of the silicon substrate 11 by, for example, a wet process utilizing a fluorinated acid. Further, as illustrated in FIG. 1L, the device isolation trenches $11TI_1$ to $11TI_3$ are filled with a silicon oxide film by a plasma enhanced chemical vapor deposition (PECVD) process. Thereafter, the silicon oxide film deposited on the silicon substrate 11 is removed by a chemical mechanical polishing (CMP) process, and the device isolation trenches $11TI_1$ to $11TI_3$ are filled with device isolation insulating films $11I_1$ to $11I_3$, thereby forming a shallow-trench isolation (STI) structure.

Accordingly, the device region 11A of the p-channel MOS transistor and the device region 11B of the n-channel MOS transistor that are formed on the silicon substrate 11 are defined by the device isolation insulating films $11I_1$ to $11I_3$ that are formed corresponding to the device isolation regions.

As illustrated in FIG. 1A, the well implantation or the channel implantation to form the n-well 11NW and the p-well 11PW may be performed after the device isolation insulating films $11I_4$ to $11I_3$ are formed.

Further, in the process of FIG. 1L, a thin insulating film 12, which will form a gate insulating film of the p-channel MOS transistor or the n-channel MOS transistor, is formed on the silicon substrate 11. The gate insulating film 12 may be formed by subjecting the surface of the silicon substrate 11 to dry oxidation at approximately 900° C. to form a base oxide film having a film thickness of approximately 1 nm, and subsequently subjecting the obtained surface of the silicon substrate 11 to plasma nitridation under a nitric oxide (NO) gas to convert the surface of the silicon substrate 11 into an oxynitride film. In this case, the plasma nitridation may be performed under a nitrous oxide ($N_2O$) gas or an ammonia ($NH_3$) gas other than the NO gas. Further, the gate insulating film 12 may not be limited to the oxynitride film but may be a high-k dielectric insulating film such as a hafnium oxide ($HfO_2$) film or a hafnium silicate ($HfSiO_4$) film. Moreover, gate oxide films of different kinds and different film thicknesses may be formed corresponding to the device regions 11A and 11B by utilizing a different resist process for each of the device regions 11A and 11B.

Figure 1M:
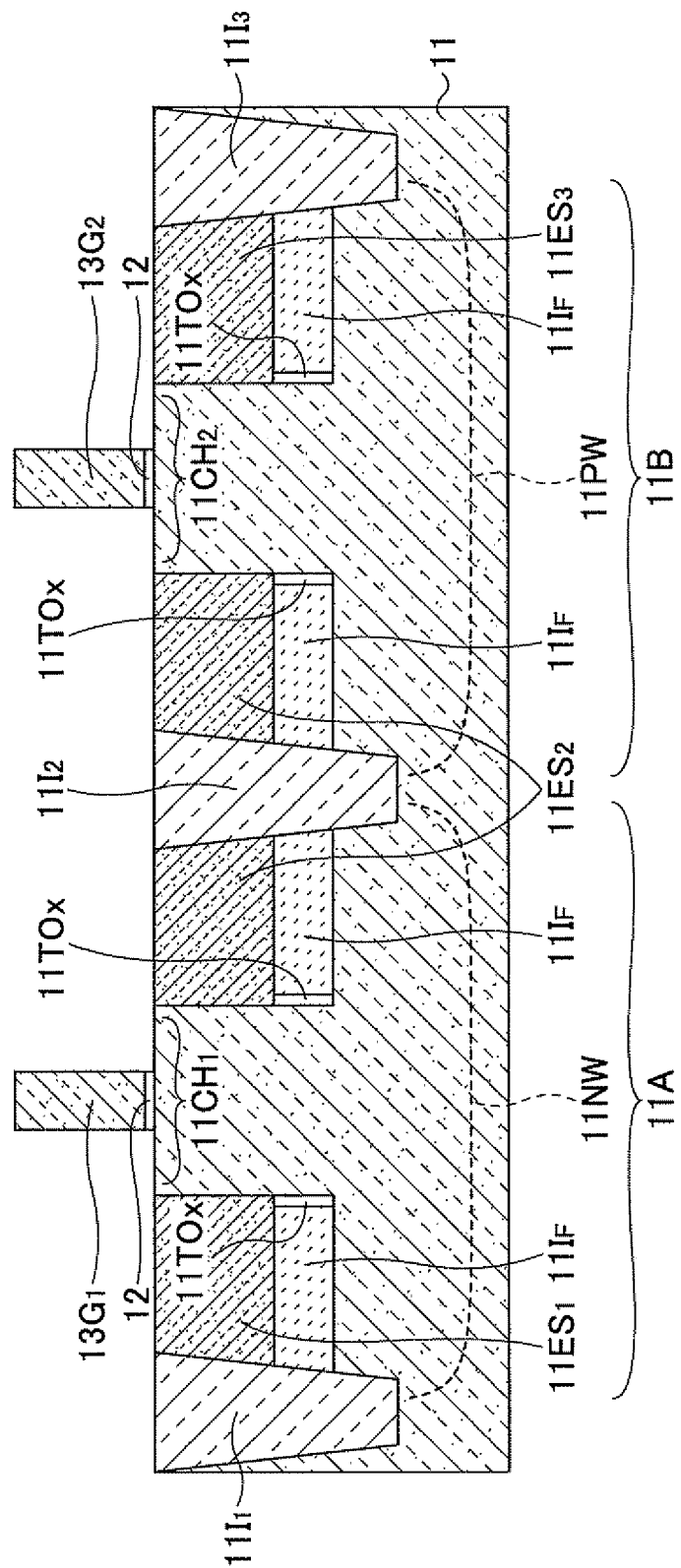
FIG. 1M is a cross-sectional diagram illustrating the method for fabricating the semiconductor device according to the first embodiment.

Next, as illustrated in FIG. 1M, a polysilicon film (not illustrated) is deposited with a film thickness of approximately 100 nm on the obtained structure of FIG. 1L, namely, on the gate insulating film 12 at an approximately 600° C. by a low pressure chemical vapor deposition (LPCVD) process. Further, in the process of FIG. 1M, the polysilicon film in the device region 11A is covered with a resist pattern and the polysilicon film in the device region 11B is n-type doped by doping an n-type dopant into the polysilicon film in the device region 11B. For example, P (phosphorus) may be doped at an accelerating energy of 30 keV or lower at a dose range of $2 \times 10^{15}$ to $2 \times 10^{16}$ $cm^{-2}$ or preferably at an accelerating energy of 20 keV at a dose of $5 \times 10^{15}$ $cm^{-2}$. The ions may be implanted at any tilt and in one or more incident directions (directions of twist), and examples of the ions to be implanted may be one or more types of ions such as P and As. Note that germanium (Ge) or silicon (Si) may be implanted for pre-amorphization prior to implantation of the dopant. Thereafter, the resist pattern is removed by the ashing process or the wet process utilizing the SPM or the like.

Further, in the process of FIG. 1M, the polysilicon film in the device region 11B is covered with a resist pattern and the polysilicon film in the device region 11A is p-type doped by doping a p-type dopant into the polysilicon film in the device region 11A. For example, B (boron) may be doped at an accelerating energy of 7 keV or lower at a dose range of $2 \times 10^{15}$ to $2 \times 10^{16}$ $cm^{-2}$, or preferably at an accelerating energy of 5 keV at a dose of $5 \times 10^{15}$ $cm^{-2}$. The ions may be implanted at any tilt and in one or more incident directions (directions of twist). Further, examples of the ions to be implanted may be one or more types of other B molecular ions such as B, $BF_2$ and $B_{10}Hx$. Note that germanium (Ge) or silicon (Si) may be implanted for pre-amorphization prior to implantation of the dopant. Thereafter, the resist pattern is removed by the ashing process or the wet process utilizing the SPM or the like.

In the process of FIG. 1M, the spike annealing may optionally be performed on the semiconductor substrate under a condition of a heating temperature of 1000° C. and processing duration of approximately 5 sec for promoting the diffusion of the n-type dopant and the p-type dopant implanted into the polysilicon film.

Subsequently, in the process of FIG. 1M, a gate electrode $13G_1$ composed of the p-type polysilicon film is formed in the device region 11A and a gate electrode $13G_2$ composed of the n-type polysilicon film is formed in the device region 11B.

Note that in the process of FIG. 1M, the gate electrodes $13G_1$ and $13G_2$ may not be composed of the polysilicon film, and the gate electrodes $13G_1$ and $13G_2$ may be composed of an amorphous film. In this case, an amorphous film may be formed instead of the polysilicon film in the initial stages of the process of FIG. 1M.

Figure 1N:
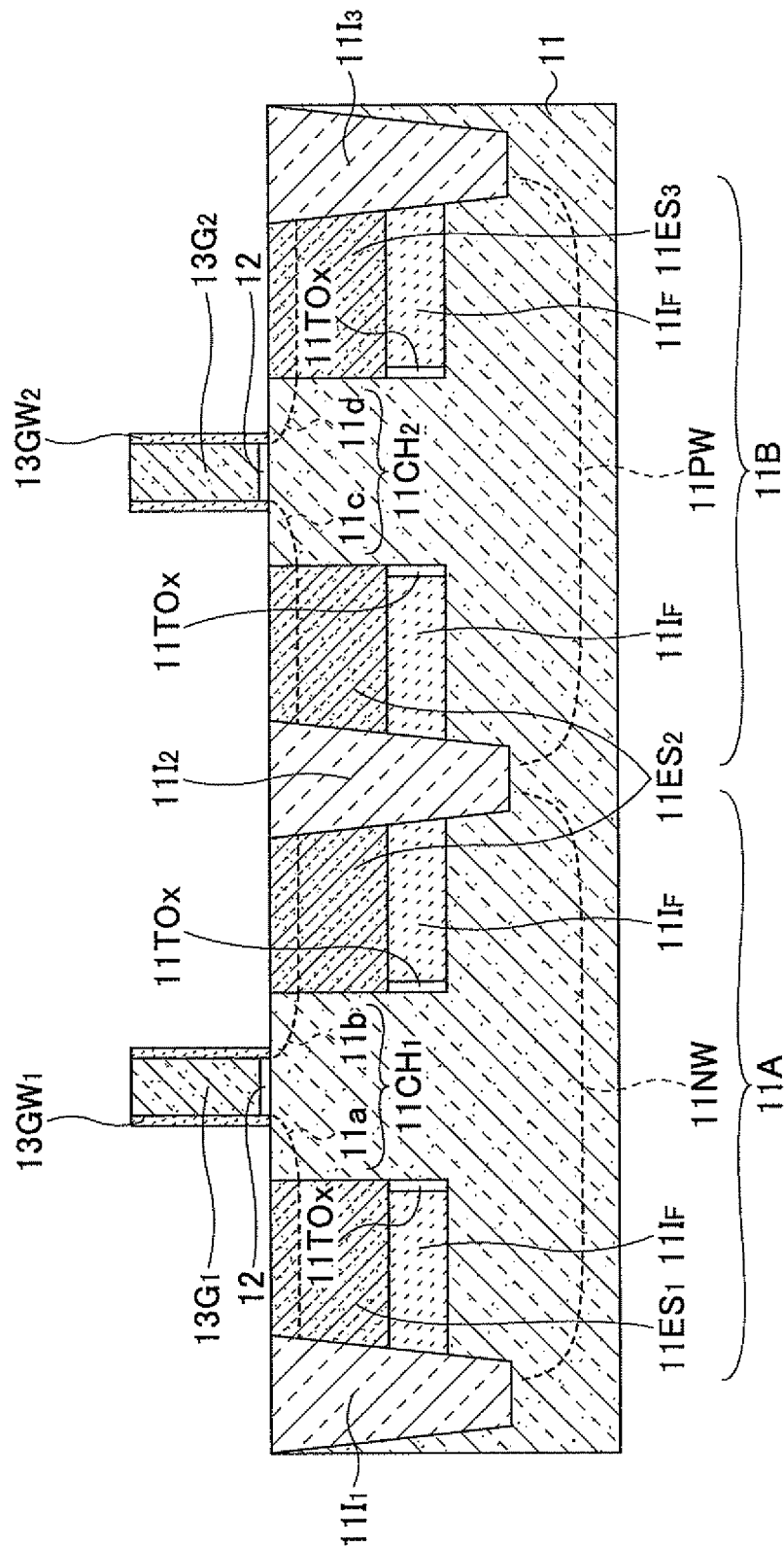
FIG. 1N is a cross-sectional diagram illustrating the method for fabricating the semiconductor device according to the first embodiment.

Next, as illustrated in FIG. 1N, an insulating film (not illustrated) is deposited on the silicon substrate 11 by the CVD process or the like such that the deposited insulating film conforms shapes of the silicon substrate 11 and the gate electrodes $13G_1$ and $13G_2$. The insulating film deposited on the surfaces of the silicon substrate 11 and the gate electrodes $13G_1$ and $13G_2$ is then etched back by a reactive ion etching (RIE) process that reacts in an approximately vertical direction toward the main surface of the silicon substrate 11, thereby forming side wall spacers $13GW_1$ and $13GW_2$ composed of the insulating film on the side surfaces of the corresponding gate electrode patterns $13G_1$ and $13G_2$. The above insulating film may be formed by etching back an oxide film of approximately 10 nm by the LPCVD process at a substrate temperature of approximately 600° C. utilizing a raw material of tetraethylorthosilicate (TEOS). Further, the side wall spacers $13GW_1$ and $13GW_2$ composed of the insulating film may also be formed by etching back a silicon nitride (SiN) film of approximately 10 nm by the LPCVD process at a substrate temperature of approximately 650° C. utilizing a raw material of dichlorosilane ($SiH_2Cl_2$).

Note that in the first embodiment, the side wall spacers $13GW_1$ and $13GW_2$ may not necessarily be formed, and the process of forming the side wall films and the side wall spacers may be omitted.

Further, in the process of FIG. 1N, subsequent to the formation of the side wall spacers $13GW_1$ and $13GW_2$, pocket implantation and extension implantation are performed on the device region 11B utilizing the gate electrode pattern $13G_2$ and the side wall spacer $13GW_2$ as a mask while the device region 11A on the silicon substrate 11 is covered with photoresist. In this case, the side wall spacer $13GW_2$ serves as an offset function for perfoming the pocket implantation and the extension implantation in the device region 11B. As a result, as illustrated in FIG. 1N, a p-type pocket implantation region (not illustrated) and an n-type source/drain extension regions $11c$ and $11d$ are formed on each side of the polysilicon gate electrode $13G_2$ in the substrate part $11CH_2$ forming the channel.

The pocket implantation in the device region 11B may be performed by doping B or the like at an accelerating energy of 20 keV or lower at a dose of $5 \times 10^{13}$ $cm^{-2}$ or lower, or preferably at an accelerating energy of 10 keV at a dose of $3 \times 10^{13}$ cm$^{-2}$. The ions may be implanted at any tilt and in one or more incident directions (directions of twist), and examples of the ions to be implanted may be one or more types of B molecule ions such as B, In, BF$_2$ and B$_{10}$Hx.

The source/drain extension regions 11c and 11d may be formed in the device region 11B by doping As or the like at an accelerating energy of 5 keV or lower at a dose range of 2×10$^{13}$ to 2×10$^{15}$ cm$^{-2}$, or preferably at an accelerating energy of 3 keV at a dose of 5×10$^{14}$ cm$^{-2}$. In this case, the ions may be implanted at any tilt and in one or more incident directions (directions of twist), and examples of the ions to be implanted may be one or more types of ions such as As, P and Sb. Note that germanium (Ge) or silicon (Si) may be implanted for pre-amorphization prior to implantation of the dopant.

Note that if the process of forming the side wall spacers 13GW$_1$ and 13GW$_2$ is omitted from the process of FIG. 1N, doping is performed by utilizing the gate electrode pattern 13G$_2$ as a mask to form the pocket implantation region and the source/drain extension regions 11c and 11d.

Further, in the process of FIG. 1N, an n-type pocket implantation region (not illustrated) and a p-type source/drain extension regions 11a and 11b are formed in the device region 11A on the silicon substrate 11.

More specifically, while the device region 11B is covered with the resist pattern, the pocket implantation and the extension implantation are performed in the device region 11A by utilizing the gate electrode pattern 13G$_1$ and the side wall spacer 13GW$_1$ formed on the gate electrode pattern 13G$_1$ as a mask. In this case, the side wall spacer 13GW$_1$ serves as an offset function for performing the pocket implantation and the extension implantation in the device region 11A.

The pocket implantation in the device region 11B may be perfomed by doping As or the like at an accelerating energy of 100 keV or lower at a dose of 5×10$^{13}$ cm$^{-2}$ or lower, or preferably at an accelerating energy of 70 keV at a dose of 3×10$^{13}$ cm$^{-2}$. In this case, the ions may be implanted at any tilt and in one or more incident directions (directions of twist), and examples of the ions to be implanted may be one or more types of ions such as P, As and Sb.

The source/drain extension regions 11a and 11b may be formed in the device region 11A by doping B or the like at an accelerating energy of 2 keV or lower at a dose range of 2×10$^{13}$ to 2×10$^{15}$ cm$^{-2}$, or preferably at an accelerating energy of 1 keV at a dose of 5×10$^{14}$ cm$^{-2}$. In this case, the ions may be implanted at any tilt and in one or more incident directions (directions of twist), and examples of the ions to be implanted may be one or more types of ions such as B, BF$_2$ and B$_{10}$Hx. Note that germanium (Ge) or silicon (Si) may be implanted for pre-amorphization prior to implantation of the dopant.

In the device region 11A, the pocket impurity element may be implanted at a position deeper than the p-type source/drain extension regions 11a and 11b.

Note that if two or more device regions for p-channel MOS transistor and the N-channel MOS transistor are formed on the silicon substrate 11, the coping condition (ion implanting condition) for forming the pocket implantation region and the source/drain extension regions may be changed corresponding to each of the device regions. In this case, the process of forming a resist pattern, the process of subjecting the pocket implantation to the device regions and the source/drain extension implantation to the device regions, and the process of removing the resist pattern may be repeated the number of necessary times for each of the device regions.

If the formation of the side wall spacer 13GW$_1$ is omitted (not performed), the pocket implantation and the extension implantation in the device region 11A may be performed by utilizing the gate electrode pattern 13G$_1$ as a mask.

Next, as illustrated in 1O, an insulating film preferably having HF resistance such as a silicon oxynitride (SiON) film or a silicon nitride (SiN) film is formed with a film thickness range of 20 to 40 nm on the entire surface of the silicon substrate 11 at a low temperature of approximately 600° C. by the LPCVD process or the like, such that the gate electrode pattern 13G$_1$ carrying the side wall spacer 13GW$_1$ and the gate electrode pattern 13G$_2$ carrying the side wall spacer 13GW$_2$ are covered with the insulating film. Further, the thus formed insulating film is then etched back by the RIE process such that a side wall insulating film 13SW$_1$ is formed on each side of the gate electrode 13G$_1$ via the side wall spacer 13GW$_1$, and similarly, a side wall insulating film 13SW$_2$ is formed on each side of the gate electrode 13G$_2$ via the side wall spacer 13GW$_2$.

Figure 1P:
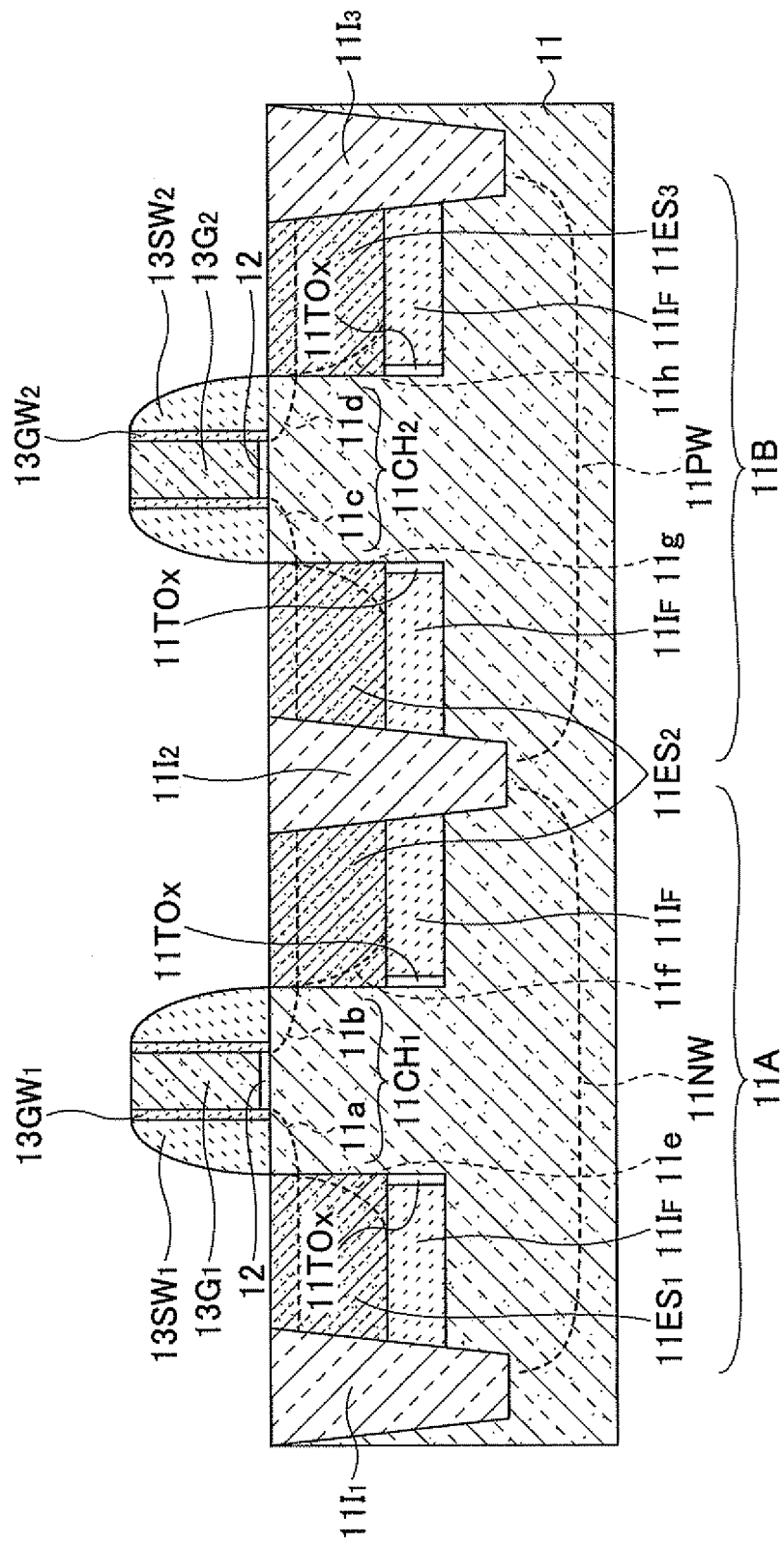
FIG. 1P is a cross-sectional diagram illustrating the method for fabricating the semiconductor device according to the first embodiment.

Next, as illustrated in FIG. 1P, As may be doped at an accelerating energy of 40 keV or lower at a dose range of 5×10$^{14}$ to 2×10$^{16}$ cm$^{-2}$, or preferably at an accelerating energy of 30 keV at a dose of 2×10$^{15}$ cm$^{-2}$. In this case, the ions may be implanted at any tilt and in one or more incident directions (directions of twist), and examples of the ions to be implanted may be one or more types of ions such as As and P. Thus, an n+ source region 11g and an n+ drain region 11h are formed on outer sides of the respective side wall insulating films 13SW$_2$ based on the gate electrode G$_2$ in the device region 11B.

Further, in the process of FIG. 1P, the resist pattern is subsequently removed and the device region 11B is covered with the resist pattern. Then, B may be doped in the device region 11A at an accelerating energy of 7 keV or lower at a dose range of 5×10$^{11}$ to 2×10$^{16}$ cm$^{-2}$, or preferably at an accelerating energy of 5 keV at a dose of 2×10$^{15}$ cm$^{-2}$. In this case, the ions may be implanted at any tilt and in one or more incident directions (directions of twist). Further, examples of the ions to be implanted may be one or more types of other B molecular ions such as B, BF$_2$ and B$_{10}$Hx. Thus, a p+ source region 11e and a p+ drain region 11f are formed on outer sides of the respective side wall insulating films 13SW$_1$ based on the gate electrode 13G$_1$ in the device region 11A.

Figure 1Q:
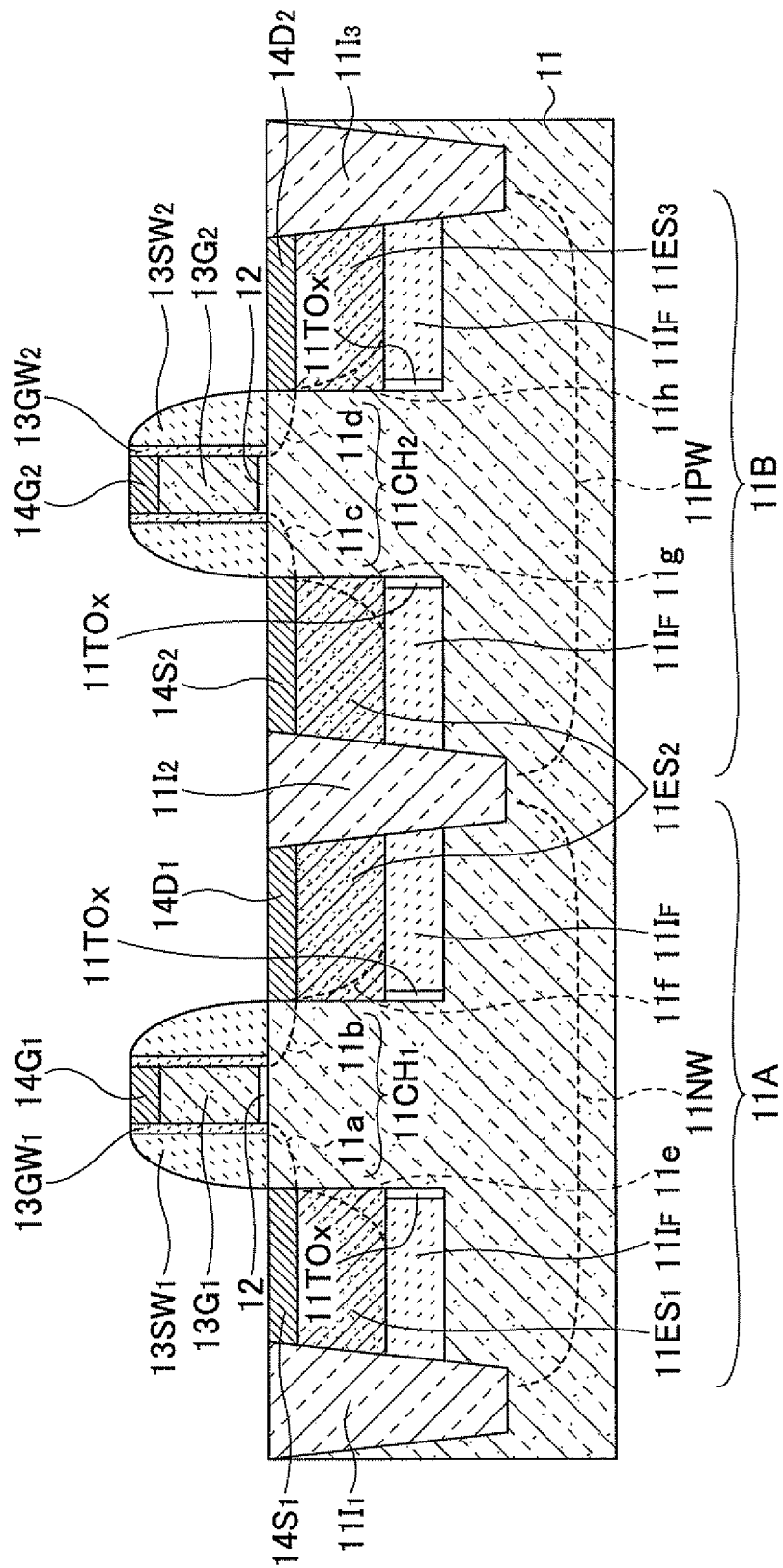
FIG. 1Q is a cross-sectional diagram illustrating the method for fabricating the semiconductor device according to the first embodiment.

Further, as illustrated in FIG. 1Q, a salicide (self-aligned silicide) process, in which a metallic film such as nickel (Ni) or cobalt (Co) is deposited and the obtained metallic film is rapidly heated, is performed on the obtained structure of FIG. 1P. As a result of the salicide process, a silicide layer 14S$_1$ such as NiSi is formed on a surface of the p+ source region 11e, a similar silicide layer 14D$_1$ is formed on a surface of the p+ drain region 11f, a similar silicide layer 14S$_2$ is formed on a surface of the n+ source region 11g, a similar silicide layer 14D$_2$ is formed on a surface of the n+ drain region 11h, and similar silicide layers 14G$_1$ and 14G$_2$ are respectively formed on the surfaces of the polysilicon gate electrodes 13G$_1$ and 13G$_2$.

Figure 1R:
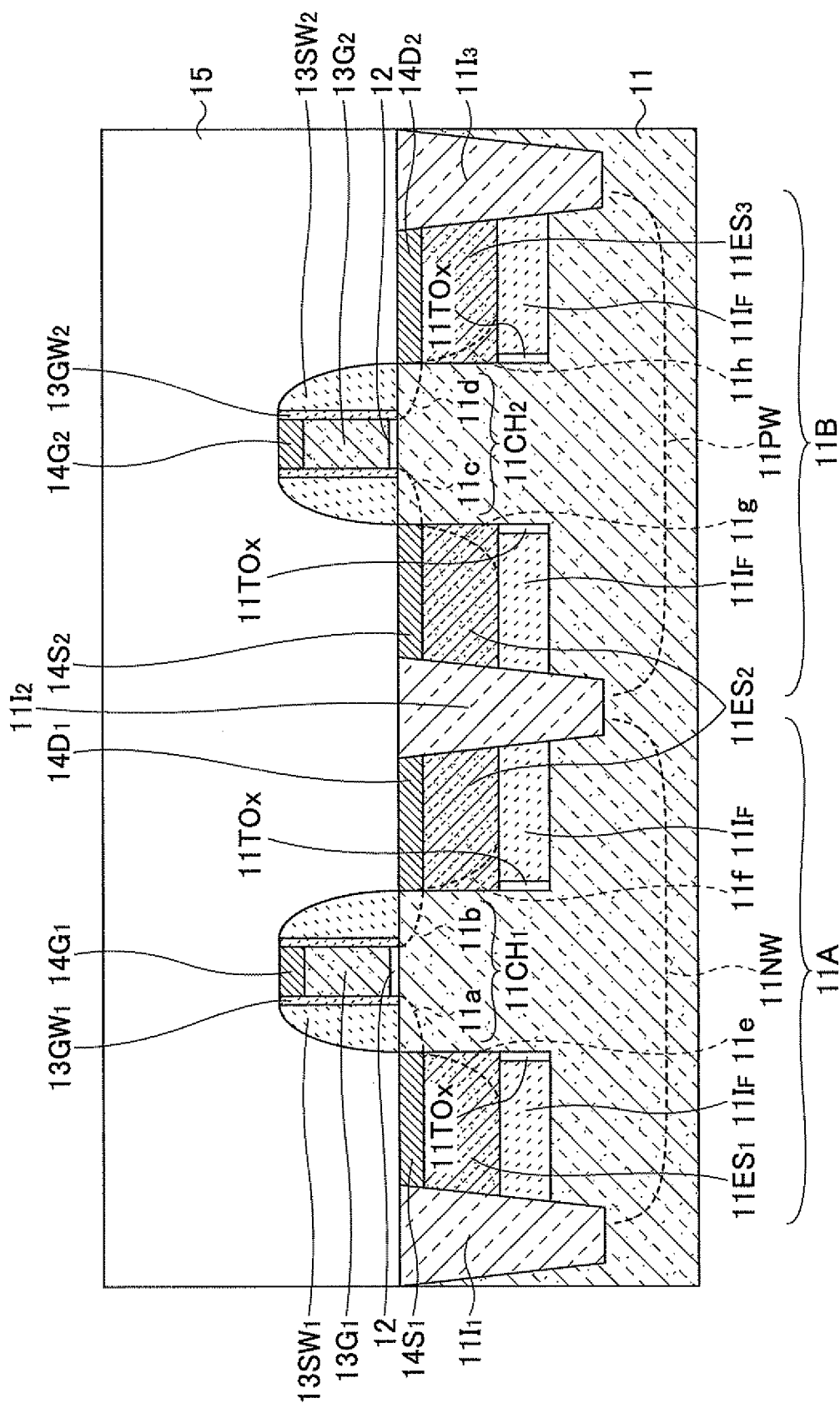
FIG. 1R is a cross-sectional diagram illustrating the method for fabricating the semiconductor device according to the first embodiment.
Figure 1S:
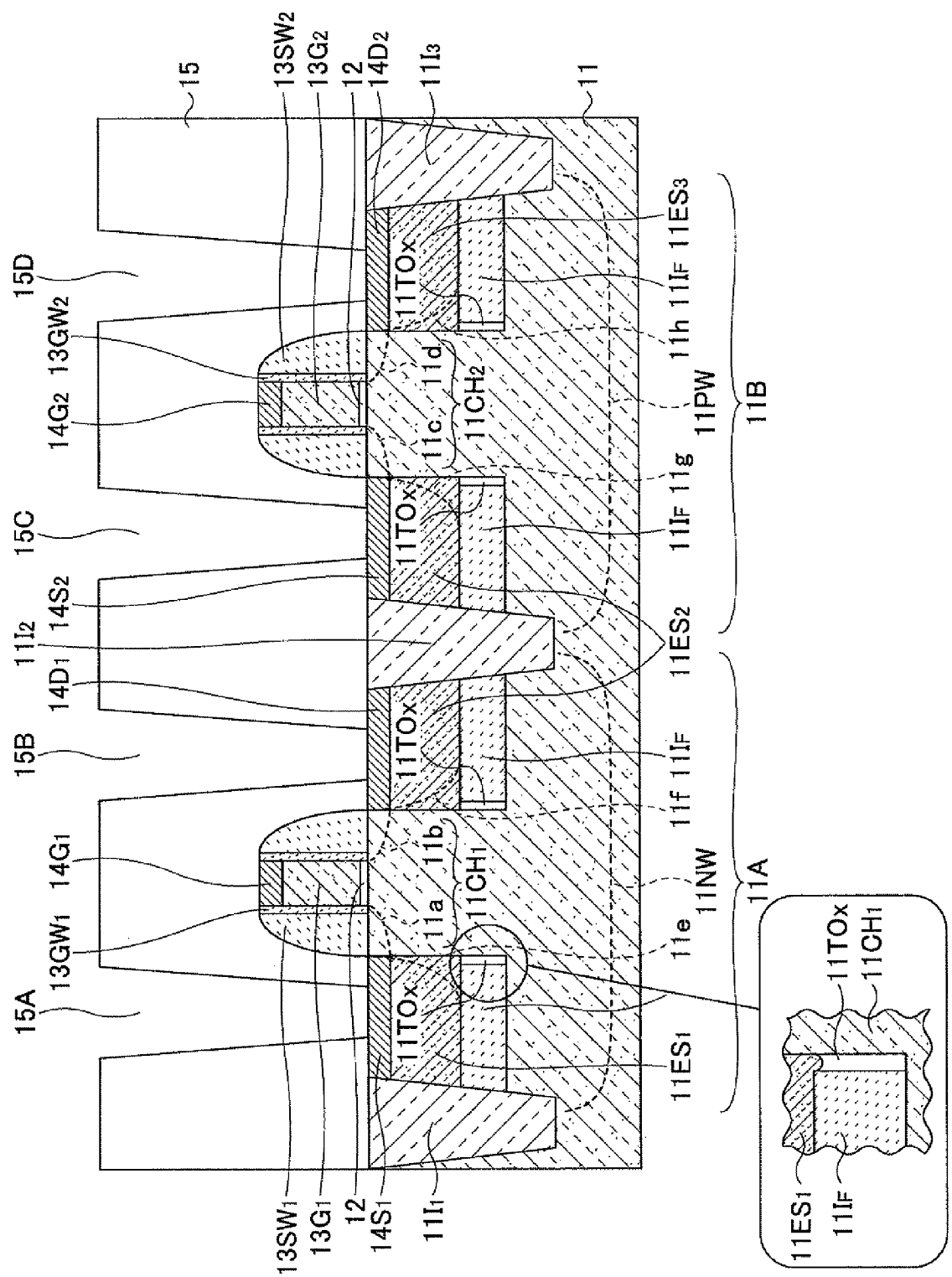
FIG. 1S is a cross-sectional diagram illustrating the method for fabricating the semiconductor device according to the first embodiment.

Further, as illustrated in FIG. 1R, an interlayer insulating film 15 is formed by the plasma CVD process utilizing tetraethylorthosilicate (TEOS) as a raw material such that the gate electrode 13G$_1$ and the side wall insulating film 13SW$_1$ are covered with the interlayer insulating film 15 in the device region 11A and the gate electrode 13G$_2$ and the side wall insulating film 13SW$_2$ are covered with the interlayer insulating film 15 in the device region 11B on the obtained structure of FIG. 1Q. Subsequently, as illustrated in FIG. 1S, via holes 15A to 15D are formed in the interlayer insulating film 15 such that the silicide layers 14S$_1$, 14D$_1$, 14S$_2$ and 14D$_2$ are exposed from the via holes 15A to 15D in interlayer insulating film 15.

Figure 1T:
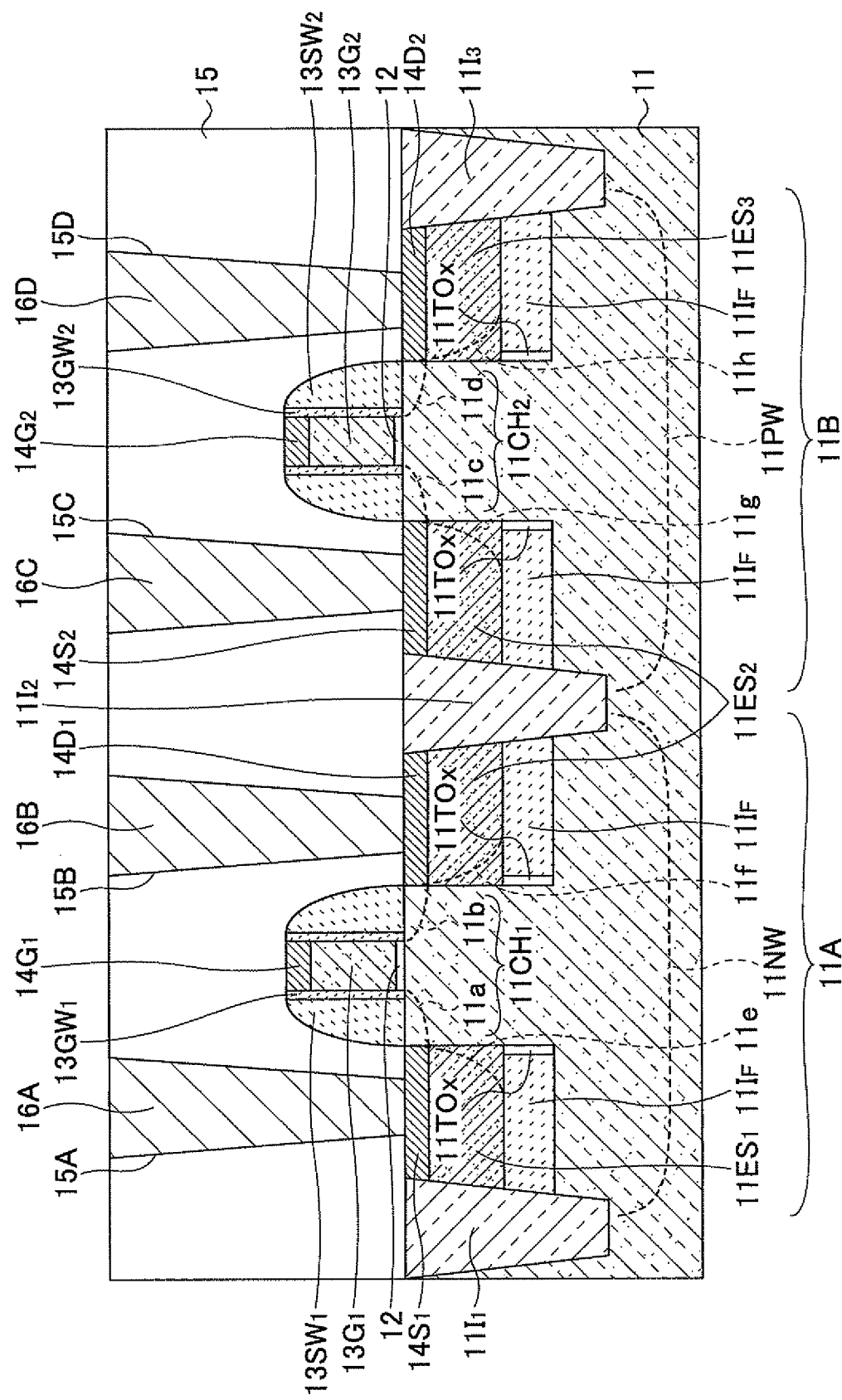
FIG. 1T is a cross-sectional diagram illustrating the method for fabricating the semiconductor device according to the first embodiment.

Further, as illustrated in FIG. 1T, via plugs 16A to 16D composed of tungsten (W) or copper (Cu) are respectively formed in the via holes 15A to 15D optionally with not illustrated barrier metal films such as tantalum nitride (TaN) or titanium nitride (TiN). Subsequently, the via plugs 16A to 16D (e.g., tungsten) and the barrier metal are polished by chemical mechanical planarization/polishing (CMP) process until a surface of the interlayer insulating film 15 is exposed, and a wire layer is subsequently formed. As a result, a semiconductor device according to the first embodiment is fabricated.

As illustrated earlier with reference to FIG. 1I, according to the first embodiment, since the side surfaces of the trenches $TA_1$ to $TA_3$ are covered with the thin insulating film 11TOx in the process of FIG. 1D, the SiGe mixed crystal layers $11SG_1$ to $11SG_3$ will not be brought into contact with the side surfaces of the trenches $TA_1$ to $TA_3$ in the process of FIG. 1F. In the process of FIG. 1I, the silicon epitaxial layers $11ES_1$ to $11ES_3$ are epitaxially and directly bonded with the silicon substrate 11 forming the side surfaces of the trenches $TA_1$, $TA_2$ and $TA_3$. That is, the silicon epitaxial layers $11ES_1$ to $11ES_3$ are directly bonded with the side surfaces of the trenches $TA_1$, $TA_2$ and $TA_3$ formed of the silicon substrate 11. Accordingly, even if the voids $11V_1$ to $11V_3$ are formed by etching of the SiGe mixed crystal layers $11SG_1$ to $11SG_3$, the silicon epitaxial layers $11ES_1$ to $11ES_3$ will not falloff of the side surfaces of the trenches $TA_1$, $TA_2$ and $TA_3$, which may retain a stable structure of FIG. 1I.

Further, according to the first embodiment, the gate insulating films 12 and the gate electrodes $13G_1$ and $13G_2$ are formed on the flat surface of the bulk silicon substrate 11 having no treatment such as etching in the p-channel MOS transistor or the n-channel MOS transistor having the embedded insulating film $11I_F$ locally formed beneath the p+ source region 11e or 11g and the p+ drain region 11f or 11h. Accordingly, the channel regions immediately beneath the gate electrodes may be flat and no defects may be induced in the channel regions. That is, according to the first embodiment, the bulk silicon substrate 11 having initial excellent crystalline quality may be utilized as the channel regions, operation properties of the MOS transistors may be improved, and variability in the properties may be reduced.

Note that in the first embodiment, a silicon epitaxial layer doped with B at a concentration of $1\times10^{18}$ cm-3 or more may be utilized in place of the SiGe mixed crystal layers $11SG_1$ to $11SG_3$.

In addition, in the first embodiment, silicon nitride (SiN) film patternd or silicon oxynitride (SiON) film patternd may be utilized in place of the silicon oxide film patterns $11Ox_1$ and $11Ox_2$.

Note that in the first embodiment, the process of FIG. 1C may be modified, and the insulating film 11TOx may be composed of a thermally-oxidized film as illustrated in FIG. 2A. Specifically, in the first embodiment, since a source extension region and a drain extension region are not formed in the substrate parts $11CH_1$ and $11CH_2$, a thermal-oxidizing process may be carried out in the oxygen atmosphere without allowing the properties of the transistors to be deteriorated.

Figure 2B:
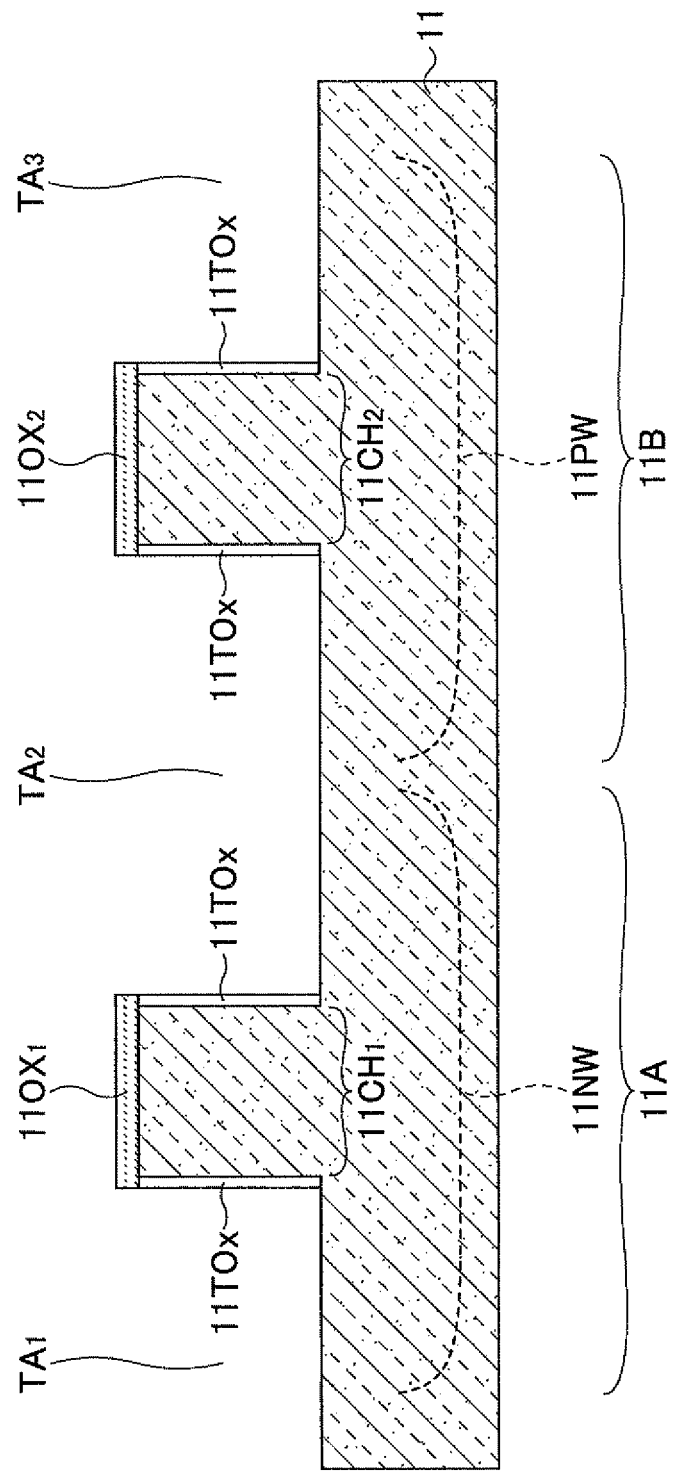
FIG. 2B is a cross-sectional diagram illustrating the method for fabricating the semiconductor device according to the modification of the first embodiment.

When the process of FIG. 2A is performed, the thermally-oxidized film 11TOx may be removed from the bottom surfaces of the trenches $TA_1$ to $TA_3$ by anisotropic etching in a similar manner as the preceding process of FIG. 1D as illustrated in FIG. 2B.

Thereafter, processes similar to those illustrated subsequent to FIG. 1E may be carried out to fabricate a semiconductor device having a structure substantially identical to that illustrated in FIG. 1T. Note that in this case, the thermally-oxidized film 11TOx is utilized in place of the insulating film 11TOx.

Note that in the structure of FIG. 1S, the embedded insulating film $11I_F$ is formed adjacent to the insulating film 11TOx. Accordingly, if the embedded insulating film $11I_F$ and the insulating film 11TOx are both formed of a silicon oxide film, it may be slightly difficult to discriminate the embedded insulating film $11I_F$ from the insulating film 11TOx. However, as illustrated in FIG. 1F, the upper end of the silicon oxide film 11TOx is formed at the position slightly lower than the position of the upper end of the embedded insulating film $11I_F$ replacing the SiGe mixed crystal layer $11SG_1$. Thus, the upper end of the silicon oxide film 11TOx forms a recess configuration. Hence, it may be possible to discriminate the embedded insulating film $11I_F$ from the insulating film 11TOx. Further, if the insulating film 11TOx is formed of the thermally-oxidized film, the amount of the dopant may be small. Accordingly, it may be possible to discriminate the insulating film 11TOx from the embedded insulating film $11I_F$ formed by the vapor phase deposition process.

[Second Embodiment]

Next, a method for fabricating a MOS transistor according a second embodiment is described with reference to FIGS. 3A to 3X.

Figure 3A:
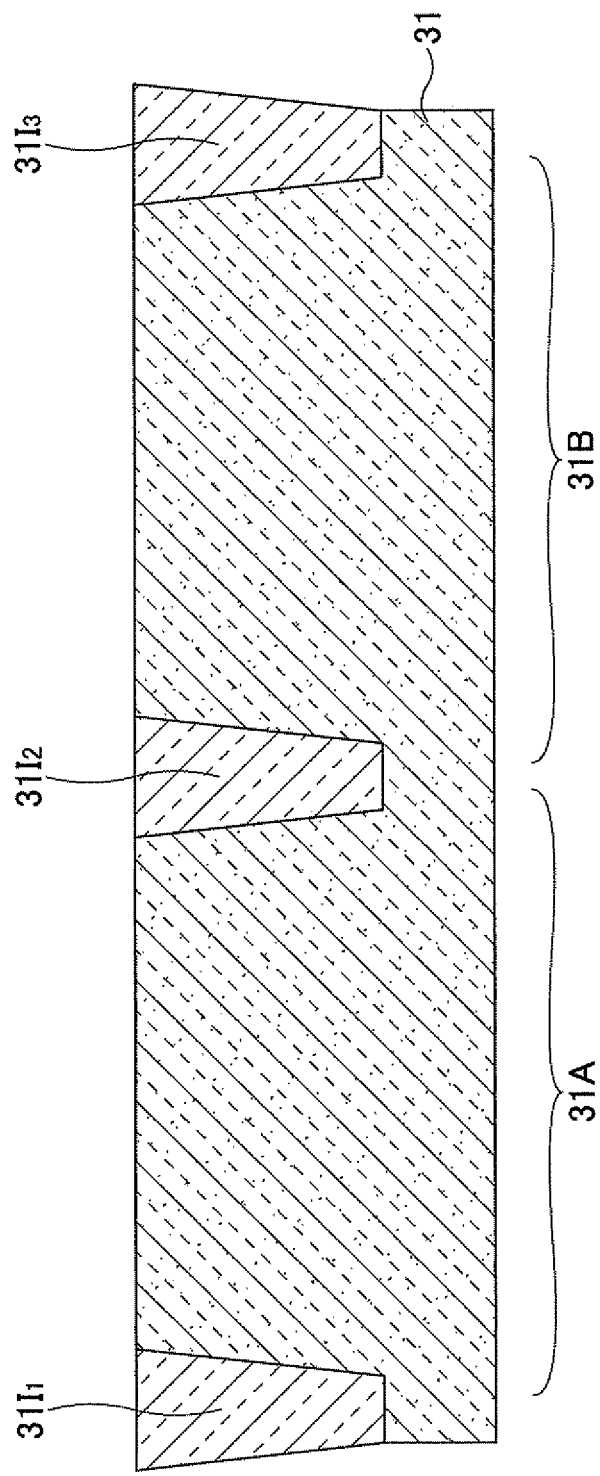
FIG. 3A is a cross-sectional diagram illustrating a method for fabricating a semiconductor device according to a second embodiment.

As illustrated in FIG. 3A, in the second embodiment, initially, device isolation regions $31I_1$ to $31I_3$ having shallow trench isolation (STI) structure are formed such that a device region 31A of the p-channel MOS transistor and a device region 31B of the n-channel MOS transistor, which are to be formed on a silicon substrate 31 composed of single crystal bulk silicon, are mutually isolated from each other via the device isolation regions $31I_1$ to $31I_3$. Accordingly, the device region 31A and the device region 31B are defined via the device isolation regions $31I_1$ to $31I_3$.

Figure 3B:
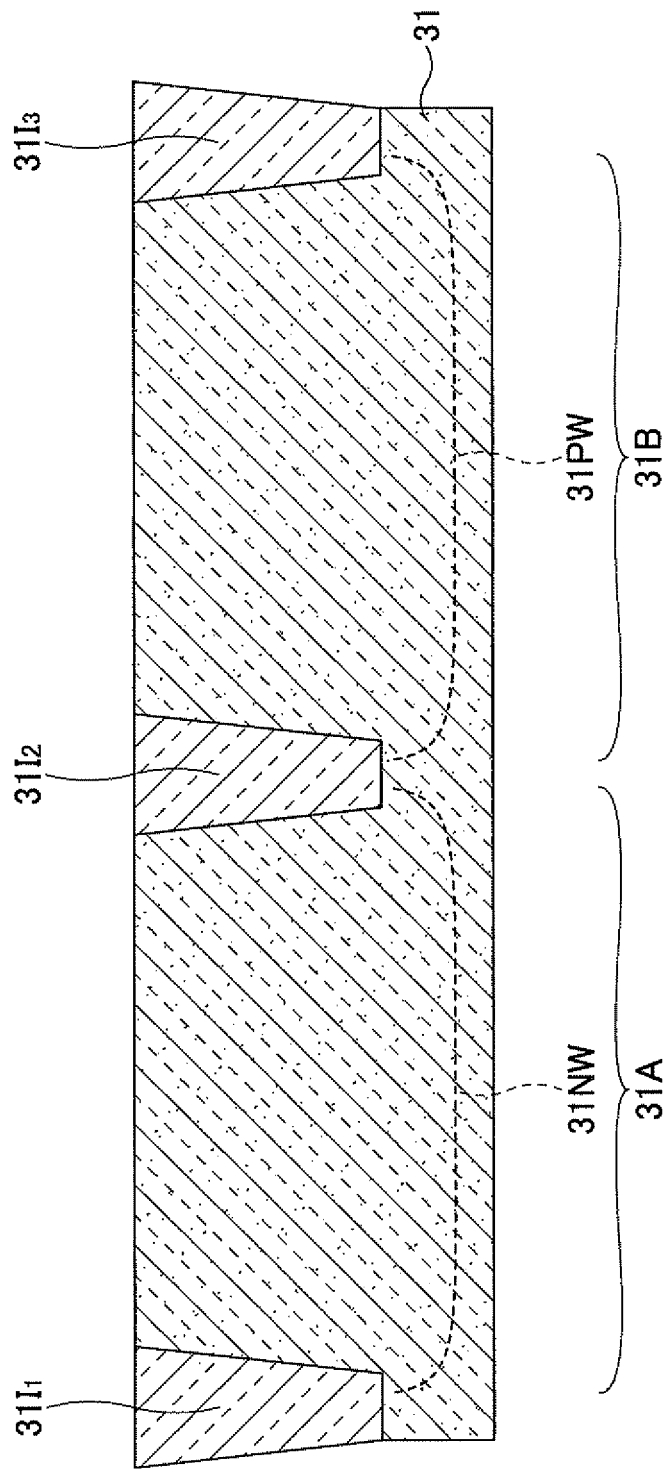
FIG. 3B is a cross-sectional diagram illustrating the method for fabricating the semiconductor device according to the second embodiment.

Next, as illustrated in FIG. 3B, while the device region 31A is protected (covered) with a not illustrated resist pattern, a p-well 11PW is formed by doping boron (B) or the like in the device region 31B at an accelerating energy of 300 keV or lower at a dose of $5\times10^{13}$ cm$^{-2}$ or lower, or preferably at an accelerating energy of 150 keV at a dose of $3\times10^{13}$ cm$^{-2}$. The ions may be implanted at any tilt and in one or more incident directions (directions of twist), and examples of the ions to be implanted may be one or more types of ions such as $BF_2$ and In other than B.

In this case, B (boron) may be doped in the device region 31B of the silicon substrate 31 at an accelerating energy of 150 keV or lower at a dose of $1\times10^{13}$ cm$^{-2}$ or lower, or preferably at an accelerating energy of 30 keV at a dose of $5\times10^{12}$ cm$^{-2}$ so as to perform channel stop implantation. The ions may be implanted to perform the channel stop implantation at any tilt and in one or more incident directions (directions of twist), and examples of the ions to be implanted may be one or more types of ions such as $BF_2$ and In other than B.

Next, ions are implanted for adjusting a threshold of the n-channel MOS transistor. For example, B may be doped at an accelerating energy of 40 keV or lower at a dose of $3\times10^{13}$ cm$^{-2}$ or lower, or preferably at an accelerating energy of 20 keV at a dose of $1\times10^{13}$ cm$^{-2}$. In this case, the ions may be implanted at any tilt and in one or more incident directions (directions of twist). Further, examples of the ions to be implanted may be one or more types of other B molecular ions such as In, $BF_2$ and $B_{10}Hx$ other than B.

Next, as illustrated in FIG. 3B, after the resist pattern is removed from the device region 31A and the device region 31B is protected (covered) with a not illustrated resist pattern (differing from the one removed from the device region 31A), an n-well 11NW is formed by doping phosphorus (P) or the like as an impurity element in the device region 31A at an accelerating energy of 600 keV or lower at a dose of $5\times10^{13}$ cm$^{-2}$ or lower, or preferably at an accelerating energy of 350 keV at a dose of $3\times10^{13}$ cm$^{-2}$. The ions may be implanted at any tilt and in one or more incident directions (directions of twist), and examples of the ions to be implanted may be one or more types of ions such as arsenic (As) and antimony (Sb) other than P.

In this case, As may be doped in the device region 31A of the silicon substrate 31 at an accelerating energy of 300 keV or lower at a dose of $1\times10^{13}$ cm$^{-2}$ or lower, or preferably at an accelerating energy of 100 keV at a dose of $5\times10^{12}$ cm$^{-2}$ so as to perform channel stop implantation. The ions may be implanted at any tilt and in one or more incident directions (directions of twist), and examples of the ions to be implanted may be one or more types of ions such as As and Sb other than P.

Next, ions are implanted for adjusting a threshold of the p-channel MOS transistor. For example, As may be doped at an accelerating energy of 200 keV or lower at a dose of $3\times10^{13}$ cm$^{-2}$ or lower, or preferably at an accelerating energy of 130 keV at a dose of $3\times10^{13}$ cm$^{-2}$. The ions may be implanted at any tilt and in one or more incident directions (directions of twist), and examples of the ions to be implanted may be one or more types of ions such as P, As and Sb.

Further, in the process of FIG. 3B, the resist pattern covering the device region 31B is subsequently removed by an asking process or a wet process utilizing a sulfuric acid hydrogen peroxide mixture (SPM) or the like. Thereafter, the silicon substrate 31 is spike annealed at 1000° C. for approximately 10 sec to activate the impurity element such as B, P or As doped in the silicon substrate 31.

Next, as illustrated in FIG. 3C, an oxide film is formed with a film thickness of approximately 1 nm on the silicon substrate 31 by dry oxidation at a substrate temperature of approximately 900° C., and the obtained oxide film is then subject to plasma nitridation under a nitric oxide (NO) gas. As a result, oxynitride films (i.e., gate insulating films) 32, which will form a gate insulating film of the p-channel MOS transistor and the n-channel MOS transistor, are formed on a surface of the silicon substrate 31. Note that the plasma nitridation to form the oxynitride films (i.e., gate insulating films) 32 may be performed under a nitrous oxide ($N_2O$) gas or an ammonia ($NH_3$) gas other than the NO gas.

Further, in the second embodiment, the gate insulating films of the p-channel MOS transistor and the n-channel MOS transistor may not be limited to the oxynitride film but may be a high-k dielectric insulating film such as a hafnium oxide ($HfO_2$) film or a hafnium silicate ($HfSiO_4$) film. Further, the gate insulating films of different kinds or different film thicknesses may be formed corresponding to the device regions 31A and 31B by utilizing a different resist process for each of the device regions 31A and 31B.

Next, in FIG. 3C, a not illustrated polysilicon film is deposited with a film thickness of approximately 100 nm on the insulating film, which will form the gate insulating films of the thus formed p-channel MOS transistor and n-channel MOS transistor, at a substrate temperature of approximately 600° C. by a low pressure chemical vapor deposition (LPCVD) process. Further, while forming a resist pattern on the polysilicon film in the device region 31A to cover the device region 31A, the polysilicon film in the device region 31B is n-type doped by doping an n-type dopant into the polysilicon film in the device region 11B. For example, P (phosphorus) may be doped at an accelerating energy of 30 keV or lower at a dose range of $2\times10^{25}$ to $2\times10^{26}$ cm$^{-2}$, or preferably at an accelerating energy of 20 keV at a dose of $5\times10^{25}$ cm$^{-2}$. The ions may be implanted at any tilt and in one or more incident directions (directions of twist), and examples of the ions to be implanted may be one or more types of ions such as P and As. Note that germanium (Ge) or silicon (Si) may be implanted for pre-amorphization prior to implantation of the dopant. Thereafter, the resist pattern, which is formed on the polysilicon film to cover (protect) the device region 31A, is removed.

Subsequently, in the process of FIG. 3C, a resist pattern for covering the device region 31B is formed on the polysilicon film formed in the device region 31B, and the polysilicon film formed in the device region 31A is p-type doped by doping a p-type dopant into the polysilicon film in the device region 31A. For example, B (boron) may be doped at an accelerating energy of 7 keV or lower at a dose range of $2\times10^{15}$ to $2\times10^{16}$ cm$^{-2}$, or preferably at an accelerating energy of 5 keV at a dose of $5\times10^{15}$ cm$^{-2}$. The ions may be implanted at any tilt and in one or more incident directions (directions of twist). Further, examples of the ions to be implanted may be one or more types of other B molecular ions such as B, $BF_2$ and $B_{10}Hx$. Note that germanium (Ge) or silicon (Si) may be implanted for pre-amorphization prior to implantation of the dopant. Further, the resist pattern is removed from the polysilicon film formed in the device retion 31B by the asking process or the wet process utilizing the SPM or the like.

MOreover, the spike annealing may optionally be performed on the silicon substrate 31 under a condition of a heating temperature of 1000° C. and processing duration of approximately 5 sec for promoting the diffusion of the n-type dopant and the p-type dopant implanted into the polysilicon film.

Further, in the process of FIG. 3C, the polysilicon film is patterned by anisotropic etching, such that a gate electrode pattern $33G_1$ is formed on the silicon substrate 31 via the gate insulating film 32 in the device region 31A and a gate electrode pattern $33G_2$ is formed on the silicon substrate 31 via the gate insulating film 32 in the device region 31B.

Note that in the process of FIG. 3C, an amorphous silicon film may be formed in place of the polysilicon film. In this case, the gate electrodes $31G_1$ and $32G_2$ may be formed of the amorphous silicon film.

Next, as illustrated in FIG. 3D, a side wall spacer $33GW_1$ is formed on each side of the gate electrode $31G_1$ and a side wall spacer $33GW_2$ is formed on each side of the gate electrode $33G_2$, in a similar manner as the formation of the side wall spacers $13GW_1$ and $13GW_2$ in the first embodiment. Further, while the device region 31A of the silicon substrate 31 is protected (covered) with photoresist, pocket implantation and extension implantation are performed on the device region 31B utilizing the gate electrode pattern $33G_2$ and the side wall spacer $33GW_2$ as a mask. As a result, a p-type pocket implantation region (not illustrated) and an n-type source/drain extension regions 31c and 31d are formed in a similar manner as the formation of the p-type pocket implantation region and the n-type source/drain extension regions 11c and 11d in the first embodiment.

Further, in the process of FIG. 3D, an n-type pocket implantation region (not illustrated) and a p-type source/drain extension regions 31a and 31b are formed in the device region 31A of the silicon substrate 31, in a similar manner as the formation of the n-type pocket implantation region and the p-type source/drain extension regions 11a and 11b in the first embodiment.

Figure 3E:
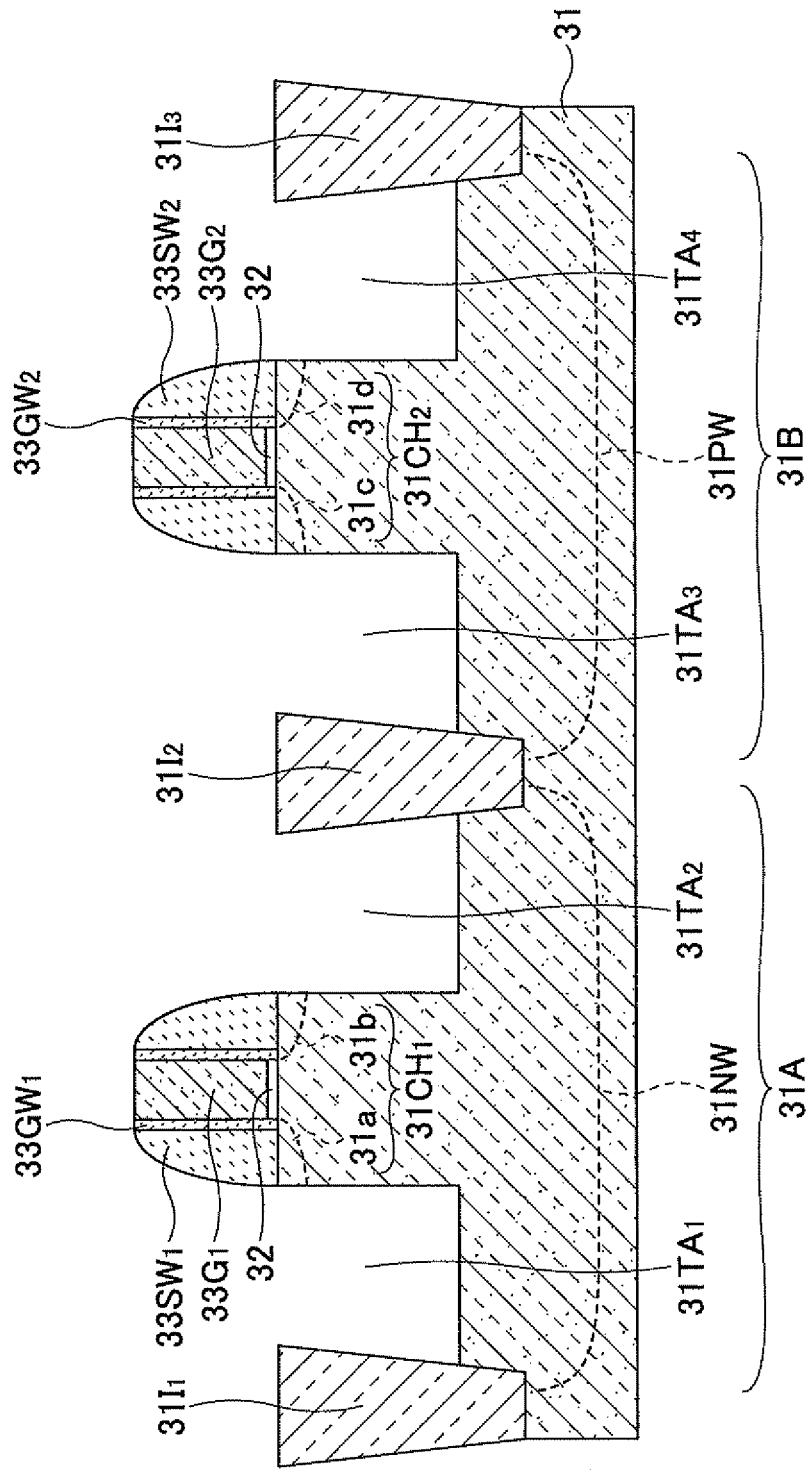
FIG. 3E is a cross-sectional diagram illustrating the method for fabricating the semiconductor device according to the second embodiment.

Next, as illustrated in FIG. 3E, side wall insulating films $33SW_1$ and $33SW_2$ are formed on the gate electrodes $33G_1$ and $33G_2$ via the corresponding side wall spacers $33GW_1$ and $33GW_2$, in a similar manner as the formation of the side wall insulating films $13SW_1$ and $13SW_2$ in the first embodiment.

Figure 10:
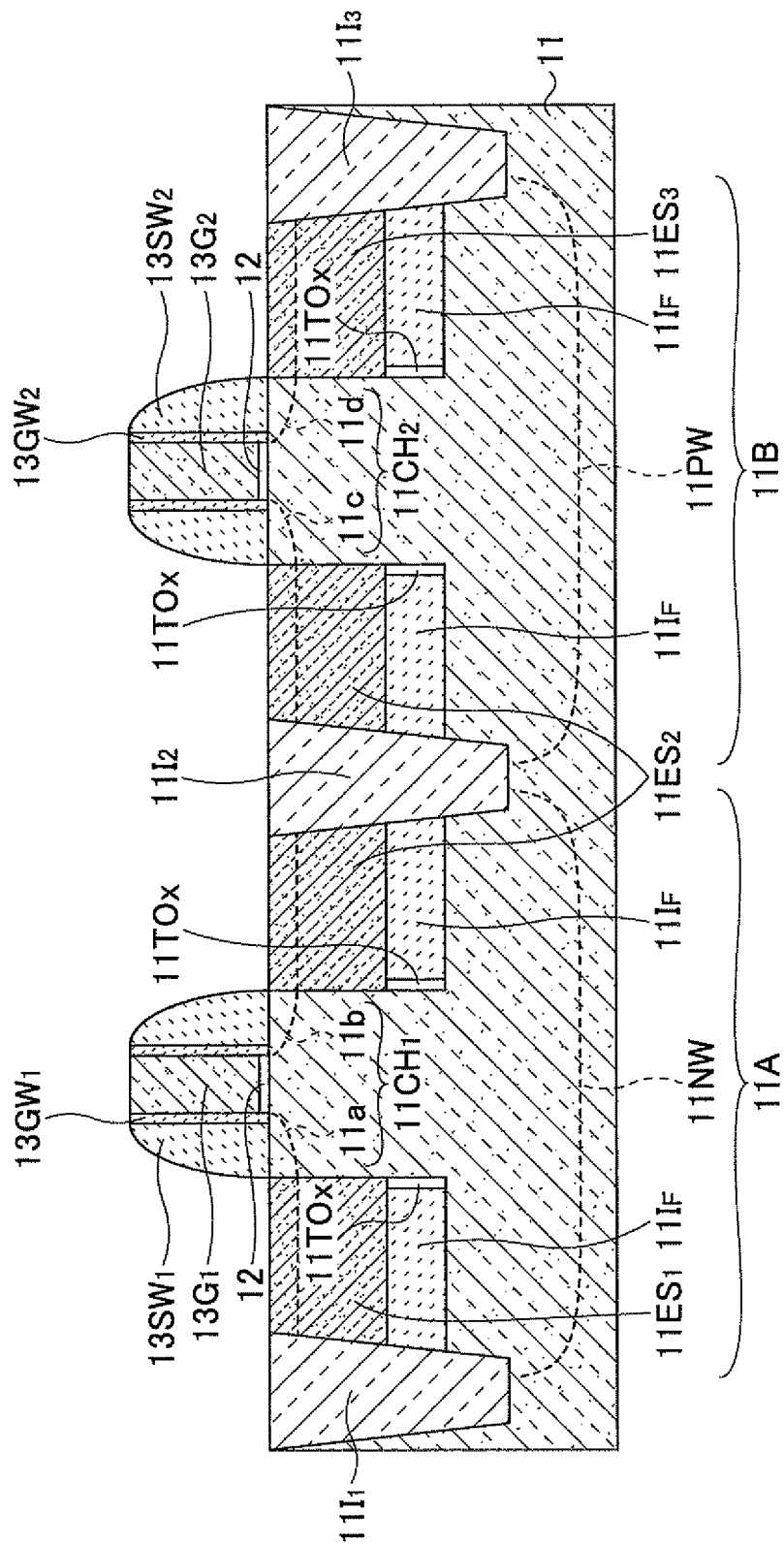

Further, in the process of FIG. 3E, dry etching is performed utilizing the side wall insulating films $33SW_1$ and $33SW_2$ as a mask and $Cl_2$ and HCL as an etching gas, in a similar manner as the process of FIG. 10 in the first embodiment. As a result, the device region 31A of the silicon substrate 31 is covered with the gate electrode pattern $33G_1$ and the side wall insulating film $33GW_1$, and trenches $31TA_1$ and $31TA_2$ are formed with a depth range of 40 to 150 nm on outer sides of a substrate part $31CH_1$ including a channel region in which a p-channel transistor will be formed. Likewise, in the process of FIG. 3E, the device region 31B of the silicon substrate 31 is covered with the gate electrode pattern $33G_2$ and the side wall insulating film $33GW_2$, and trenches $31TA_3$ and $31TA_4$ are formed with a depth range of 40 to 150 nm on outer sides of a substrate part $31CH_2$ including a channel region in which an n-channel transistor will be formed.

Note that in the process of FIG. 3E, though not illustrated, mask patterns similar to the side wall insulating films $33SW_1$ and $33SW_2$ are formed on the gate electrode patterns $33G_1$ and $33G_2$ so that the gate electrode patterns $33G_1$ and $33G_2$ are prevented from being etched when the trenches $31TA_1$ and $31TA_2$ are formed. Such mask patterns formed on the gate electrode patterns $33G_1$ and $33G_2$ are removed in the later-described process, for example, of FIG. 3P.

Figure 3F:
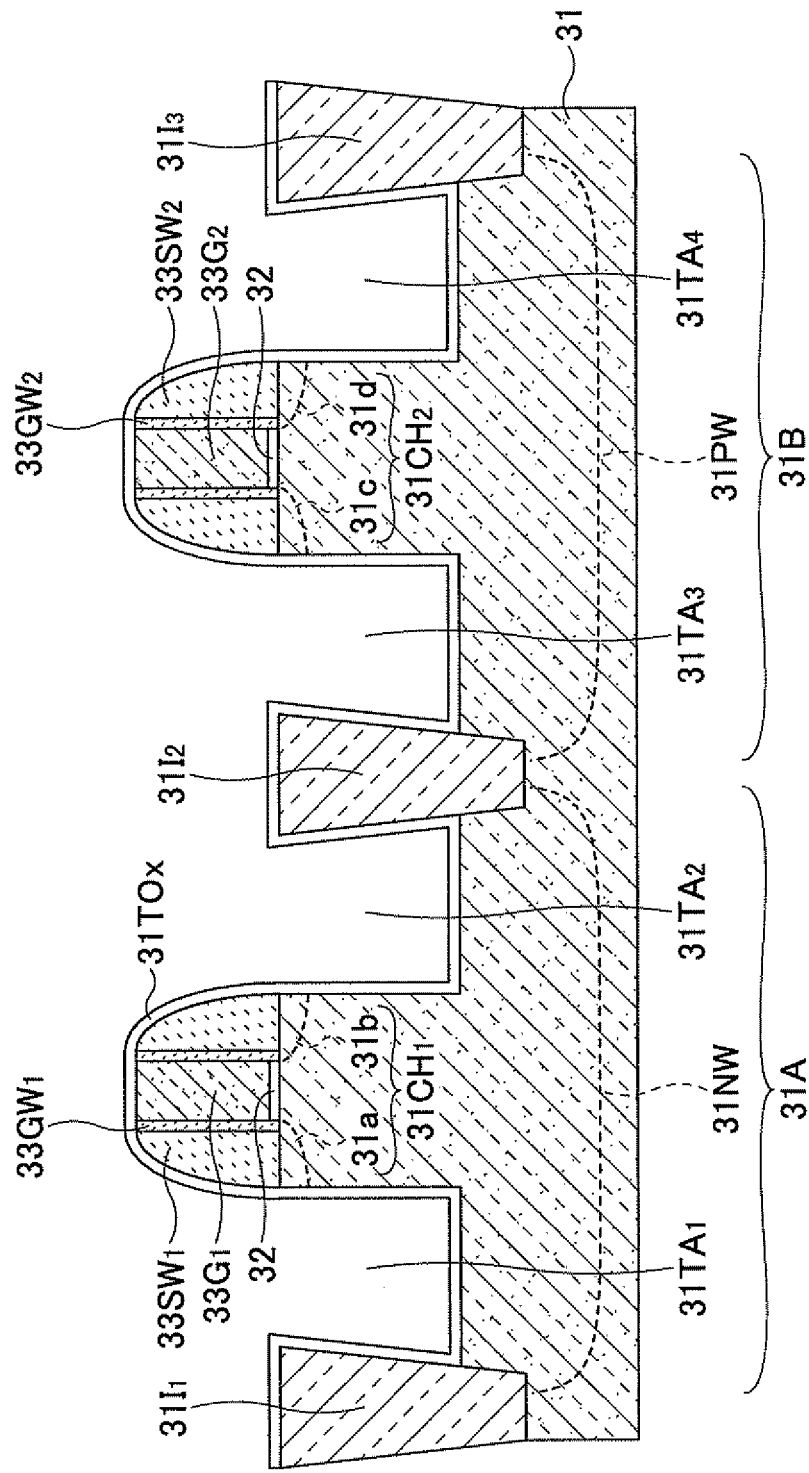
FIG. 3F is a cross-sectional diagram illustrating the method for fabricating the semiconductor device according to the second embodiment.

Next, as illustrated in FIG. 3F, an insulating film 31TOx such as a silicon oxide film, a silicon nitride film or a silicon oxynitride (SiON) film is deposited on the structure obtained in the process of FIG. 3E with a film thickness less than the film thickness of the gate side wall insulating films $33SW_1$ and $33SW_2$, or preferably with a film thickness of 10 nm or less, by a low temperature chemical vapor deposition (CVD) process performed at 400° C. or lower, such as the plasma CVD process or the ALD process. As a result, side surfaces and bottom surfaces of the trenches $31TA_1$ to $31TA_4$ are uniformly covered with the insulating film 31TOx. The concentration profile of the impurity element (dopant) may not be changed in the source extension region 31a and the drain extension region 31b formed in the substrate part $31CH_1$, or in the source extension region 31c and the drain extension region 31d formed in the substrate part $31CH_2$ by performing the deposition of the insulating film 31TOx at the low temperature. Note that it is preferable that the insulating film 31TOx have a film thickness of 2 nm or more.

Next, as illustrated in FIG. 3G, parts of the insulating film 31TOx covering the bottom surfaces of the trenches $31TA_1$ to $31TA_4$ are removed by anisotropic etching that reacts approximately perpendicular to the surface of the silicon substrate 31. As a result, the silicon substrate 31 is exposed from the bottom surfaces of the trenches $31TA_1$ to $31TA_4$.

If the insulating film 31TOx is formed of the same material as the side wall insulating films $33SW_1$ and $33SW_2$ of the gate electrodes $33G_1$ and $33G_2$, the side wall insulating films $33SW_1$ and $33SW_2$ may be etched simultaneously with the parts of the insulating film 31TOx by the anisotropic etching. However, since the film thicknesses of the side wall insulating films $33SW_1$ and $33SW_2$ are far thicker than that of the insulating film 31TOx, the side wall insulating films $33SW_1$ and $33SW_2$ will not be removed completely.

Figure 3H:
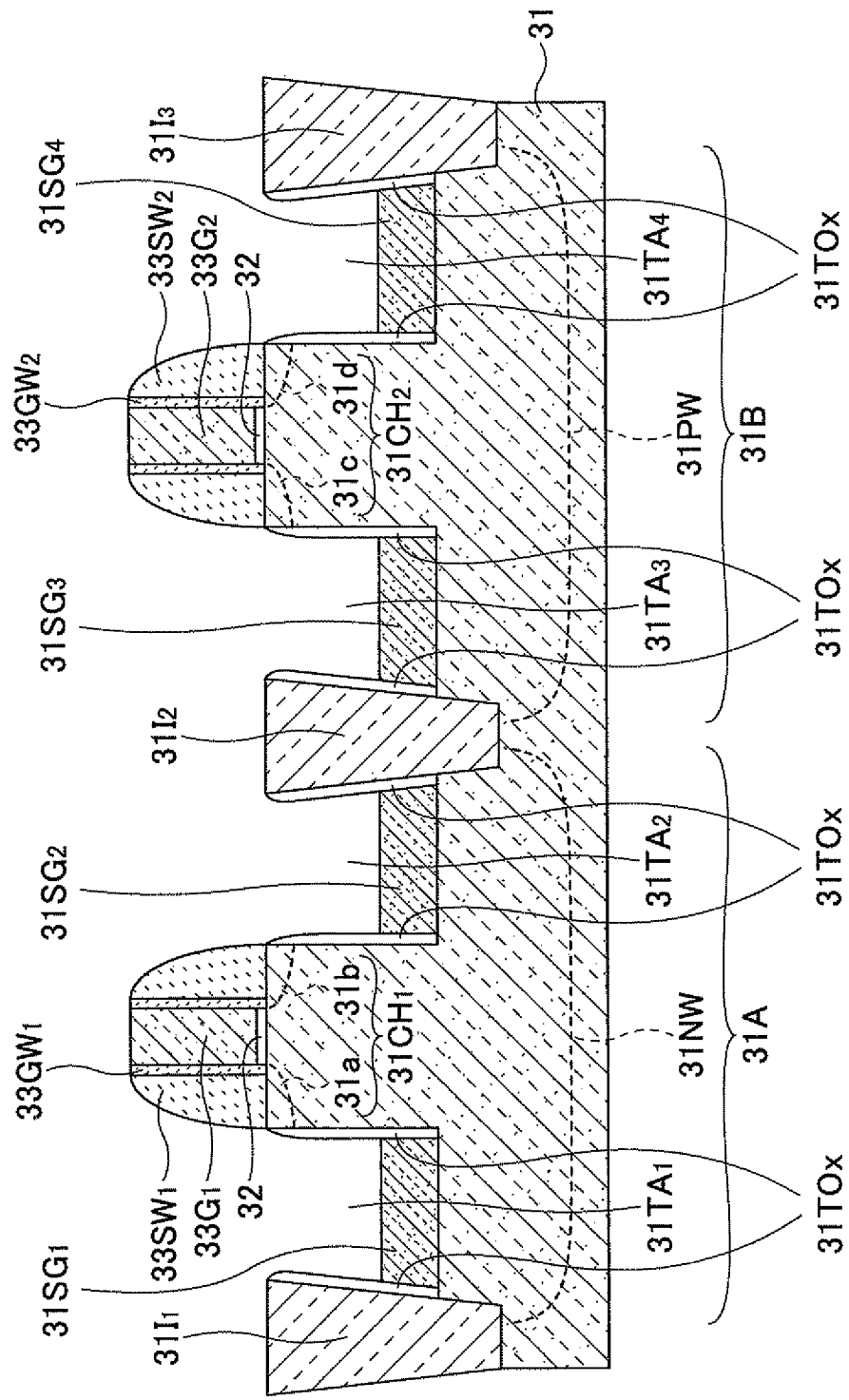
FIG. 3H is a cross-sectional diagram illustrating the method for fabricating the semiconductor device according to the second embodiment.

Next, as illustrated in FIG. 3H, the SiGe mixed crystal layers $31SG_1$, $31SG_2$, $31SG_3$ and $31SG_4$ epitaxially grow in the trenches $31TA_1$ to $31TA_4$ illustrated in FIG. 3G by utilizing a selective epitaxial growth technology in a similar manner as the epitaxial growth in the first embodiment, thereby filling lower parts of the trenches $31TA_1$ to $31TA_4$.

Figure 3I:
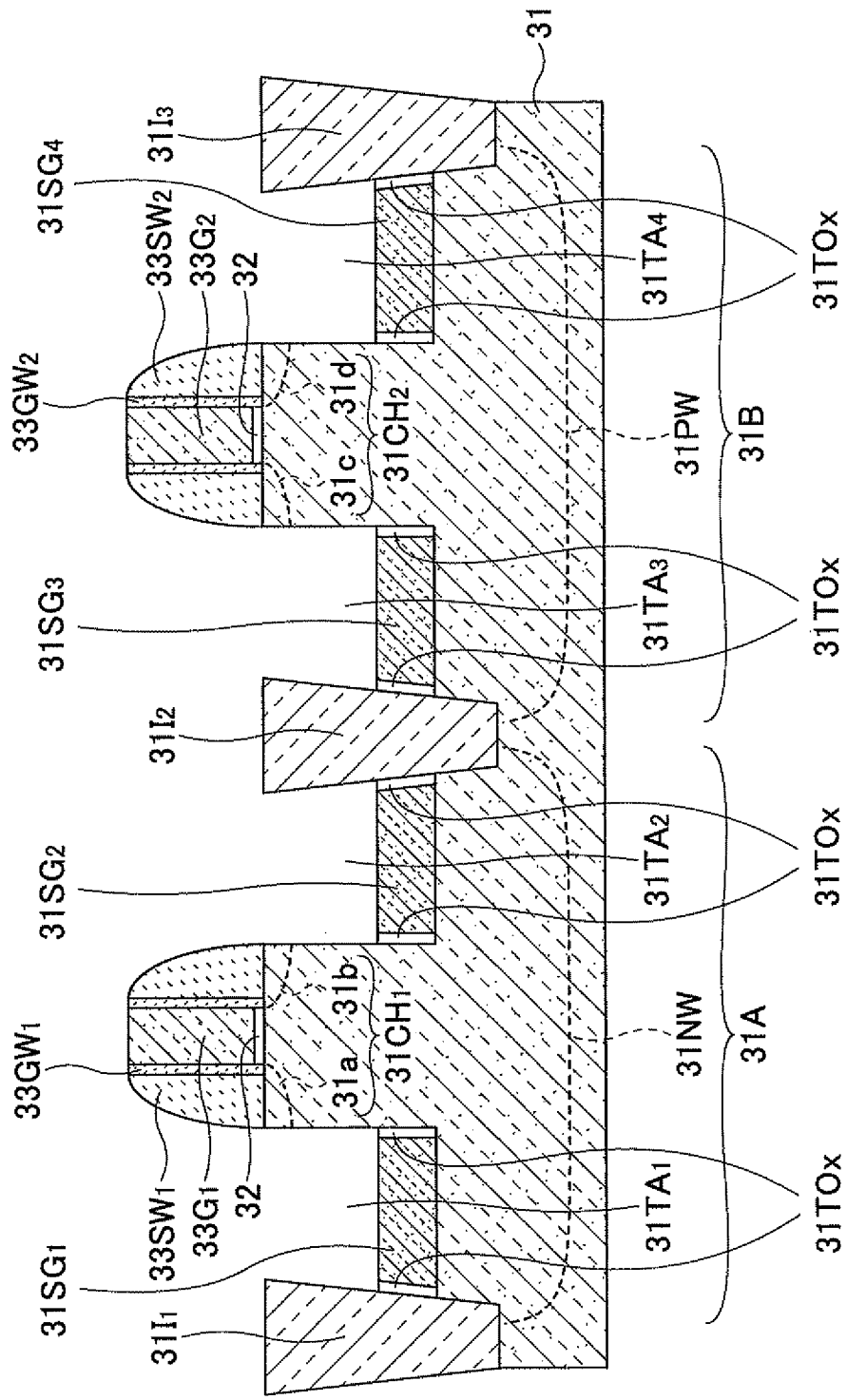
FIG. 3I is a cross-sectional diagram illustrating the method for fabricating the semiconductor device according to the second embodiment.

Next, as illustrated in FIG. 3I, parts of the insulating film 31TOx exposed from the side surfaces of the trenches $31TA_1$ to $31TA_4$ are removed by dry etching or wet etching. As a result, the silicon substrate 31 is exposed from the side surfaces of the trenches $31TA_1$ to $31TA_4$. If the insulating film 31TOx is formed of the same material as the side wall insulating films $33SW_1$ and $33SW_2$ of the gate electrodes $33G_1$ and $33G_2$, the side wall insulating films $33SW_1$ and $33SW_2$ may be etched simultaneously with the parts of the insulating film 31TOx by the dry etching or wet etching. However, since the film thicknesses of the side wall insulating films $33SW_1$ and $33SW_2$ are far thicker than that of the insulating film 31TOx, the film thicknesses of the side wall insulating films $33SW_1$ and $33SW_2$ will not be decreased substantially, or the side wall insulating films $33SW_1$ and $33SW_2$ will not be removed completely.

Figure 3J:
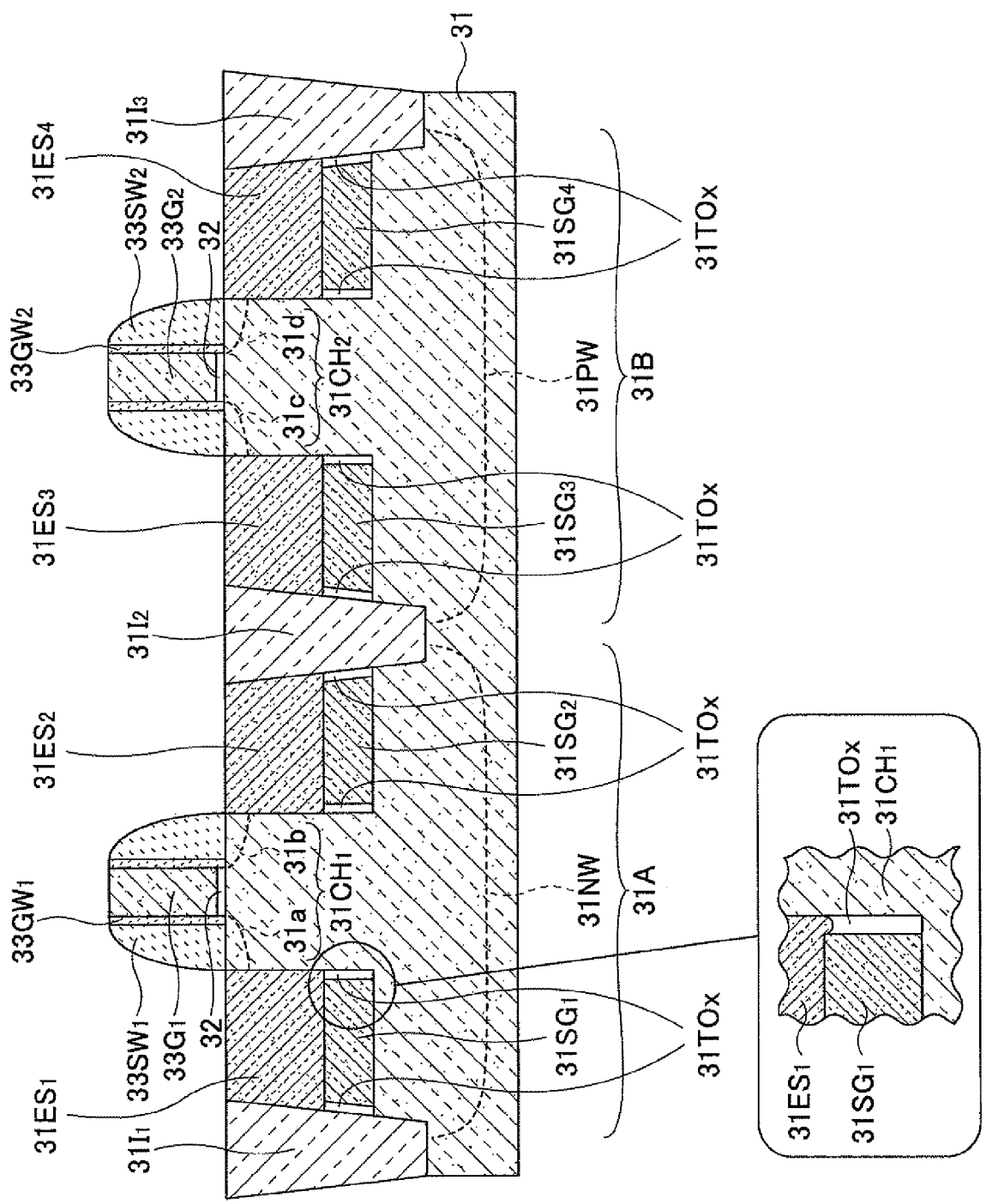
FIG. 3J is a cross-sectional diagram illustrating the method for fabricating the semiconductor device according to the second embodiment.

Next, as illustrated in FIG. 3J, in the trenches $31TA_1$ to $31TA_4$, silicon epitaxial layers $31ES_1$, $31ES_2$, $31ES_3$ and $31ES_4$ are epitaxially formed on the SiGe mixed crystal layers $31SG_1$, $31SG_2$, $31SG_3$ and $31SG_4$ such that the trenches $31TA_1$ to $31TA_4$ are completely filled with the silicon epitaxial layers $31ES_1$, $31ES_2$, $31ES_3$ and $31ES_4$ and the SiGe mixed crystal layers $31SG_1$, $31SG_2$, $31SG_3$ and $31SG_4$.

For example, the SiGe mixed crystal layers $31SG_1$, $31SG_2$, $31SG_3$ and $31SG_4$ are deposited with a film thickness range of 20 to 80 nm by the CVD process using a mixed gas of dichlorosilane, monogermane, hydrogen chloride and hydrogen, under a similar condition as the first embodiment. The silicon epitaxial layers $31ES_1$, $31ES_2$, $31ES_3$ and $31ES_4$ are subsequently deposited with a thickness range of 20 to 70 nm on the SiGe mixed crystal layers $31SG_1$, $31SG_2$, $31SG_3$ and $31SG_4$ by the CVD process using a mixed gas of dichlorosilane, hydrogen chloride and hydrogen, also under a similar condition as the first embodiment.

In the second embodiment, as illustrated in the process of FIG. 3H, the side surfaces of the SiGe mixed crystal layers $31SG_1$, $31SG_2$, $31SG_3$ and $31SG_4$ are covered with the insulating film 31TOx when growing the SiGe mixed crystal layers $31SG_1$, $31SG_2$, $31SG_3$ and $31SG_4$ in the trenches $31TA_1$ to $31TA_4$. Accordingly, the SiGe mixed crystal layers $31SG_1$, $31SG_2$, $31SG_3$ and $31SG_4$ will not grow on the side surfaces of the trenches $31TA_1$ to $31TA_4$. Further, when the silicon epitaxial layers $31ES_1$, $31ES_2$, $31ES_3$ and $31ES_4$ are subsequently formed on the SiGe mixed crystal layers $31SG_1$, $31SG_2$, $31SG_3$ and $31SG_4$ in the trenches $31TA_1$ to $31TA_4$, the silicon epitaxial layers $31ES_1$, $31ES_2$, $31ES_3$ and $31ES_4$ may securely lattice match the silicon substrate 31 that forms the substrate parts $31CH_1$ and $31CH_2$ in the side surfaces of the trenches $31TA_1$ to $31TA_4$.

Figure 3K:
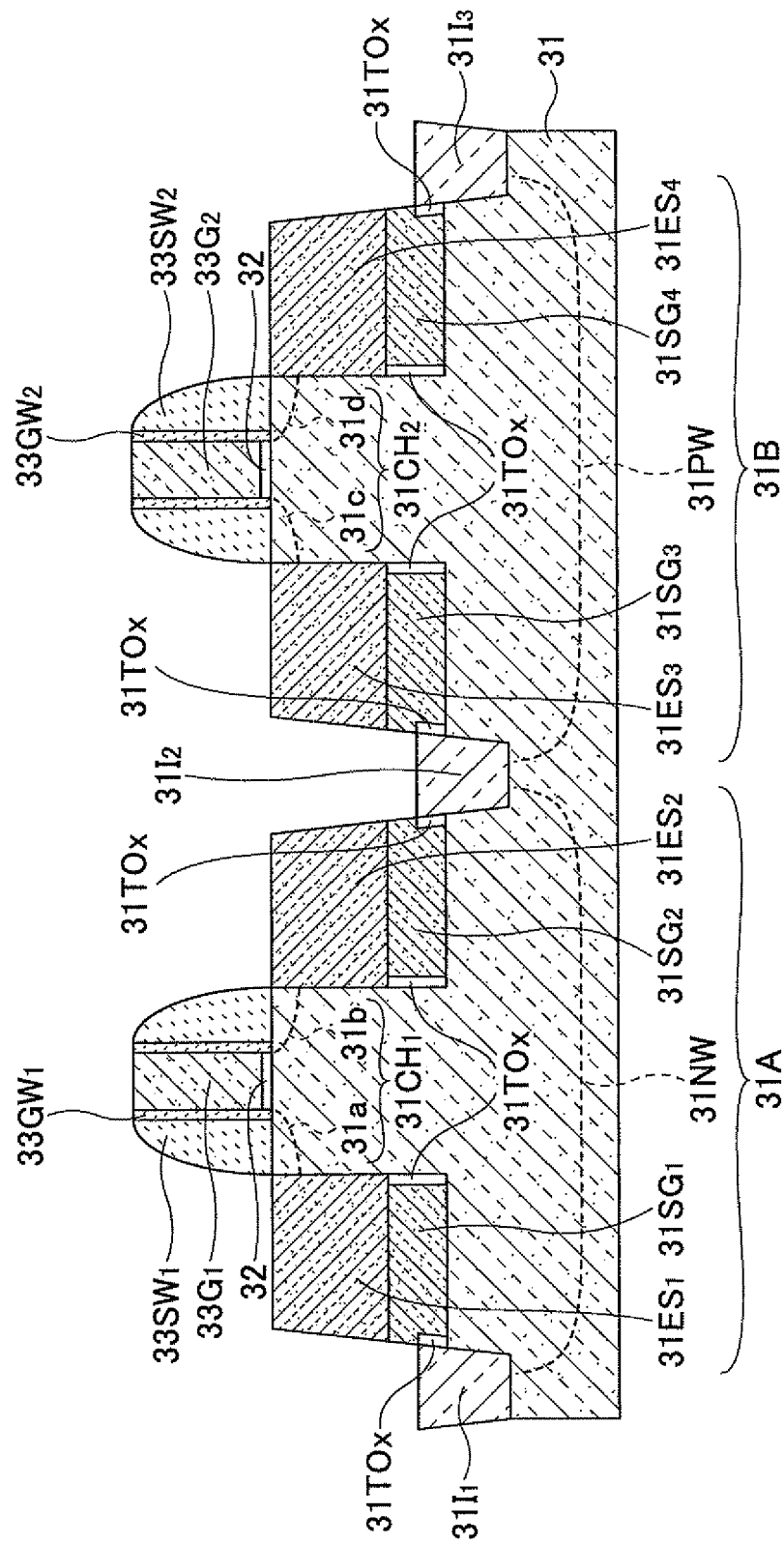
FIG. 3K is a cross-sectional diagram illustrating the method for fabricating the semiconductor device according to the second embodiment.

Next, as illustrated in FIG. 3K, device isolation films forming the device isolation structures $31I_1$ to $31I_3$ are depressed by wet etching utilizing fluorinated acid or by dry etching of the silicon oxide film. As a result, the side surfaces of the SiGe mixed crystal layers $31SG_1$, $31SG_2$, $31SG_3$ and $31SG_4$ are exposed.

Note that in the process of FIG. 3K, the device isolation films forming the device isolation structures $31I_1$ to $31I_3$ may be depressed in advance, and then the SiGe mixed crystal layers $31SG_1$, $31SG_2$, $31SG_3$ and $31SG_4$, and the silicon epitaxial layers $31ES_1$, $31ES_2$, $31ES_3$ and $31ES_4$ may epitaxially grow thereafter.

Note that in the structure obtained in the process of FIG. 3K, the side surfaces of the SiGe mixed crystal layers $31SG_1$, $31SG_2$, $31SG_3$ and $31SG_4$, or the side surfaces of the silicon epitaxial layers $31ES_1$, $31ES_2$, $31ES_3$ and $31ES_4$ may be formed of a single crystalline plane or plural crystalline planes.

Figure 3L:
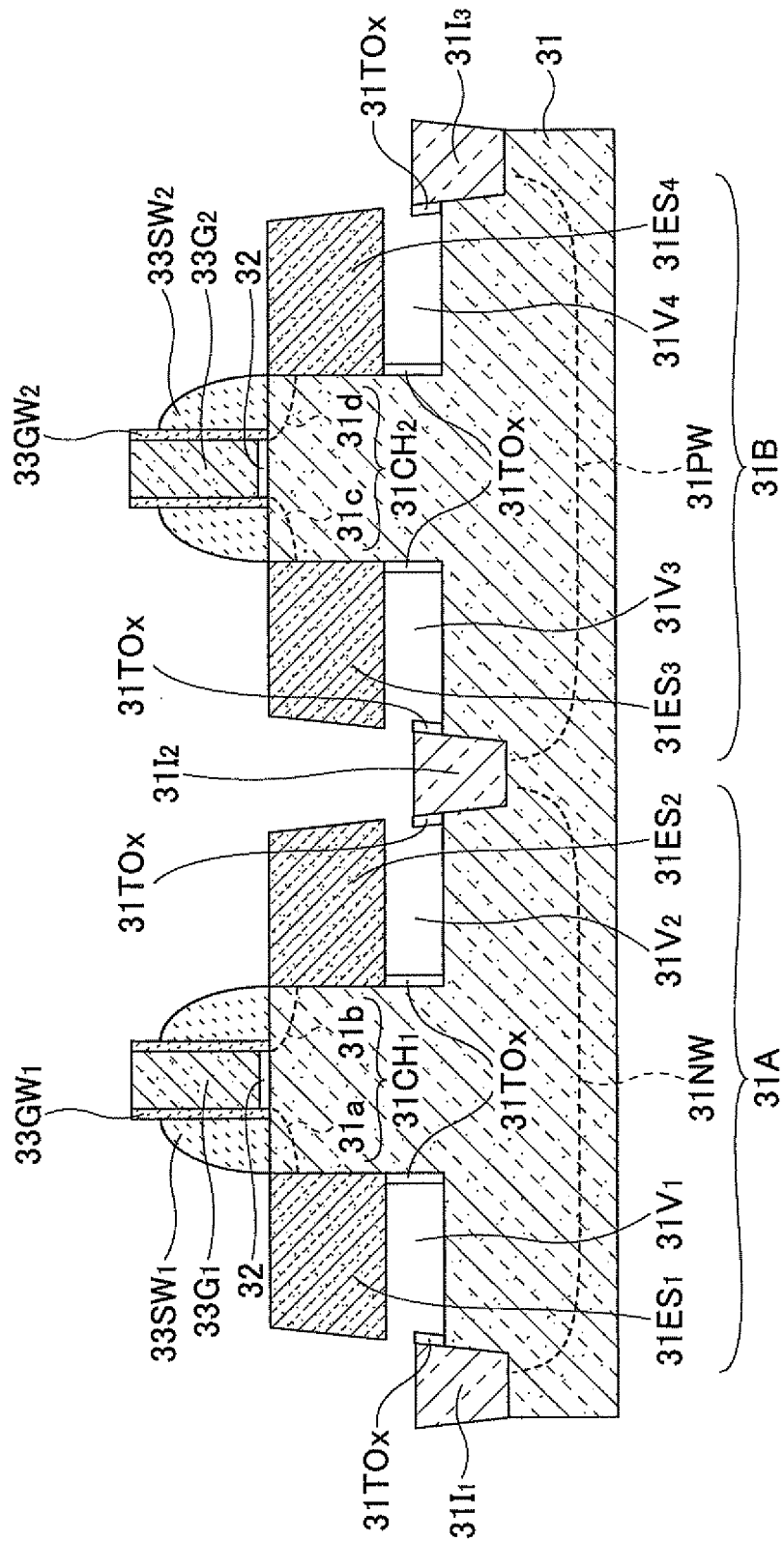
FIG. 3L is a cross-sectional diagram illustrating the method for fabricating the semiconductor device according to the second embodiment.

Next, as illustrated in FIG. 3L, the SiGe mixed crystal layers $31SG_1$, $31SG_2$, $31SG_3$ and $31SG_4$ are selectively etched from the silicon substrate 31 and the silicon epitaxial layers $31ES_1$, $31ES_2$, $31ES_3$ and $31ES_4$ by dry etching utilizing a mixed gas of chlorine ($Cl_2$) and hydrogen, or utilizing a hydrogen chloride gas, by wet etching utilizing a mixed solution of fluorinated acid, nitric acid, acetic acid and the like, or by dry etching utilizing a tetrafluoromethane ($CF_4$) gas diluted by argon (Ar), such that voids $31V_1$ to $31V_4$ are formed in regions corresponding to the SiGe mixed crystal layers $31SG_1$, $31SG_2$, $31SG_3$ and $31SG_4$ of the silicon substrate 31 in a similar manner as in the first embodiment.

Note that in the process of FIG. 3L, as described earlier, the silicon epitaxial layers $31ES_1$ and $31ES_2$ epitaxially lattice match the substrate part $31CH_1$, and the silicon epitaxial layers $31ES_3$ and $31ES_4$ epitaxially lattice match the substrate part $31CH_2$. Accordingly, even if the SiGe mixed crystal layers $31SG_1$, $31SG_2$, $31SG_3$ and $31SG_4$ are selectively removed from the substrate parts $31CH_1$ and $31CH_2$, and the silicon epitaxial layers $31ES_1$, $31ES_2$, $31ES_3$ and $31ES_4$, the silicon epitaxial layers $31ES_1$, $31ES_2$, $31ES_3$ and $31ES_4$ will not fall off of the substrate parts $31CH_1$ or $31CH_2$ of the silicon substrate 31.

Further, if the etching process in FIG. 3L is performed by the dry etching, the process of depressing the device isolation structures $31I_1$ to $31I_3$ by etching illustrated in FIG. 3K may be performed before the deposition of the SiGe mixed crystal layers $31SG_1$, $31SG_2$, $31SG_3$ and $31SG_4$ and the silicon epitaxial layers $31ES_1$, $31ES_2$, $31ES_3$ and $31ES_4$. In this manner, even if the process of depressing the device isolation structures $31I_1$ to $31I_3$ is performed by wet etching, the deposition process of the SiGe mixed crystal layers $31SG_1$, $31SG_2$, $31SG_3$ and $31SG_4$, the deposition process of the silicon epitaxial layers $31ES_1$, $31ES_2$, $31ES_3$ and $31ES_4$, and the selective etching process of FIG. 3L may be continuously performed in the same process device without having to temporarily remove the treating substrate from the process device in the middle of the above processes.

In the second embodiment, the SiGe mixed crystal layers $31SG_1$ to $31SG_4$ may include the atomic fraction of Ge of approximately 20% similar to the first embodiment. However, a large amount of Ge may be contained in the SiGe mixed crystal layers $31SG_1$ to $31SG_4$ within a range of allowing the SiGe mixed crystal layers $31SG_1$ to $31SG_4$ to epitaxially grow on the surface of the silicon substrate 31, such as the SiGe mixed crystal layers $31SG_1$ to $31SG_4$ having the atomic fraction of Ge of approximately 40%. Since the such as the SiGe mixed crystal layers $315G_1$ to $315G_4$ include a high concentration of Ge, the selectivity in the etching process of FIG. 3L may be improved. Further, SiGeC mixed crystal may optionally be utilized as the SiGe mixed crystal layers $31SG_1$ to $31SG_4$.

Figure 3M:
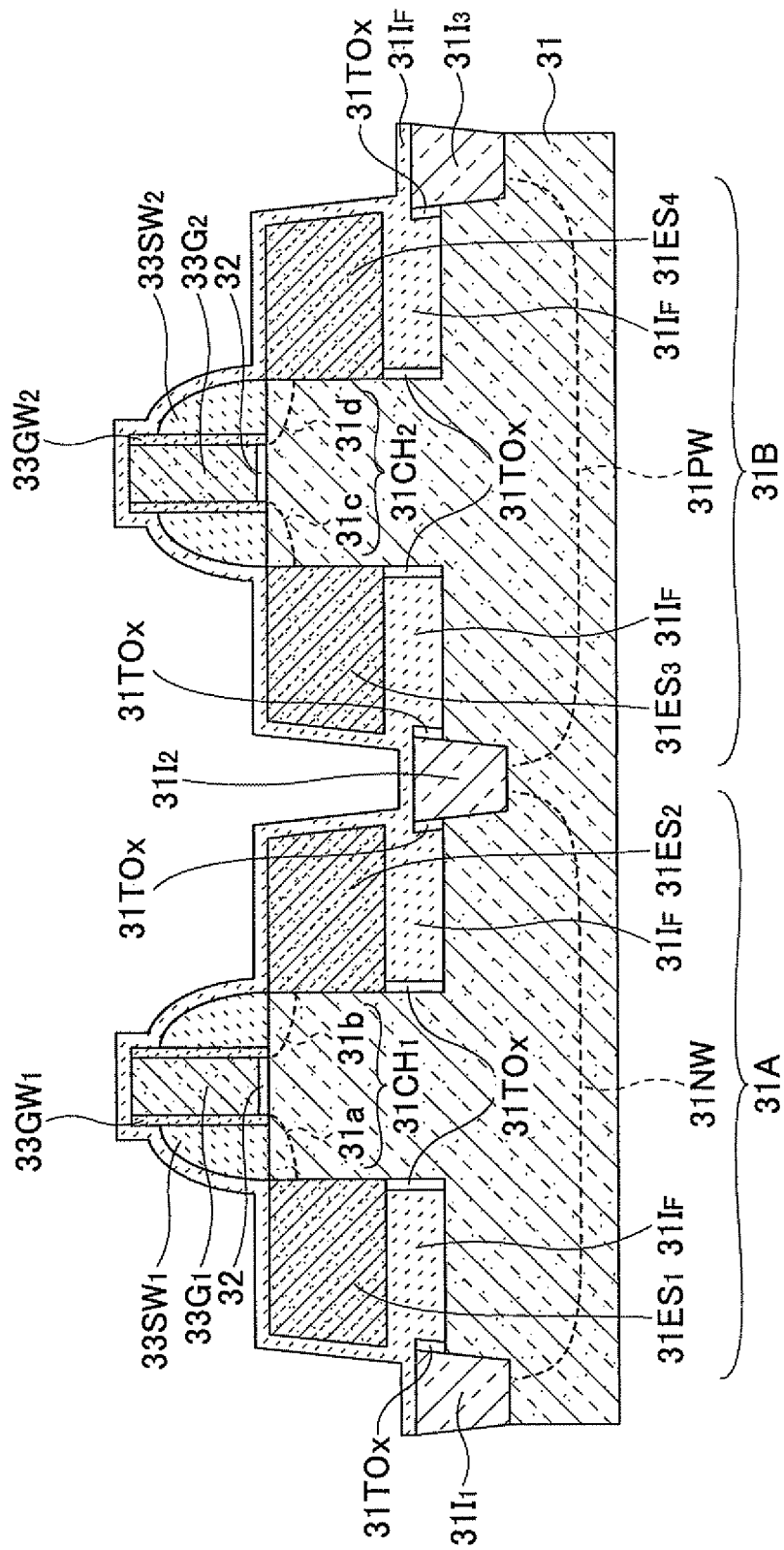
FIG. 3M is a cross-sectional diagram illustrating the method for fabricating the semiconductor device according to the second embodiment.

Next, as illustrated in FIG. 3M, an embedded insulating film $31I_F$ formed of a silicon oxide film or a silicon nitride film as a major component is deposited on the structure obtained in thr process of FIG. 3L by a deposition process exhibiting excellent step coverage, such as the ALD process, the CVD process, or the SOG process, such that the voids $31V_1$ to $31V_4$ are filled with the embedded insulating film $31I_F$. In the example of FIG. 3M, the embedded insulating film $31I_F$ is deposited by the ALD process. In this deposition condition, the ALD process is performed at a temperature range of 300 to 600° C. by utilizing tetradimethylaminosilane (TDMASi) or ozone ($O_3$) as a raw material gas. Alternatively, bis(tertiary-butylamino) silane (BTBAS) or oxygen ($O_2$) may also be utilized as the raw material gas for the ALD process. Note that in the second embodiment, the voids $31V_1$ to $31V_4$ may not have to be completely filled with the embedded insulating film $31I_F$, and the voids $31V_1$ to $31V_4$ filled with the embedded insulating film $31I_F$ may partially have unfilled parts (i.e., spaces).

Next, as illustrated in FIG. 3N, wet etching or dry etching is performed on the structure obtained in FIG. 3M, such that the embedded insulating film $31I_F$ is removed from the surfaces of the silicon epitaxial layers $31ES_1$ to $31ES_4$, the surfaces of the side wall insulating films $33SW_1$ and $33SW_2$, and the exposed surfaces of the gate electrodes $33G_1$ and $33G_2$. As a result of the above etching process of FIG. 3M, trenches $31TI_1$ to $31TI_3$ corresponding to the initial device isolation trenches may be formed corresponding to the device isolation structures $31I_1$ to $31I_3$ on the side surfaces of the silicon epitaxial layers $31ES_1$ to $31ES_4$.

Further, in the process of FIG. 3N, the side wall insulating films $33SW_1$ and $33SW_2$ are depressed by the preceding etching process of FIG. 3L. Accordingly, the side wall insulating films $33SW_1$ and $33SW_2$ are once removed, and new side wall insulating films are formed on the side surfaces of the gate electrodes $33G_1$ and $33G_2$ in the process of FIG. 3O.

Figure 3P:
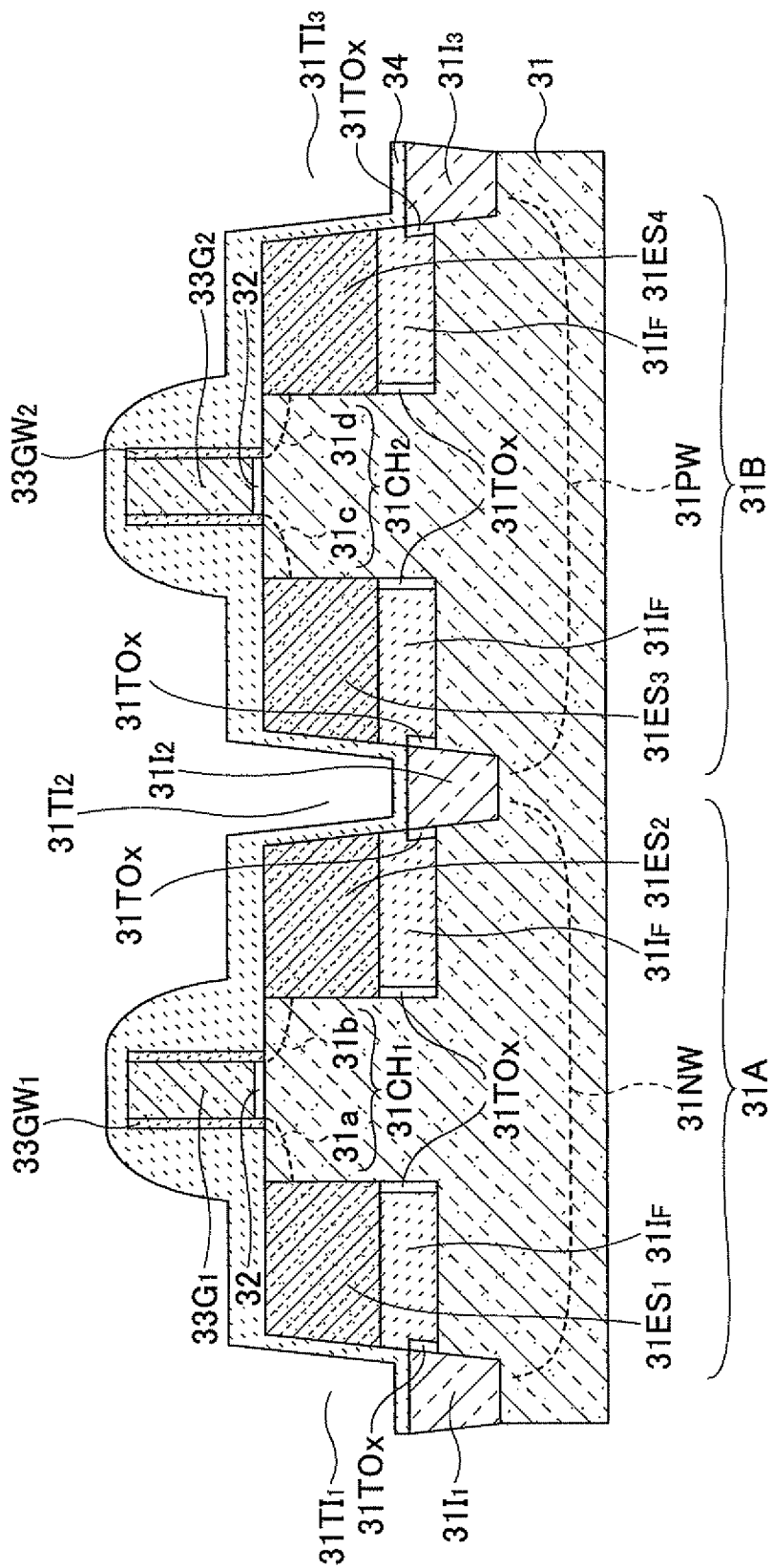
FIG. 3P is a cross-sectional diagram illustrating the method for fabricating the semiconductor device according to the second embodiment.

More specifically, as illustrated in FIG. 3P, an insulating film 34, such as a silicon oxide film, a silicon nitride film, or a layered film composed of the silicon oxide film and the silicon nitride film, is deposited on the obtained structure of FIG. 3O by the CVD process, such that the insulating film 34 matches the base structure. Thereafter, the insulating film 34 is etched back in the process illustrated in FIG. 3Q. As a result, a new side wall insulating film $33SW_3$ is formed on each of the side surfaces of the gate electrode $33G_1$ and similarly, a new side wall insulating film $33SW_4$ is formed on each of the side surfaces of the gate electrode $33G_2$ (see FIG. 34). Note that as illustrated in FIG. 3Q, the insulating film 34 remaines on the side surfaces of the trenches $31I_1$ to $31I_3$.

Figure 3R:
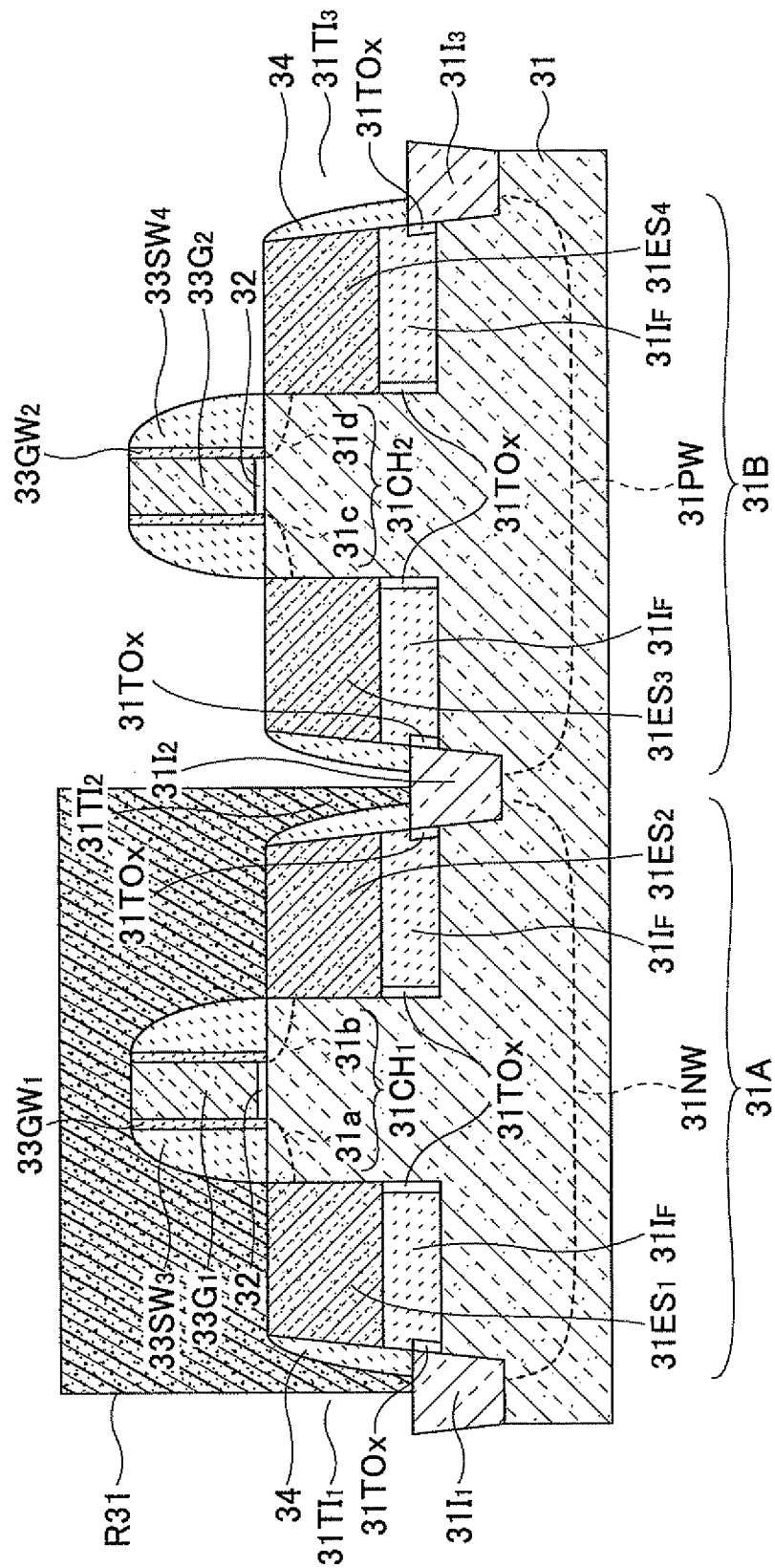
FIG. 3R is a cross-sectional diagram illustrating the method for fabricating the semiconductor device according to the second embodiment.

Next, as illustrated in FIG. 3R, while the device region 31A illustrated in FIG. 3Q is covered (protected) with a resist pattern R31, an n-type impurity element such as As may be doped in the device region 31B by utilizing the gate electrode $33G_2$ and the side wall insulating film $33SW_4$ as a mask at an accelerating energy of 40 keV or lower at a dose range of $5 \times 10^{14}$ to $2 \times 10^{16}$ cm$^{-2}$, or preferably at an accelerating energy of 30 keV at a dose of $2 \times 10^{15}$ cm$^{-2}$. In this case, the ions may be implanted at any tilt and in one or more incident directions (directions of twist), and examples of the ions to be implanted may be one or more types of ions such as As and P. As a result, an n-type source region 31g and an n-type drain region 31h are formed in the silicon epitaxial layers $31ES_3$ and $31ES_4$ at positions deeper than the positions of the source extension region 31c and the drain extension region 31d previously formed in the substrate part $31CH_2$ (see FIG. 3S).

As illustrated in FIG. 3S, while the resist pattern R31 is removed from the device region 31A, the device region 31B illustrated in FIG. 3Q is newly covered (protected) with a resist pattern R32. Further, a p-type impurity element such as B may be doped by utilizing the gate electrode $33G_1$ and the side wall insulating film $33SW_3$ as a mask at an accelerating energy of 7 keV or lower at a dose range of $5 \times 10^{24}$ to $2 \times 10^{26}$ cm$^{-2}$, or preferably at an accelerating energy of 5 keV at a dose of $2 \times 10^{25}$ cm$^{-2}$. In this case, the ions may be implanted at any tilt and in one or more incident directions (directions of twist). Further, examples of the ions to be implanted may be one or more types of other B molecular ions such as B, $BF_2$ and $B_{10}Hx$. As a result, a p-type source region 31e and a p-type drain region 31f are formed in the silicon epitaxial layers $31ES_1$ and $31ES_2$ at positions deeper than the positions of the source extension region 31a and the drain extension region 31b previously formed in the substrate part $31CH_1$.

Figure 3T:
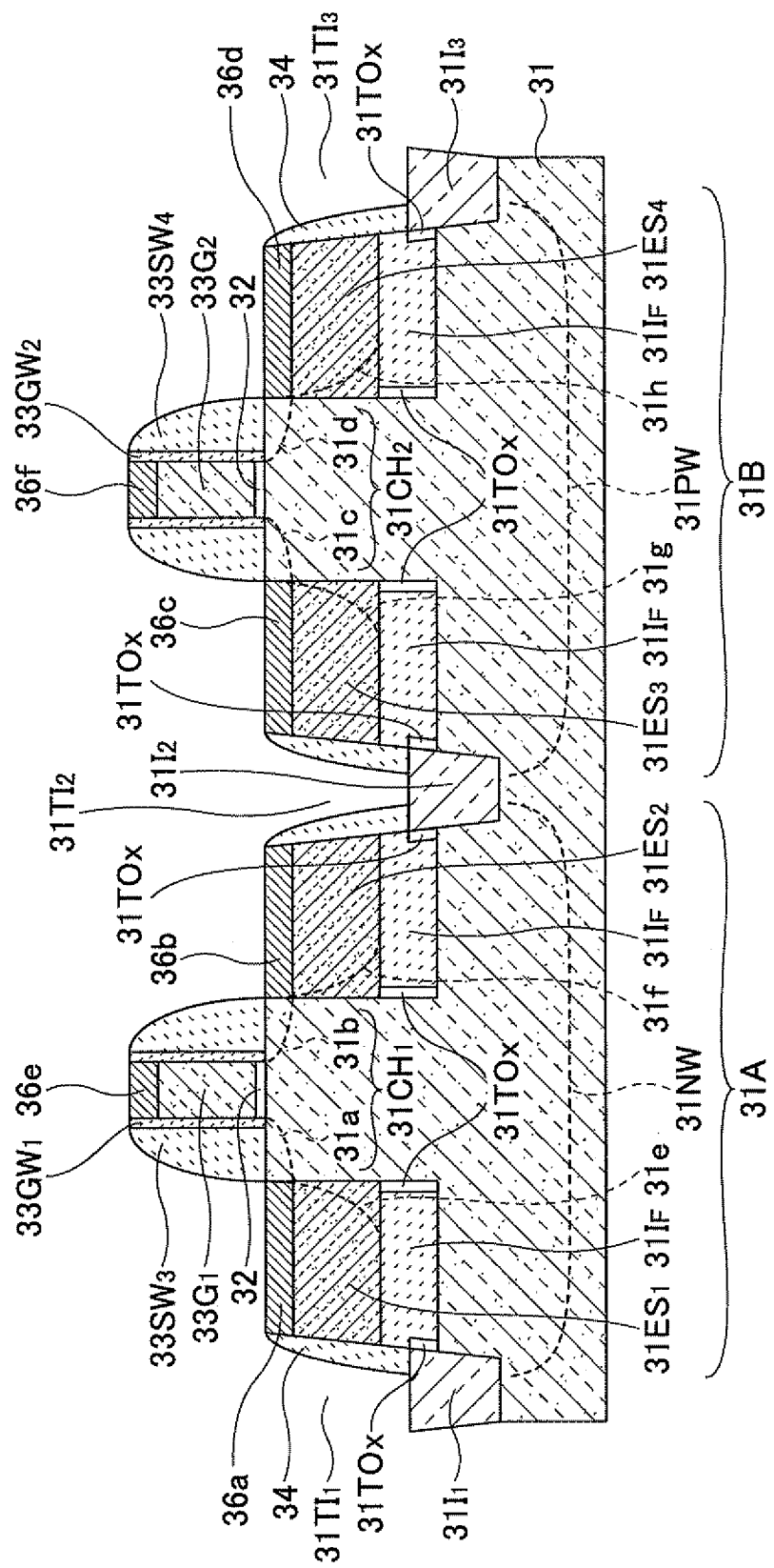
FIG. 3T is a cross-sectional diagram illustrating the method for fabricating the semiconductor device according to the second embodiment.

As illustrated in FIG. 3T, low-resistance silicide layers 36a, 36b, 36c, 36d, 36e and 36f such as NiSi are formed on the exposed surfaces of the silicon epitaxial layers 31ES$_1$ to 31ES$_4$, and the exposed surfaces of the polysilicon gate electrodes 33G$_1$ and 33G$_2$ by a salicide process, or the like.

Alternatively, after the process of 3Q, the remaining insulating film 34 may be removed from the trenches 31TI$_1$ to 31TI$_3$ by wet etching utilizing HF, and the silicide layers may be formed on the obtained structure. As a result, the structure illustrated in FIG. 3U may be obtained. In the structure of FIG. 3U, the silicide layers 36a to 36d are formed such that the silicide layers 36a to 36d respectively cover the side surfaces of the trenches 31TI$_1$ to 31TI$_3$.

Figure 3V:
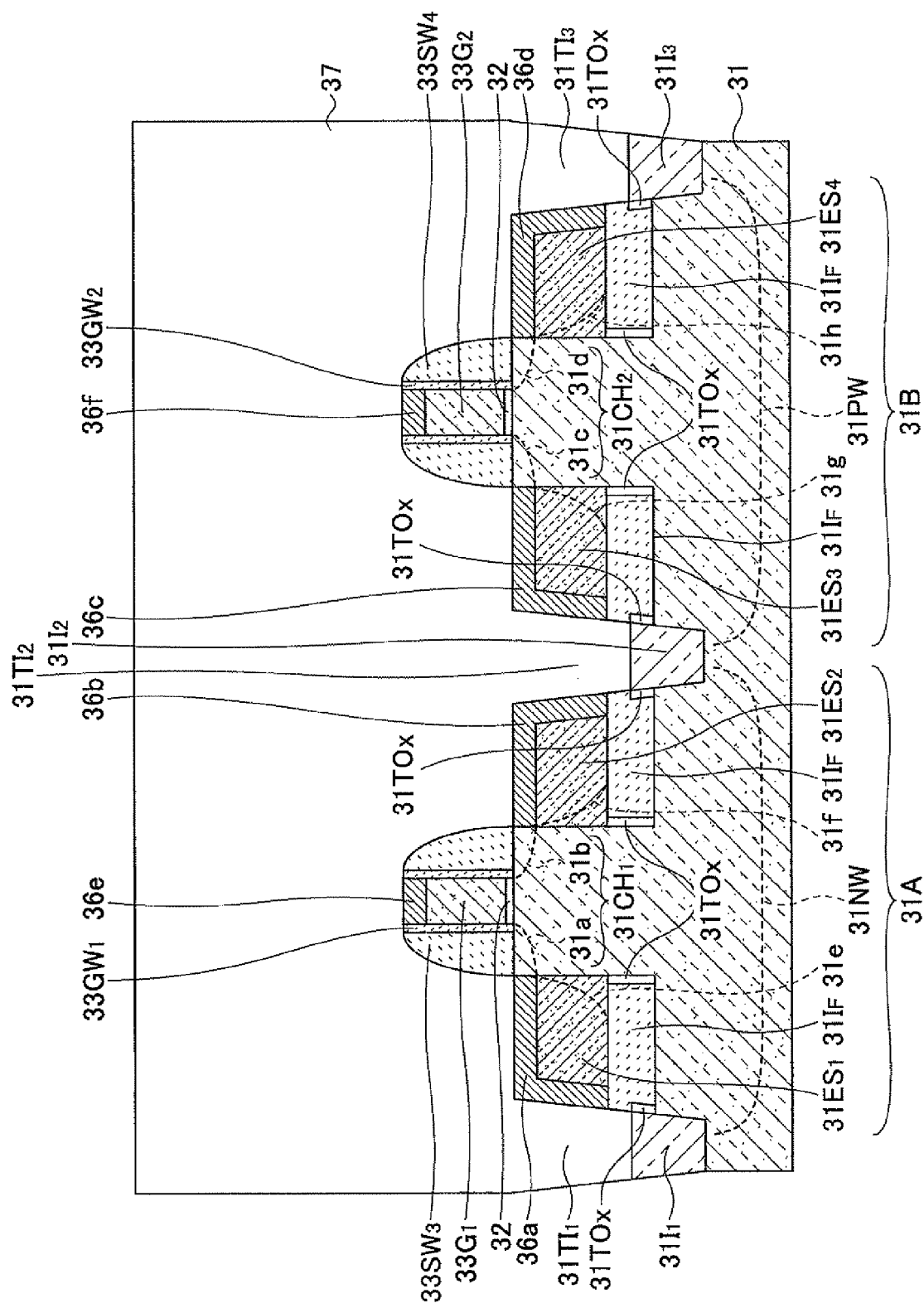
FIG. 3V is a cross-sectional diagram illustrating the method for fabricating the semiconductor device according to the second embodiment.
Figure 3W:
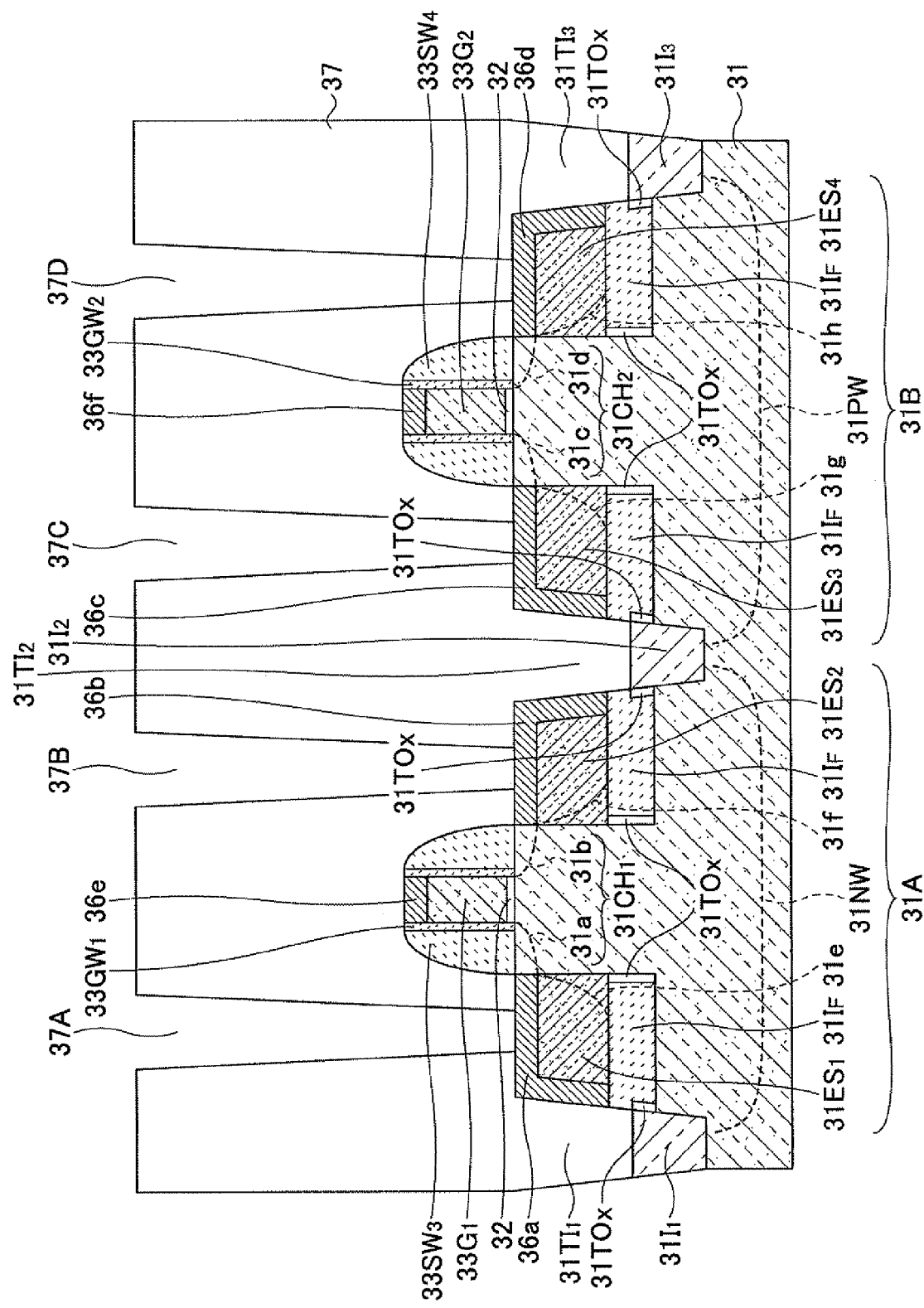
FIG. 3W is a cross-sectional diagram illustrating the method for fabricating the semiconductor device according to the second embodiment.

Further, as illustrated in FIG. 3V, an interlayer insulating film 37 is filled in the trenches 31TI$_1$ to 31TI$_3$ in a similar manner as the process of FIG. 1R. Subsequently, as illustrated in FIG. 3W, via holes 37A to 37D are formed in the interlayer insulating film 37 such that the silicide layers 36a to 36d that cover the p-type source region 31e, the p-type drain region 31f, the n-type source region 31g and the n-type drain region 31h are exposed from the interlayer insulating film 37.

Further, as illustrated in FIG. 3X, via plugs 38A to 38D are respectively formed in the via holes 37A to 37D, such that the via plugs 38A to 38D are brought into contact with the silicide layers 36a to 36d.

As illustrated earlier with reference to FIG. 3L, according to the second embodiment, since the side surfaces of the trenches 31TA$_1$ to 31TA$_3$ are covered with the thin insulating film 31TOx in the process of FIG. 3F, the SiGe mixed crystal layers will not be brought into contact with the side surfaces of the trenches 31TA$_1$ to 31TA$_3$ in the process of FIG. 3H. In the process of FIG. 3J, the silicon epitaxial layers 31ES$_1$ to 31ES$_4$ are epitaxially and directly bonded with the silicon substrate 31 forming the side surfaces of the trenches 31TA$_1$ to 31TA$_4$. That is, the silicon epitaxial layers 31ES$_1$ to 31ES$_4$ are directly bonded with the side surfaces of the trenches 31TA$_1$ to 31TA$_4$ formed of the silicon substrate 31. Accordingly, even if the voids 31V$_1$ to 31V$_4$ are formed by etching of the SiGe mixed crystal layers 31SG$_1$ to 31SG$_4$, the silicon epitaxial layers 31ES$_1$ to 31ES$_4$ will not fall off of the side surfaces of the trenches 31TA$_1$ to 31TA$_4$, which may retain a stable structure of FIG. 3L.

Further, according to the second embodiment, the gate insulating films 32 and the gate electrodes 33G$_1$ and 33G$_2$ are formed on the surface of the bulk silicon substrate 31 having no treatment, such as etching, in the p-channel MOS transistor or the n-channel MOS transistor having the embedded insulating film 31I$_F$ locally formed beneath the source region 31e or 31g and the drain region 31f or 31h. Accordingly, the channel regions immediately beneath the gate electrodes may be flat and no defects may be induced in the channel regions. That is, according to the second embodiment, since the bulk silicon substrate 31 having initial excellent crystalline quality may be utilized as the channel regions, operation properties of the MOS transistors may be improved and variability in the properties may be reduced.

[Third Embodiment]

Figure 4A:
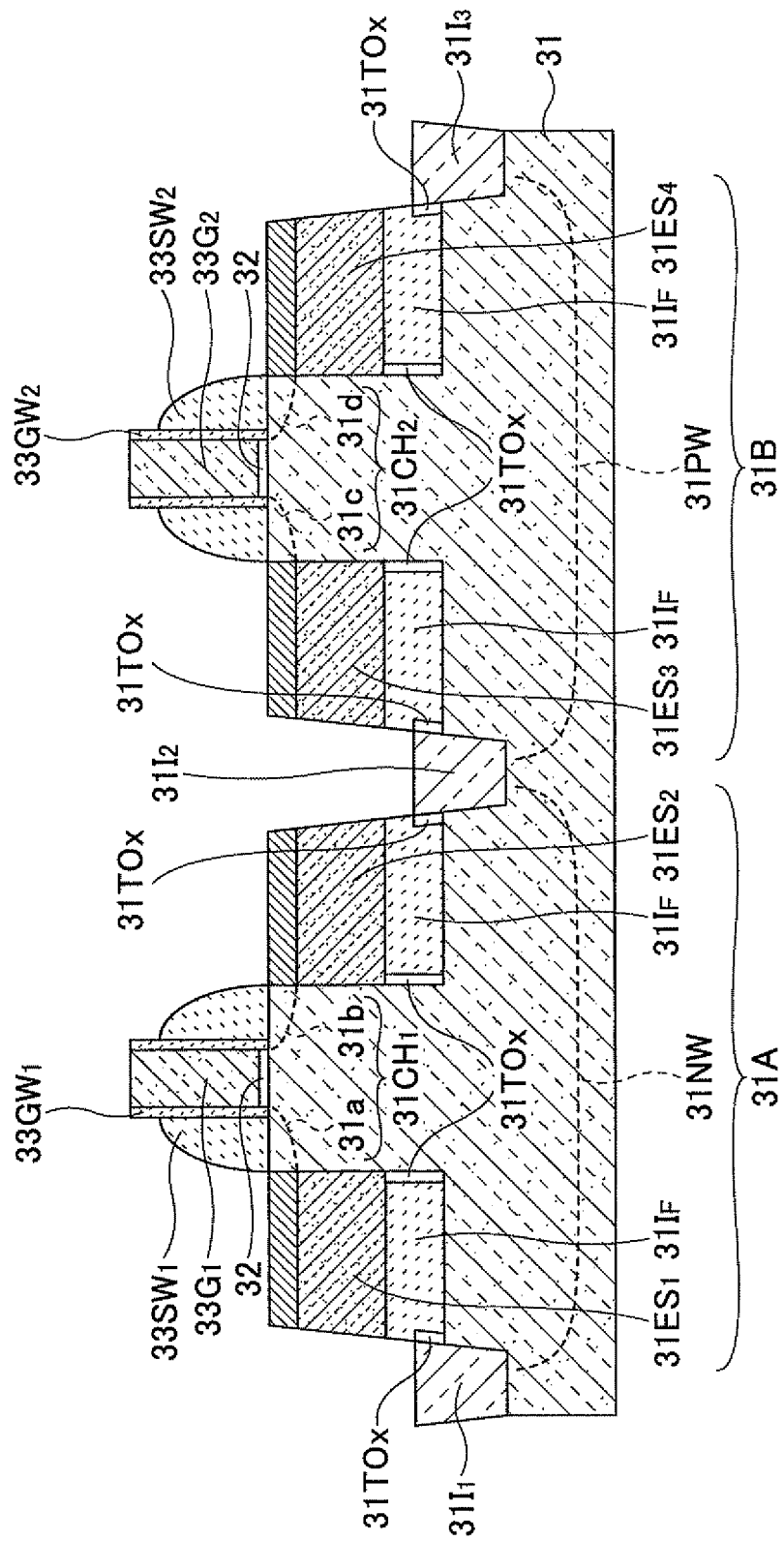
FIG. 4A is a cross-sectional diagram illustrating a method for fabricating a semiconductor device according to a third embodiment.
Figure 4B:
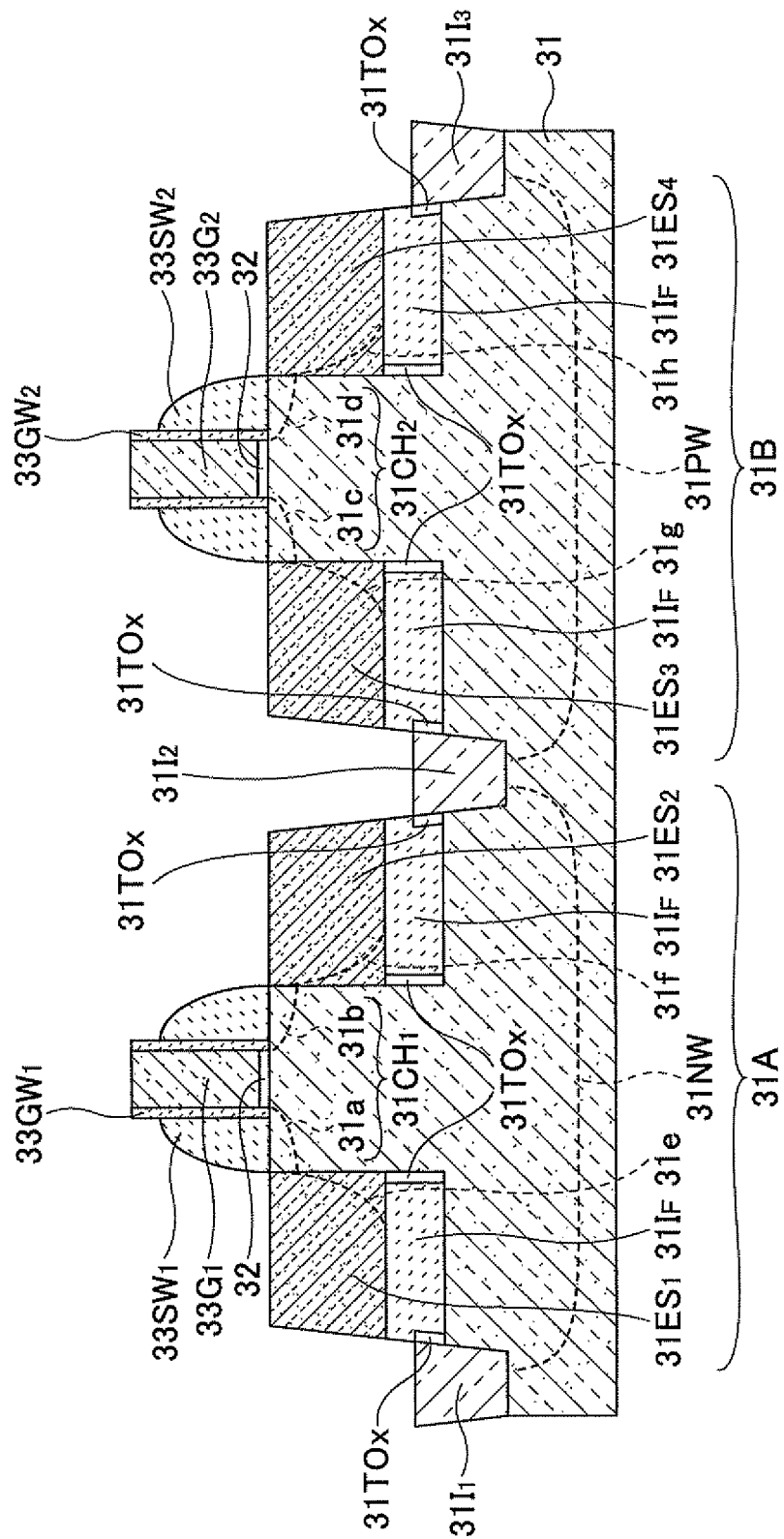
FIG. 4B is a cross-sectional diagram illustrating the method for fabricating the semiconductor device according to the third embodiment.
Figure 4C:
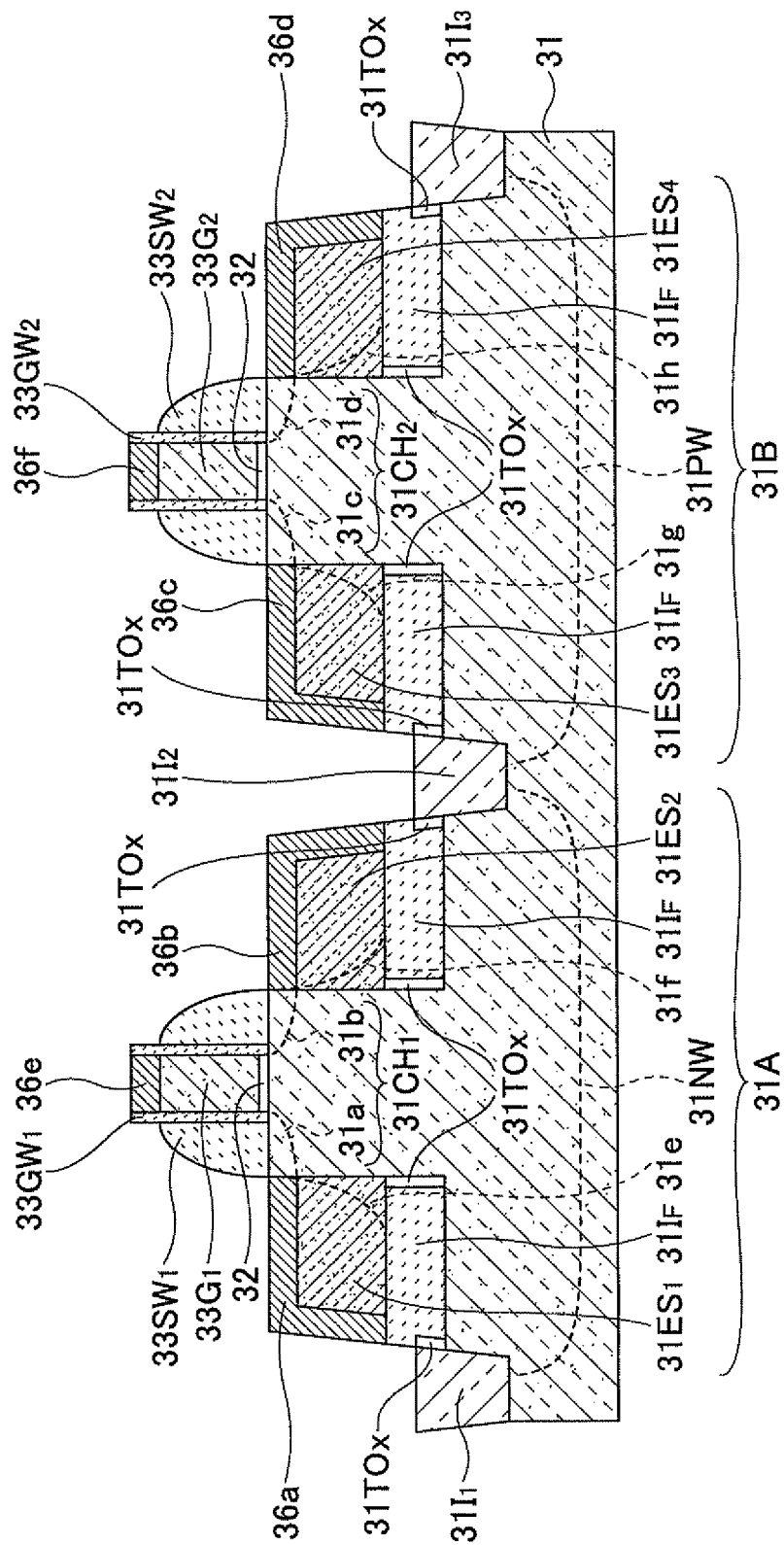
FIG. 4C is a cross-sectional diagram illustrating the method for fabricating the semiconductor device according to the third embodiment.

FIGS. 4A to 4C are diagrams illustrating fabrication processes of a semiconductor device according to a third embodiment subsequent to the process of FIG. 3N, which are implemented as a modification of the second embodiment. Note that in FIGS. 4A to 4C, processes and components similar to those already described will be provided with the same reference numerals and will not be repeatedly described. FIG. 4A illustrates components and processes similar to those of FIG. 3N, and their descriptions are thus omitted.

In the third embodiment, after the process of FIG. 4A, a subsequent process is carried out without removing the side wall insulating films 33SW$_1$ and 33SW$_2$, which differs from the process of FIG. 3O described earlier.

That is, in the process of FIG. 4B, the ion implantation corresponding to the process of FIG. 3O is performed by utilizing the gate electrode 33G$_2$ and the side wall insulating film 33SW$_2$ as a mask, and the ion implantation corresponding to the process of FIG. 3S is performed by utilizing the gate electrode 33G$_1$ and the side wall insulating film 33SW$_1$ as a mask. As a result, an n-type source region 31g and an n-type drain region 31h are formed in the silicon epitaxial layers 31ES$_3$ and 31ES$_4$ and a p-type source region 31e and a p-type drain region 31f are formed in the silicon epitaxial layers 31ES$_1$ and 31ES$_2$. Note that in the process of FIG. 4B, the side wall insulating films 33SW$_1$ and 33SW$_2$ are depressed as a result of the selective etching process of FIG. 3L. Accordingly, the p-type source region 31e and the p-type drain region 31f extend to respective positions corresponding to outer side surfaces of the side wall insulating films 33SW$_1$ in the substrate part 31CH$_1$. Similarly, in the process of FIG. 4B, the n-type source region 31g and the n-type drain region 31h extend to respective positions corresponding to outer side surfaces of the side wall insulating films 33SW$_2$ in the substrate part 31CH$_2$.

Further, as illustrated in FIG. 4C, silicide layers 36a, 36b, 36c, 36d, 36e and 36f are formed on the exposed silicon surfaces of FIG. 4B by a salicide process. Specifically, as previously illustrated earlier in FIG. 3U, the silicide layer 36a is formed on the p-type source region 31e, the silicide layer 36b is formed on the p-type drain region 31f, the silicide layer 36c is formed on the n-type source region 31g, the silicide layer 36d is formed on the n-type drain region 31h, the silicide layer 36e is formed on a top surface of the polysilicon gate electrode 33G$_1$, and the silicide layer 36f is formed on a top surface of the polysilicon gate electrode 33G$_2$.

After the process of FIG. 4C, a semiconductor device having a structure similar to that illustrated in FIG. 3X may be formed on the silicon substrate 11 by performing the processes of FIG. 3V or 3Q to 3X. Note that as illustrated earlier, in the second embodiment, the p-type source region 31e and the p-type drain region 31f extend to the respective positions corresponding to outer side surfaces of the side wall insulating films 33SW$_1$ in the substrate part 31CH$_1$. Similarly, in the process of FIG. 4B, the n-type source region 31g and the n-type drain region 31h extend to the respective positions corresponding to outer side surfaces of the side wall insulating films 33SW$_2$ in the substrate part 31CH$_2$.

In the second embodiment, since the side wall insulating films 33SW$_1$ and 33SW$_2$ are continuously used as the side wall insulating films after the selective etching process of FIG. 3L, the processes of FIGS. 3O to 3Q, and the removing process of the insulating film 34 remaining in the trenches 31TI$_1$ to 31TI$_3$ may not be necessarily carried out, and hence may be omitted. Accordingly, the fabrication processes of the semiconductor device may be simplified.

Figure 5A:
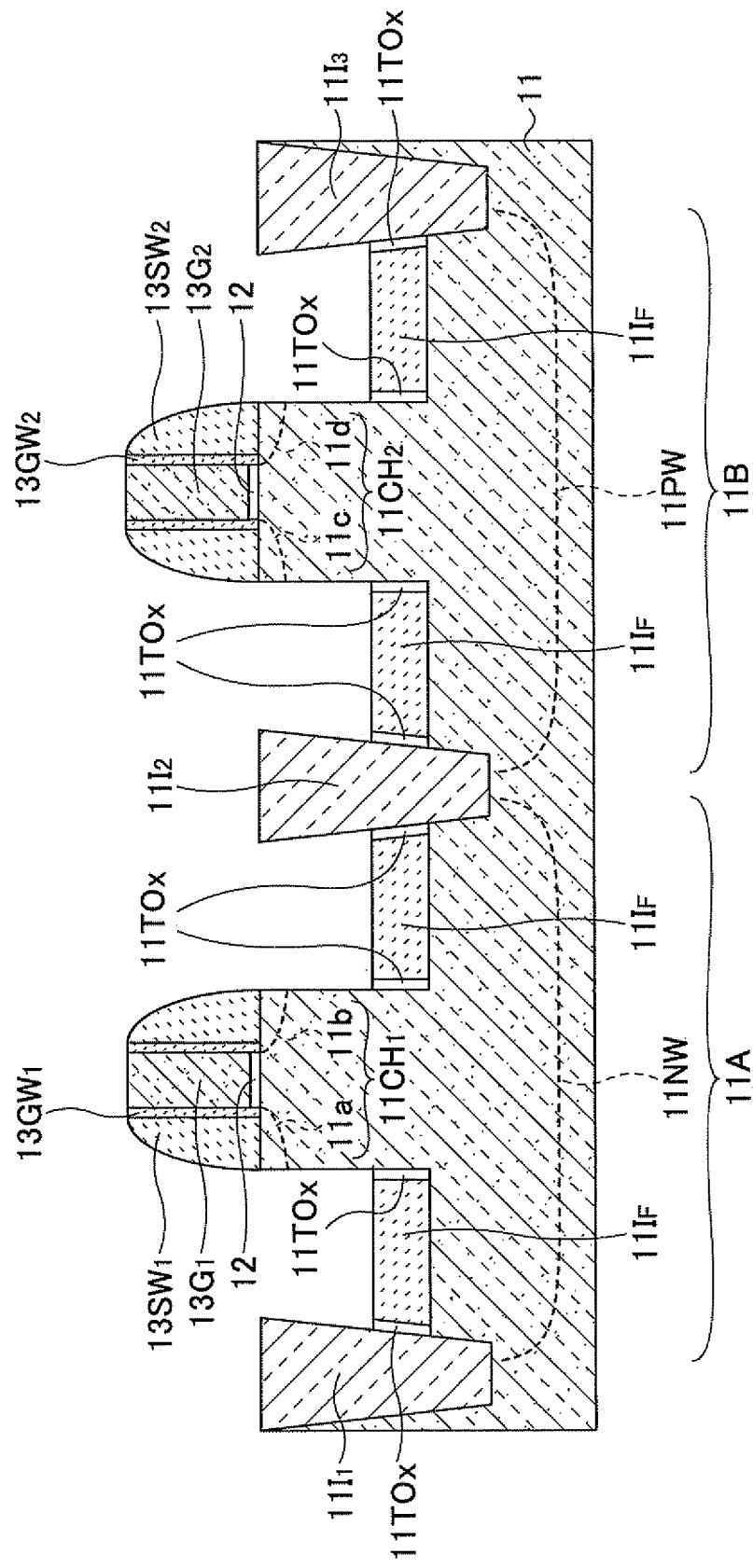
FIG. 5A is a cross-sectional diagram illustrating a method for fabricating a semiconductor device according to a modification of the third embodiment.

Note the in the above embodiments, subsequent to the process of FIG. 1O, the silicon epitaxial layers 11ES$_1$ to 11ES$_4$ may be selectively removed from the embedded insulating film 11I$_F$ beneath the silicon epitaxial layers 11ES$_1$ to 11ES$_4$ by wet etching or dry etching as illustrated in FIG. 5A. Subsequently, in the process of FIG. 5B, SiGe mixed crystal layers 11SGV$_1$ and 11SGV$_2$ may epitaxially grow on the substrate part 11CH$_1$ forming silicon monocrystal such that the SiGe mixed crystal layers 11SGV$_1$ and 11SGV$_2$ are filled in the respective trenches in the device region 11A, and likewise, SiC mixed crystal layers 11SCV$_1$ and 11SCV$_2$ may epitaxially grow on the substrate part $11CH_2$ forming silicon monocrystal such that the SiC mixed crystal layers $11SCV_1$ and $11SCV_2$ are filled in the respective trenches in the device region 11B. Accordingly, uniaxial compressive stress may be induced in a channel region of the p-channel MOS transistor formed in the device region 11A and uniaxial tensile stress may be induced in a channel region of the n-channel MOS transistor formed in the device region 11B. As a result, the operational speeds of the p-channel MOS transistor and the n-channel MOS transistor may be improved.

Figure 5B:
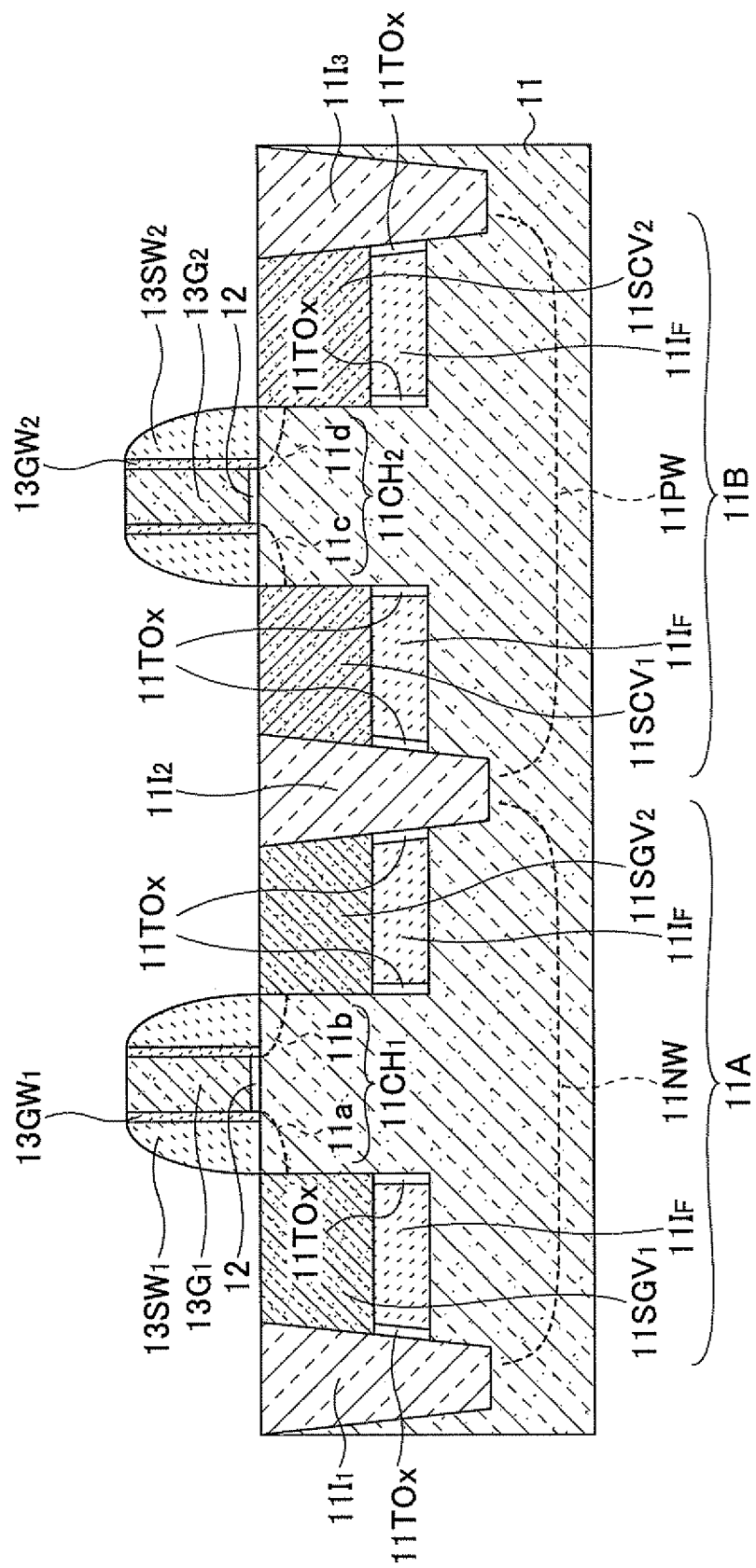
FIG. 5B is a cross-sectional diagram illustrating the method for fabricating the semiconductor device according to the modification of the third embodiment.
Figure 5C:
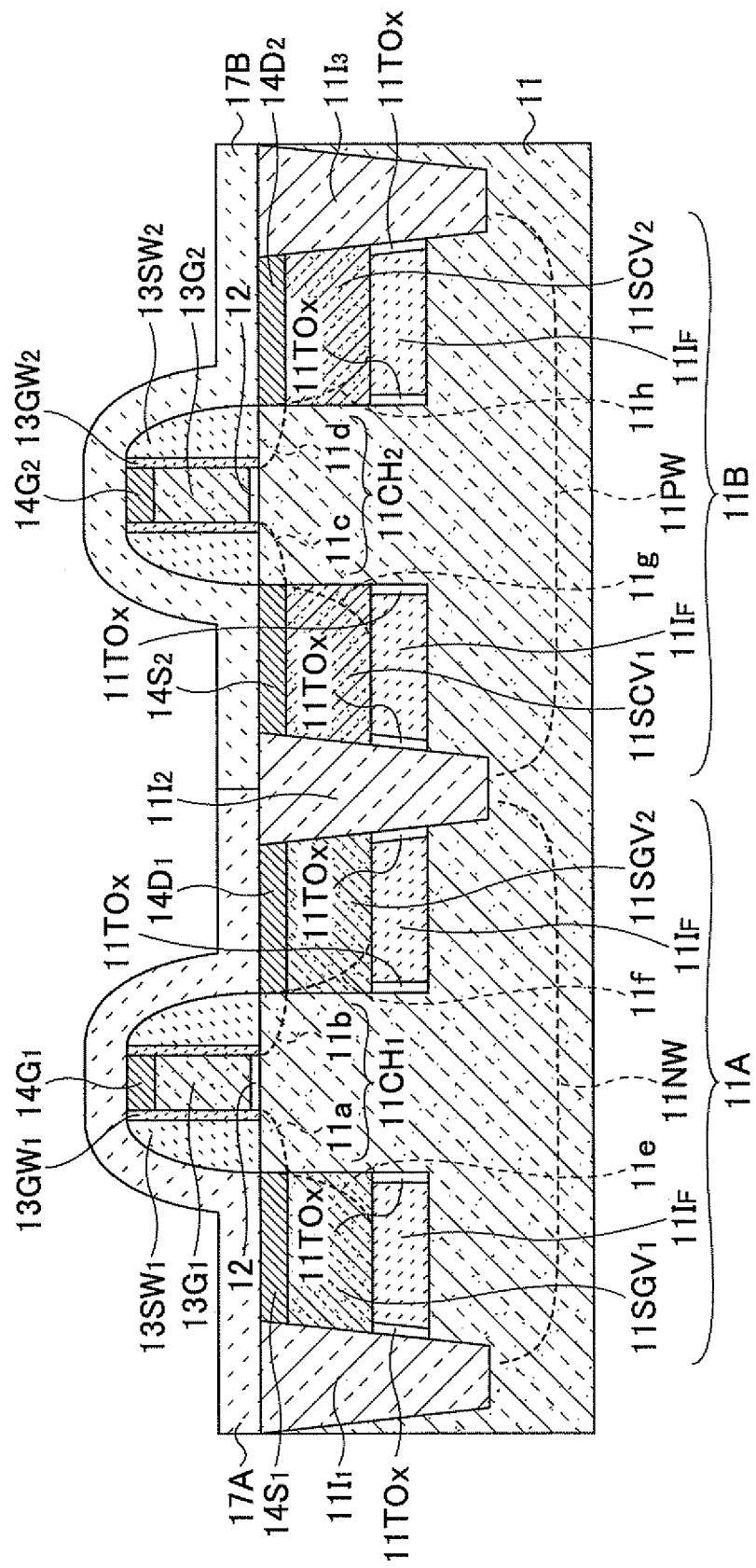
FIG. 5C is a cross-sectional diagram illustrating the method for fabricating the semiconductor device according to the modification of the third embodiment.

In this case, as illustrated in FIG. 5C, after the formation of the p+ source region $11e$ and the p+ drain region $11f$ of the p-channel MOS transistor, the n+ source region $11g$ and the n+ drain region $11h$ of the n-channel MOS transistor, and the silicide layers $14S_1$, $14D_1$, $14S_2$, $14D_2$, $14G_1$ and $14G_2$, a compressive stress film 17A such as SiN is formed such that the compressive stress film 17A covers the gate electrode $13G_1$ and the side wall insulating film $13SW_1$ on the p-channel MOS transistor, and likewise, a compressive stress film 17B such as SiN is formed such that the compressive stress film 17B covers the gate electrode $13G_2$ and the side wall insulating film $13SW_2$ on the n-channel MOS transistor. With this configuration, the uniaxial compressive stress of the p-channel MOS transistor and the uniaxial tensile stress of the n-channel MOS transistor may be increased.

Note that in FIGS. 5A to 5C, processes and components similar to those already described will be provided with the same reference numerals and will not be repeatedly described.

Figure 6B:
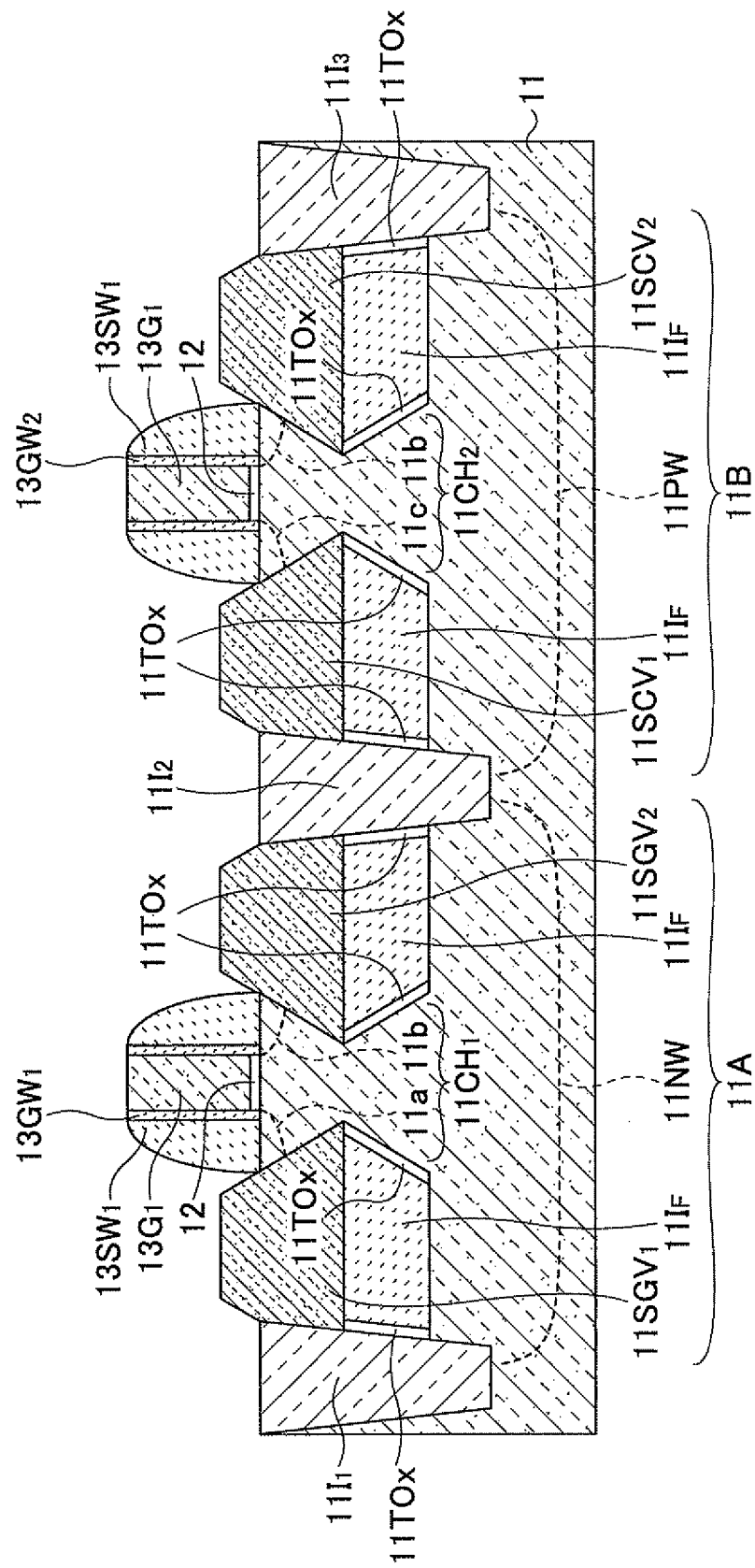
FIG. 6B is a cross-sectional diagram illustrating the method for fabricating the semiconductor device according to the modification of the first embodiment.

Further, in the structure of FIG. 5A, the side surfaces of the trenches $TA_1$ and $TA_2$ (see FIG. 6A) may be formed in a wedge shape such that the side surfaces of the trenches $TA_1$ and $TA_2$ form wedge-shaped recesses in the substrate parts $11CH_1$ and $11CH_2$. In this case, as illustrated in FIG. 6B, if the trenches $TA_1$ and $TA_2$ are filled with the SiGe mixed crystal layers $11SGV_1$ and $11SGV_2$ or the SiC mixed crystal layers $11SCV_1$ and $11SCV_2$ serving as a compressive stress source or a tensile stress source, points of the wedge shaped side surfaces of the trenches $TA_1$ and $TA_2$ interfere with immediate beneath the channel parts of the substrate parts $11CH_1$ and $11CH_2$. As a result, a large amount of tensile stress may be applied to the channels.

In this case, the insulating film $11TOx$ may be initially formed on the wedge shaped side surfaces of the trenches $TA_1$ and $TA_2$. Accordingly, the mechanically unstable structure may be stabilized when the SiGe mixed crystal layers $11SG_1$ to $11SG_3$ are removed in the process similar to the process of FIG. 1I prior to filling the embedded insulating film $11I_F$ in the trenches $TA_1$ and $TA_2$.

Note that in the example of FIG. 6B, the SiGe mixed crystal layers $11SGV_1$ and $11SGV_2$ and the SiC mixed crystal layers $11SCV_1$ and $11SCV_2$ serving as the stress sources are formed at a position higher than an interface between the gate insulating film 12 and the silicon substrate 11. With this configuration, the source resistance may be reduced.

[Fourth Embodiment]

Next, a method for fabricating a semiconductor device according a fourth embodiment is described with reference to FIGS. 7A to 7R. Note that in FIGS. 7A to 7R, processes and components similar to those already described will be provided with the same reference numerals and will not repeatedly described.

As illustrated in FIG. 7A, in the fourth embodiment, the gate electrode pattern $33G_1$ is formed corresponding to the substrate part $31CH_1$ in the device region 31A and the gate electrode pattern $33G_2$ is formed corresponding to the substrate part $31CH_2$ in the device region 31B of the substrate 31 obtained in FIG. 3B. In the substrate part $31CH_1$, the left and right side surfaces of the gate electrode $33G_1$ carry the respective side wall insulating films $33SW_1$ formed of a silicon nitride film via the side wall spacers $31GW_1$ formed of a silicon nitride film. Likewise, in the substrate part $31CH_2$, the left and right side surfaces of the gate electrode $33G_2$ carry the respective side wall insulating films $33SW_2$ formed of a silicon nitride film via the side wall spacers $31GW_2$ formed of a silicon nitride film. Further, the gate electrode $33G_1$ carries a cap layer $33GN_1$ formed of a silicon nitride film and similarly, the gate electrode $33G_2$ carries a cap layer $33GN_2$ formed of a silicon nitride film.

Note that in the fourth embodiment, the source extension region or the drain extension region has been yet to be formed on the substrate part $31CH_1$ or $31CH_2$ in the process of FIG. 7A.

Figure 7B:
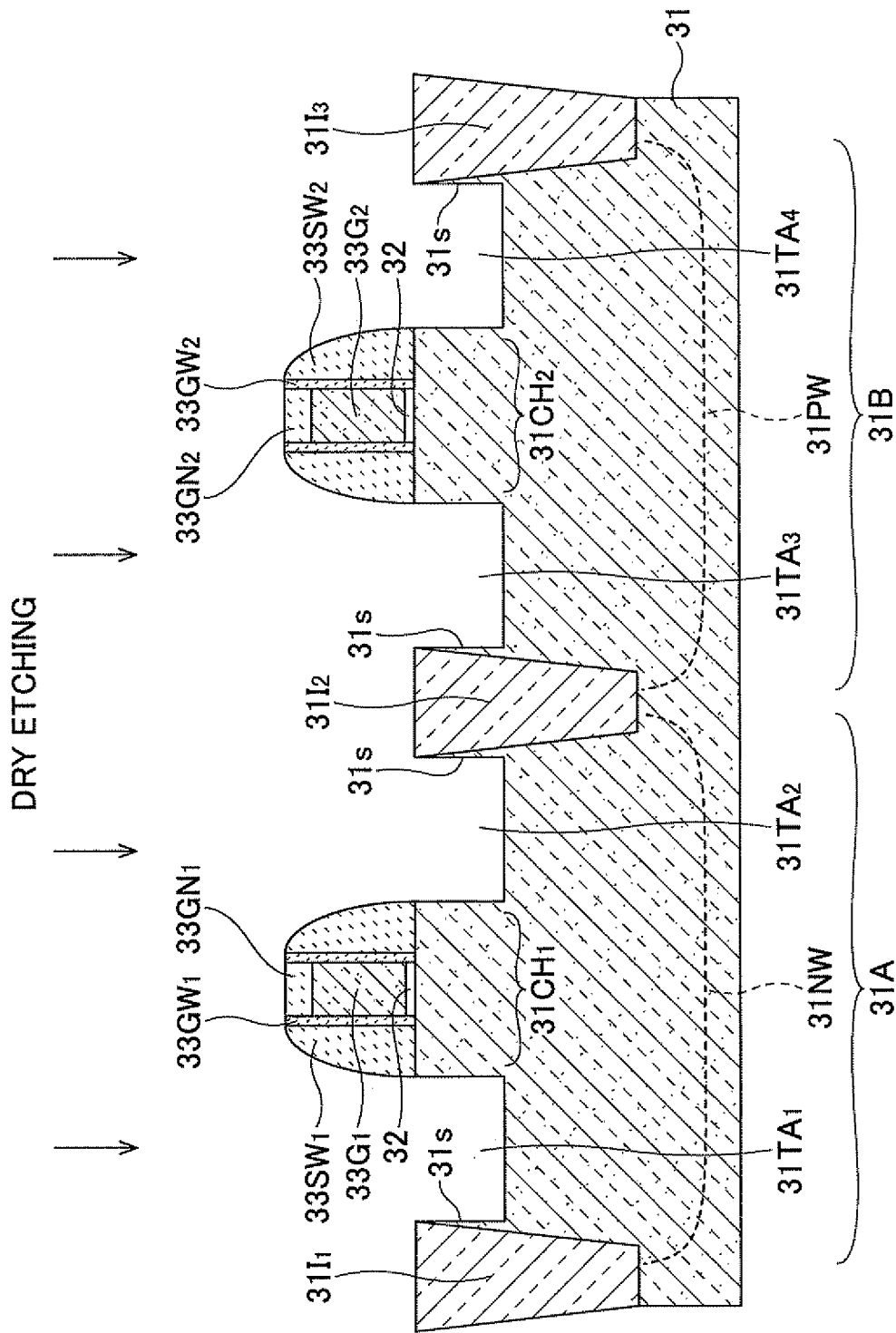
FIG. 7B is a cross-sectional diagram illustrating the method for fabricating the semiconductor device according to the fourth embodiment.

Next, as illustrated in FIG. 7B, in the fourth embodiment, the silicon substrate 31 is dry etched to a depth range of 30 to 50 nm utilizing device isolation structures $31I_1$ to $31I_3$, the side wall insulating films $33SW_1$ and $33SW_2$, the cap layers $33GN_1$ and $33GN_2$ as a mask. As a result, the trenches $31TA_1$ and $31TA_2$ are respectively formed on the left side and right side of the substrate part $31CH_1$, and the trenches $31TA_3$ and $31TA_4$ are respectively formed on the left side and right side of the substrate part $31CH_2$. Note that in the process of FIG. 7B, as a result of dry etching, parts of the silicon substrate 31 may remain as a residue $31s$ in shadowed areas of the trapezoid device isolation regions $31I_1$ to $31I_3$.

Next, as illustrated in FIG. 7C, the structure obtained in FIG. 7B is subject to thermal oxidation or plasma oxidation such that the bottom surfaces and side surfaces of the trenches $31TA_1$ to $31TA_4$ are covered with silicon oxide films $41TOx_1$ to $41TOx_4$ each having a thickness range of, for example, 10 to 15 nm. Such silicon oxide films are also formed on the residues $31s$. Since the source extension region and the drain extension region are yet to be formed on the substrate parts $31CH_1$ and $31CH_2$, the thermal oxidation process performed on the structure of FIG. 7B will not deteriorate the properties of the semiconductor device. Further, the silicon oxide films $41TOx_1$ to $41TOx_4$ may be formed at 600° C. or lower by the plasma oxidation.

Next, as illustrated in FIG. 7D, the silicon oxide films $41TOx_1$ to $41TOx_4$ covering the bottom surfaces of the trenches $31TA_1$ to $31TA_4$ are removed by anisotropic etching that reacts approximately perpendicular to the main surface of the silicon substrate 31. Further, the silicon substrate 31 exposed from the bottom surfaces of the trenches $31TA_1$ to $31TA_4$ is dry etched to a depth range of 30 to 50 nm as illustrated by arrows in FIG. 7D. As described earlier, the silicon oxide films $41TOx_1$ to $41TOx_4$ are formed in a thickness range of 10 to 15 nm. Accordingly, a sufficient thickness of the silicon oxide film may remain on the side surfaces of the trenches $31TA_1$ to $31TA_4$ even if the silicon oxide films are etched by anisotropic etching. The silicon substrate 31 is exposed from the bottom surfaces and the side surfaces of the etched parts in the depth directions by dry etching (indicated by the arrows in FIG. 7D) of the trenches $31TA_1$ to $31TA_4$.

Further, as illustrated in FIG. 7E, the structure obtained in FIG. 7D is subject to isotropic wet etching utilizing tetramethyl ammonium hydroxide (TMAH) as an etchant such that the silicon substrate 31 exposed from the trenches $31TA_1$ to $31TA_4$ is further etched to the depth of approximately 10 nm.

As a result of such an isotropic wet etching, parts of the bottoms of the trenches $31TA_1$ to $31TA_4$, where an impurity element might have been implanted while dry etching, are removed. Accordingly, the silicon surfaces of the initial high quality silicon substrate 31 are exposed. Thus, a subsequently performed epitaxial growth of the SiGe mixed crystal layers may be promoted. In addition, in the process of FIG. 7D, due to the shadowed areas of the trapezoid device isolation regions $31I_1$ to $31I_3$, silicon residues $31t$ may remain at lower parts of the silicon oxide films $41TOx_1$ to $41TOx_4$ corresponding to the residues $31s$. However, such silicon residues $31t$ may be completely removed a result of such an isotropic wet etching. The technical significance of removing the silicon residues $31t$ will be described later in association with the process of FIG. 7K.

Figure 7F:
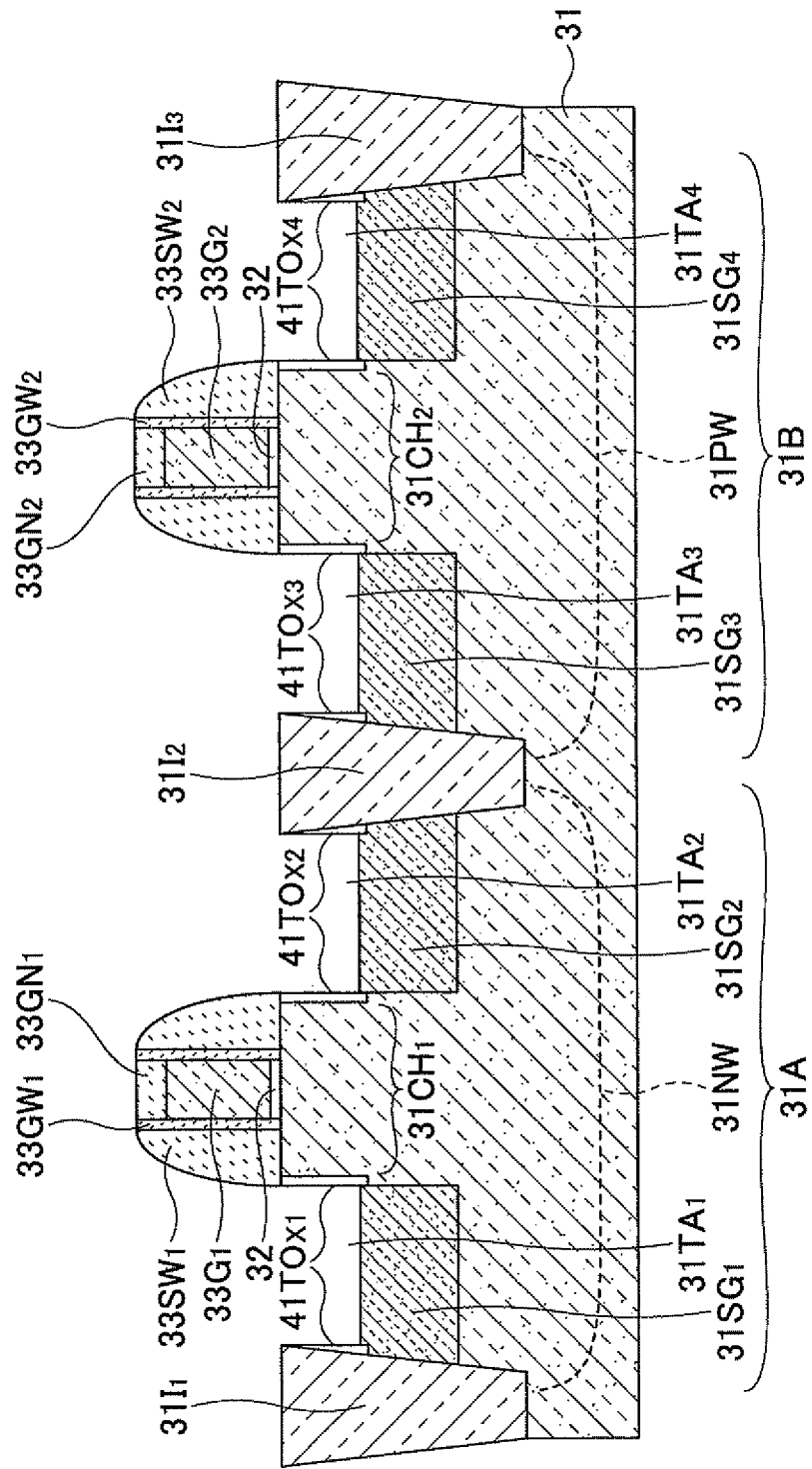
FIG. 7F is a cross-sectional diagram illustrating the method for fabricating the semiconductor device according to the fourth embodiment.

Next, as illustrated in FIG. 7F, the SiGe mixed crystal layer is deposited on the structure obtained in the process of FIG. 7E at a temperature range of 400 to 800° C. or preferably at a substrate temperature range of 500 to 600° C. by the CVD process utilizing a $SiH_4$ gas and a $GeH_4$ gas as a source gas, a HCl gas as an etching gas and a hydrogen gas as a carrier gas. As a result, a SiGe mixed crystal layer $31SG_1$ epitaxially grows on the substrate 31 in the trench $31TA_1$, a SiGe mixed crystal layer $31SG_2$ epitaxially grows on the substrate 31 in the trench $31TA_2$, a SiGe mixed crystal layer $31SG_3$ epitaxially grows on the substrate 31 in the trench $31TA_3$, and a SiGe mixed crystal layer $31SG_4$ epitaxially grows on the substrate 31 in the trench $31TA_4$. The SiGe mixed crystal layers $31SG_1$ to $31SG_4$ are selectively deposited with a film thickness range of 20 to 80 nm corresponding to a desired thickness of the oxide film pattern to be formed beneath the source region and the drain region of the semiconductor device. For example, in the process of FIG. 7F, the SiGe mixed crystal layers $31SG_1$ to $31SG_4$ may be deposited under a pressure range of approximately 30 to 1500 Pa, with the hydrogen gas being set in a partial pressure range of 30 to 1450 Pa, with the $SiH_4$ gas being set in a partial pressure range of 1 to 90 Pa, with the $GeH_4$ gas being set in a partial pressure range of 0.05 to 90 Pa and with the HCl gas being set in a partial pressure range of 1 to 500 Pa.

Next, as illustrated in FIG. 7G, a silicon layer is deposited on the structure obtained in FIG. 7F at a temperature range of 500 to 800° C., or preferably a substrate temperature range of 500 to 600° C. by the CVD process utilizing a $SiH_4$ gas as a source gas, a HCl gas as an etching gas and a hydrogen gas as a carrier gas. As a result, silicon epitaxial layers 31ES are selectively deposited with a film thickness of approximately 7 nm on the SiGe mixed crystal layers $31SG_1$ to $31SG_4$. For example, in the process of FIG. 7G, the silicon epitaxial layers 31ES may be deposited under a pressure range of approximately 30 to 1500 Pa, with the hydrogen gas being set in a partial pressure range of 30 to 1450 Pa, with the $SiH_4$ gas being set in a partial pressure range of 1 to 90 Pa and with the HCl gas being set in a partial pressure range of 1 to 500 Pa.

Figure 7H:
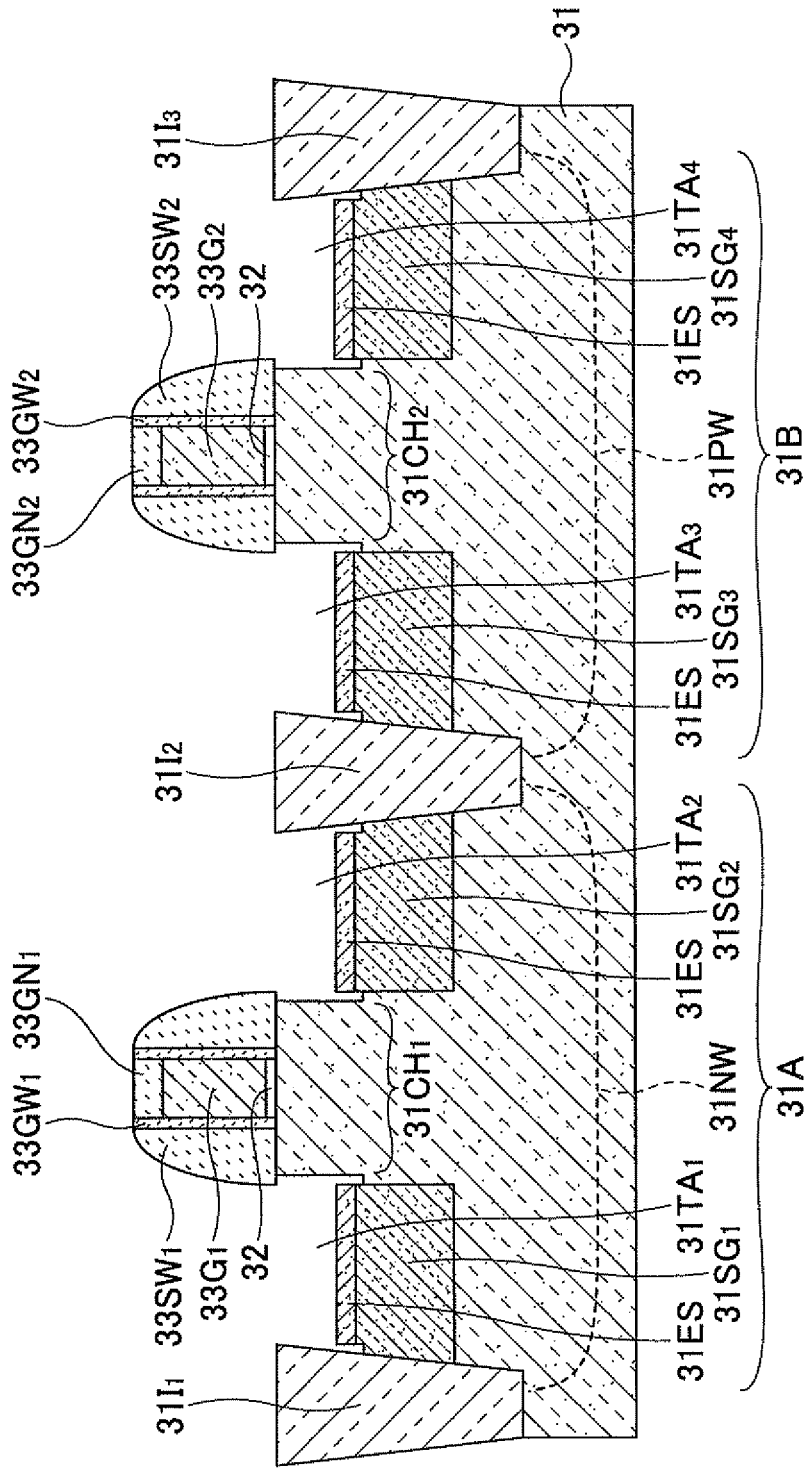
FIG. 7H is a cross-sectional diagram illustrating the method for fabricating the semiconductor device according to the fourth embodiment.

Next, as illustrated in FIG. 7H, the silicon oxide films $41TOx_1$ to $41TOx_4$ formed on the side surfaces of the trenches $31TA_1$ to $31TA_4$ are selectively removed by wet etching utilizing HF. In this case, thin silicon epitaxial layers 31ES are initially formed on the SiGe mixed crystal layers $31SG_1$ to $31SG_4$. In this manner, the exposed areas of the SiGe mixed crystal layers $31SG_1$ to $31SG_4$ may be limited and hence, the fabricating device may be prevented from being contaminated by Ge eluted by wet etching.

Figure 7I:
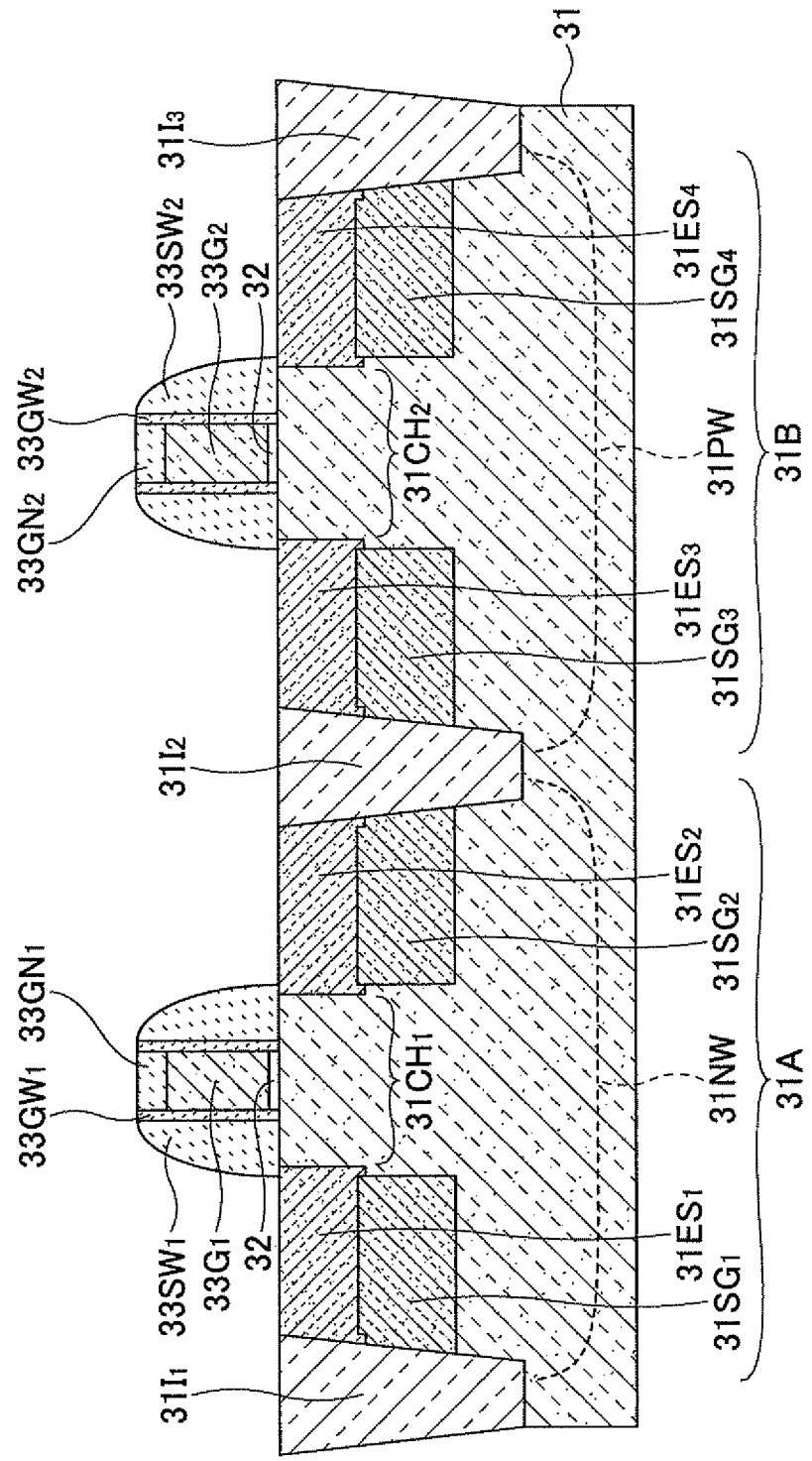
FIG. 7I is a cross-sectional diagram illustrating the method for fabricating the semiconductor device according to the fourth embodiment.

Next, as illustrated in FIG. 7I, the silicon epitaxial layers $31ES_1$ to $31ES_4$ are deposited on the structure obtained in the process of FIG. 7H at a temperature range of 500 to 800° C. or preferably at a substrate temperature range of 700 to 800° C. that is higher than the substrate temperature range for depositing the SiGe mixed crystal layers $31SG_1$ to $31SG_4$ or the silicon epitaxial layers $31ES_1$ to $31ES_4$ by the CVD process utilizing a $SiH_4$ gas as a source gas, a HCl gas as an etching gas and a hydrogen gas as a carrier gas. As a result, a silicon epitaxial layer $31ES_1$ epitaxially grows on the SiGe mixed crystal layers $31SG_1$ in the trench $31TA_1$, a silicon epitaxial layer $31ES_2$ epitaxially grows on the SiGe mixed crystal layers $31SG_2$ in the trench $31TA_2$, a silicon epitaxial layer $31ES_3$ epitaxially grows on the SiGe mixed crystal layers $31SG_3$ in the trench $31TA_3$, and a silicon epitaxial layer $31ES_4$ epitaxially grows on the SiGe mixed crystal layers $31SG_4$ in the trench $31TA_4$. Thus, the silicon epitaxial layer $31ES_1$ to $31ES_4$ epitaxially grow on the silicon epitaxial layers 31ES beneath the silicon epitaxial layer $31ES_1$ to $31ES_4$ so as to fill the trenches $31TA_1$ to $31TA_4$. Since the silicon epitaxial layer $31ES_1$ to $31ES_4$ epitaxially grow on the previously silicon epitaxial layers 31ES that are located beneath the silicon epitaxial layer $31ES_1$ to $31ES_4$, the silicon epitaxial layers 31ES are absorbed by the respective silicon epitaxial layer $31ES_1$ to $31ES_4$ to become uniform silicon epitaxial layer $31ES_1$ to $31ES_4$. Thus formed silicon epitaxial layers $31ES_1$ to $31ES_4$ are epitaxially associated with the SiGe mixed crystal layers $31SG_1$ to $31SG_4$ that are located beneath the silicon epitaxial layers $31ES_1$ to $31ES_4$. For example, in the process of FIG. 7I, the silicon epitaxial layers $31ES_1$ to $31ES_4$ may be deposited under a pressure range of approximately 30 to 1500 Pa, with the hydrogen gas being set in a partial pressure range of 30 to 1450 Pa, with the $SiH_4$ gas being set in a partial pressure range of 1 to 90 Pa and with the HCl gas being set in a partial pressure range of 1 to 500 Pa.

In the fourth embodiment, the surfaces of the SiGe mixed crystal layers $31SG_1$ to $31SG_4$ are covered with the thin silicon epitaxial layers 31ES in the process of FIG. 7G. Accordingly, even if the silicon epitaxial layers $31ES_1$ to $31ES_4$ are thickly deposited at high temperatures in the process of FIG. 7I, the surfaces of the SiGe mixed crystal layers $31SG_1$ to $31SG_4$ may be prevented from being damaged. As a result, the high-quality silicon epitaxial layers $31ES_1$ to $31ES_4$ may be obtained.

Note that in the process of FIG. 7I, the silicon epitaxial layers $31ES_1$ to $31ES_4$ may grow beyond the interface between the silicon substrate 31 and the gate insulating film 32 to thereby form a so-called "elevated source/drain structure".

Figure 7J:
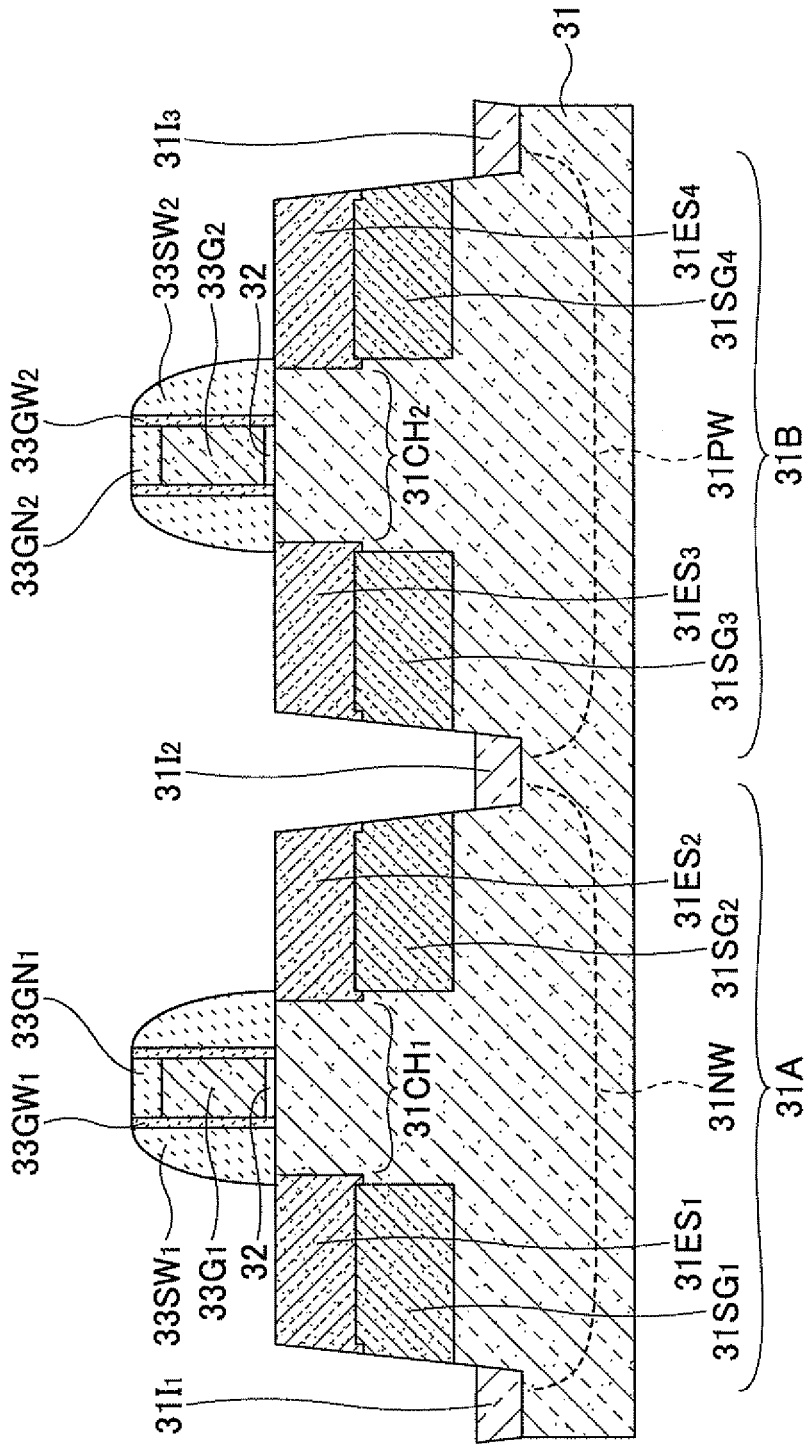
FIG. 7J is a cross-sectional diagram illustrating the method for fabricating the semiconductor device according to the fourth embodiment.

Next, as illustrated in FIG. 7J, device isolation films forming the device isolation structures $31I_1$ to $31I_3$ are depressed by wet etching utilizing fluorinated acid or by dry etching of the silicon oxide film in a similar manner as the process of FIG. 3K. As a result, the side surfaces of the SiGe mixed crystal layers $31SG_1$, $31SG_2$, $31SG_3$ and $31SG_4$ are exposed.

Note that in the process of FIG. 7J, the device isolation films forming the device isolation structures $31I_1$ to $31I_3$ may be depressed in advance, and then the SiGe mixed crystal layers $31SG_1$, $31SG_2$, $31SG_3$ and $31SG_4$, and the silicon epitaxial layers $31ES_1$, $31ES_2$, $31ES_3$ and $31ES_4$ may epitaxially grow thereafter.

Note that in the structure obtained in the process of FIG. 7J, the side surfaces of the SiGe mixed crystal layers $31SG_1$, $31SG_2$, $31SG_3$ and $31SG_4$, or the side surfaces of the silicon epitaxial layers $31ES_1$, $31ES_2$, $31ES_3$ and $31ES_4$ may be formed of a single crystalline plane or plural crystalline planes.

Figure 7K:
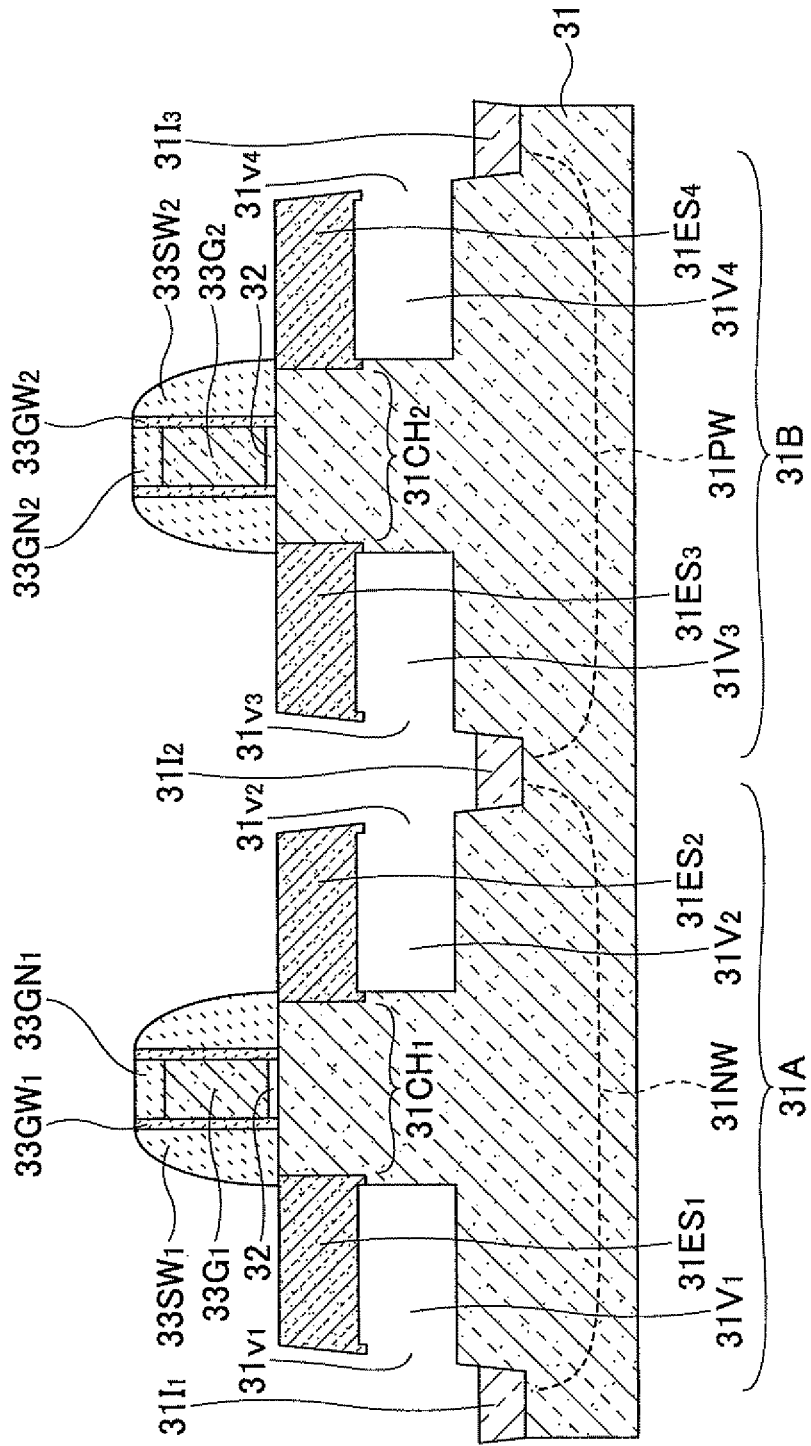
FIG. 7K is a cross-sectional diagram illustrating the method for fabricating the semiconductor device according to the fourth embodiment.

Next, as illustrated in FIG. 7K, the SiGe mixed crystal layers $31SG_1$, $31SG_2$, $31SG_3$ and $31SG_4$ are selectively etched from the silicon substrate 31 and the silicon epitaxial layers $31ES_1$, $31ES_2$, $31ES_3$ and $31ES_4$ by dry etching utilizing a mixed gas of chlorine ($Cl_2$) and hydrogen, or utilizing a hydrogen chloride gas, by wet etching utilizing a mixed solution of fluorinated acid, nitric acid, acetic acid and the like, or by dry etching utilizing a tetrafluoromethane ($CF_4$) gas diluted by argon (Ar). Accordingly, voids $31V_1$ to $31V_4$ are formed in the regions corresponding to the SiGe mixed crystal layers $31SG_1$, $31SG_2$, $31SG_3$ and $31SG_4$ of the silicon substrate 31 in a similar manner as in the process of FIG. 3K.

Note that in the process of FIG. 7K, as described earlier, the silicon epitaxial layers $31ES_1$ and $31ES_2$ epitaxially lattice match the substrate part $31CH_1$, and the silicon epitaxial layers $31ES_3$ and $31ES_4$ epitaxially lattice match the substrate part $31CH_2$. Accordingly, even if the SiGe mixed crystal layers $31SG_1$, $31SG_2$, $31SG_3$ and $31SG_4$ are selectively removed from the corresponding substrate parts $31CH_1$ and $31CH_2$, and the silicon epitaxial layers $31ES_1$, $31ES_2$, $31ES_3$ and $31ES_4$, the silicon epitaxial layers $31ES_1$, $31ES_2$, $31ES_3$ and $31ES_4$ will not fall off of the corresponding substrate parts $31CH_1$ or $31CH_2$ of the silicon substrate 31.

Further, if the etching process in FIG. 7K is performed by the dry etching, the device isolation structures $31I_1$ to $31I_3$ may be depressed by etching before the deposition of the SiGe mixed crystal layers $31SG_1$, $31SG_2$, $31SG_3$ and $31SG_4$ and the silicon epitaxial layers $31ES_1$, $31ES_2$, $31ES_3$ and $31ES_4$. In this manner, even if the device isolation structures $31I_1$ to $31I_3$ are depressed by wet etching, the deposition process of the SiGe mixed crystal layers $31SG_1$, $31SG_2$, $31SG_3$ and $31SG_4$, the deposition process of the silicon epitaxial layers $31ES_1$, $31ES_2$, $31ES_3$ and $31ES_4$, and the selective etching process of FIG. 7K may be continuously performed in the same process device without having to temporarily remove the treating substrate from the process device in the middle of the above processes.

In the fourth embodiment, the SiGe mixed crystal layers $31SG_1$ to $31SG_4$ may include the atomic fraction of Ge of approximately 20% similar to the first embodiment. However, a large amount of Ge may be contained in the SiGe mixed crystal layers $31SG_1$ to $31SG_4$ within a range of allowing the SiGe mixed crystal layers $31SG_1$ to $31SG_4$ to epitaxially grow on the surface of the silicon substrate 31, such as the SiGe mixed crystal layers $31SG_1$ to $31SG_4$ having the atomic fraction of Ge of approximately 40%. Thus, the selectivity in the etching process of FIG. 7K may be improved by utilizing SiGe mixed crystal a high concentration of Ge as the SiGe mixed crystal layers $31SG_1$ to $31SG_4$. Further, SiGeC mixed crystal may optionally be utilized as the SiGe mixed crystal layers $31SG_1$ to $31SG_4$.

In the fourth embodiment, as described earlier, the silicon residues $31t$ (see FIG. 7D) formed of the side surfaces of the trenches $31TA_1$ to $31TA_4$ in contact with the trapezoid device isolation regions $31I_1$ to $31I_3$ are selectively removed by wet etching in the process of FIG. 7E. As a result of having removed the silicon residues $31t$ in this manner, openings (i.e., voids) $31v_1$ to $31v_4$ of the voids $31V_1$ to $31V_4$ will not be blocked by the silicon residues $31t$ when the SiGe mixed crystal layer $31SG_1$ to $31SG_4$ are removed in the process of FIG. 7K. Accordingly, the SiGe mixed crystal layer $31SG_1$ to $31SG_4$ may be efficiently etched.

Figure 7L:
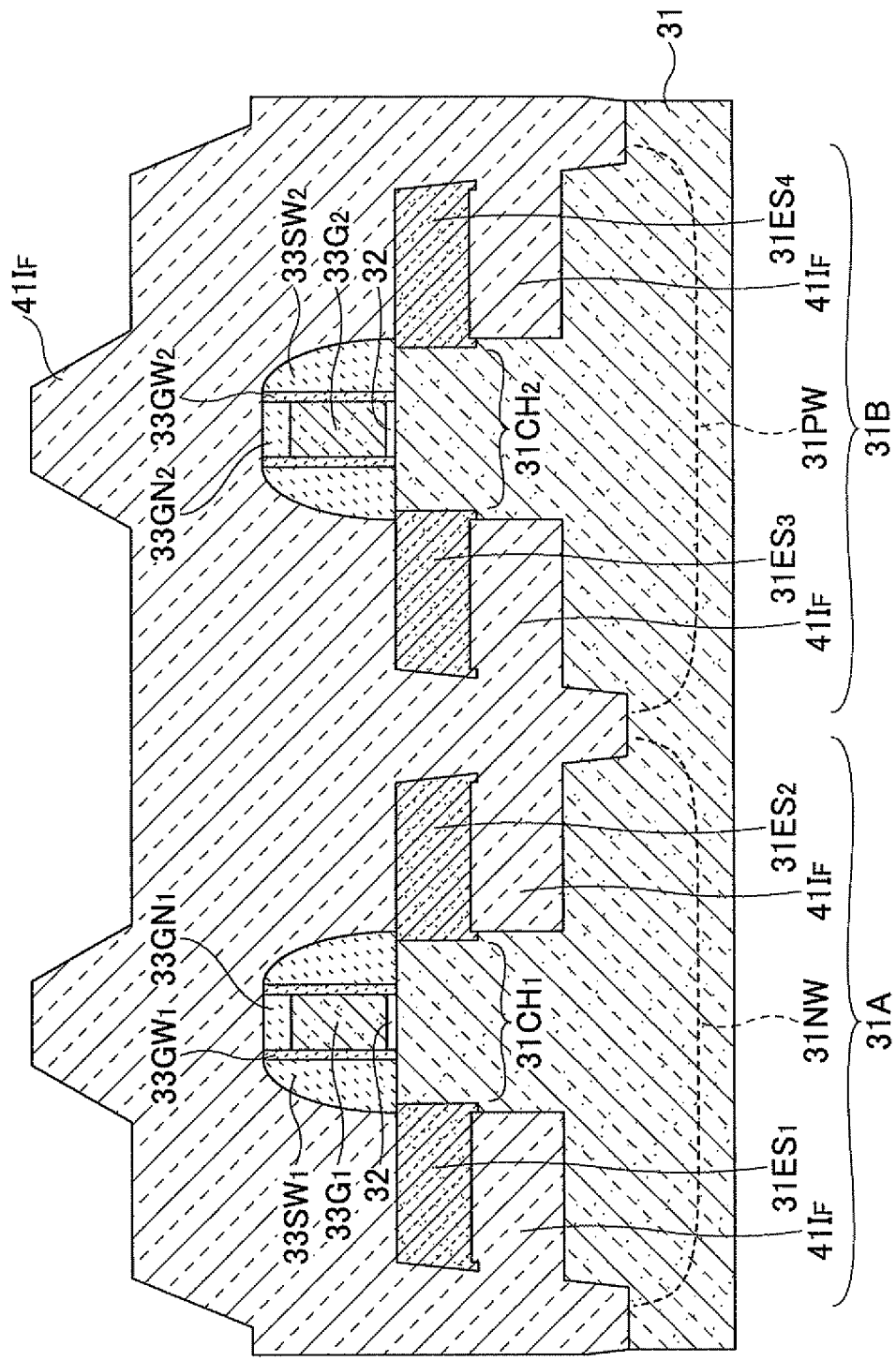
FIG. 7L is a cross-sectional diagram illustrating the method for fabricating the semiconductor device according to the fourth embodiment.

Next, as illustrated in FIG. 7L, an embedded insulating film $41I_E$ formed of a silicon oxide film or a silicon nitride film as a major component is deposited on the structure obtained in the process of FIG. 7K by a deposition process exhibiting excellent step coverage, such as the ALD process, the CVD process, or the SOG process. Accordingly, the voids $31V_1$ to $31V_4$ are filled with embedded insulating film $41I_E$. In the example of FIG. 7L, the embedded insulating film $41I_E$ is deposited by a high density plasma-CVD (HDP-CVD) process. Note that in the fourth embodiment, the voids $31V_1$ to $31V_4$ may not have to be completely filled with the embedded insulating film $41I_E$, and the voids $31V_1$ to $31V_4$ filled with the embedded insulating film $41I_F$ may partially have unfilled parts (i.e., spaces).

Figure 7M:
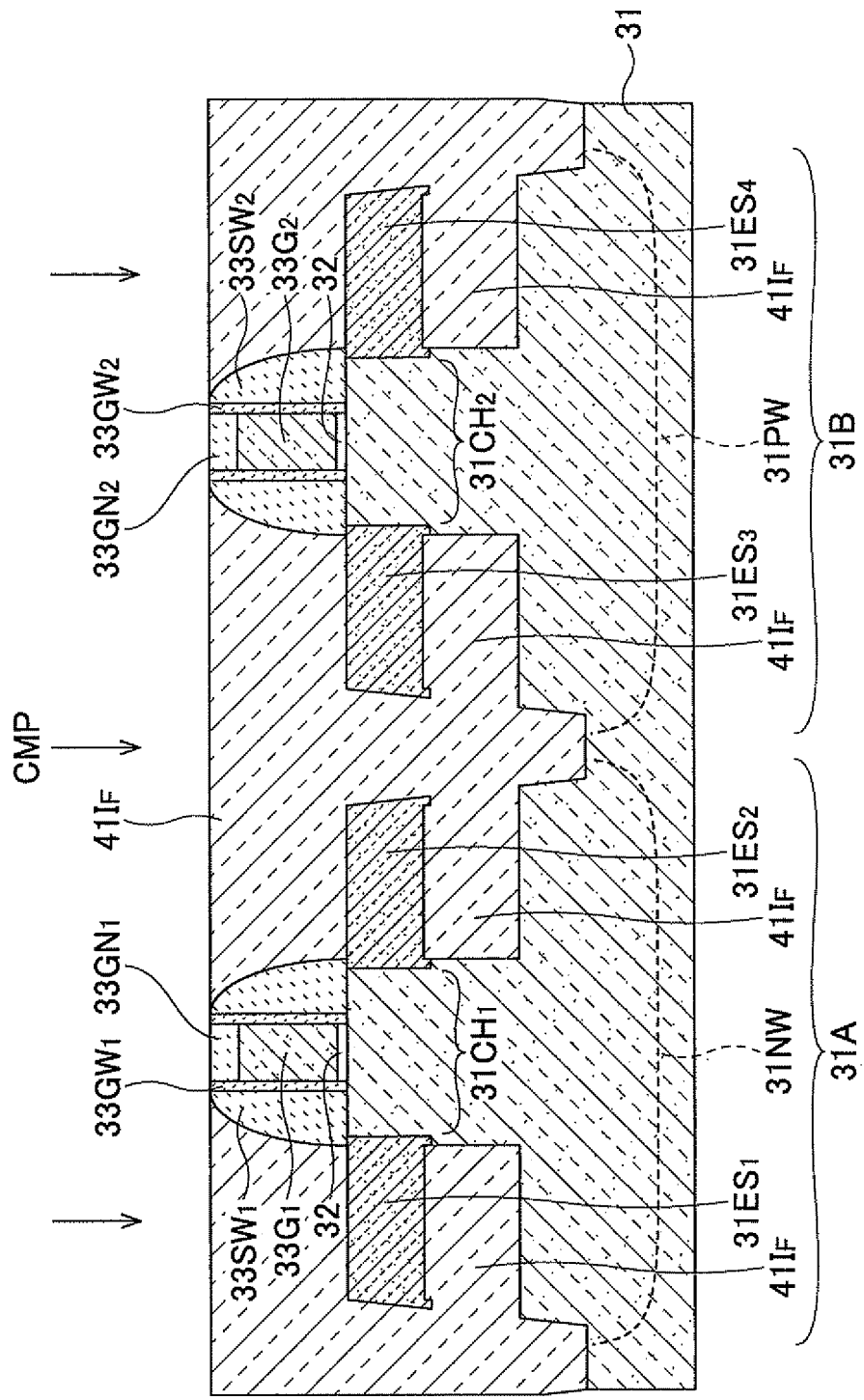
FIG. 7M is a cross-sectional diagram illustrating the method for fabricating the semiconductor device according to the fourth embodiment.
Figure 7N:
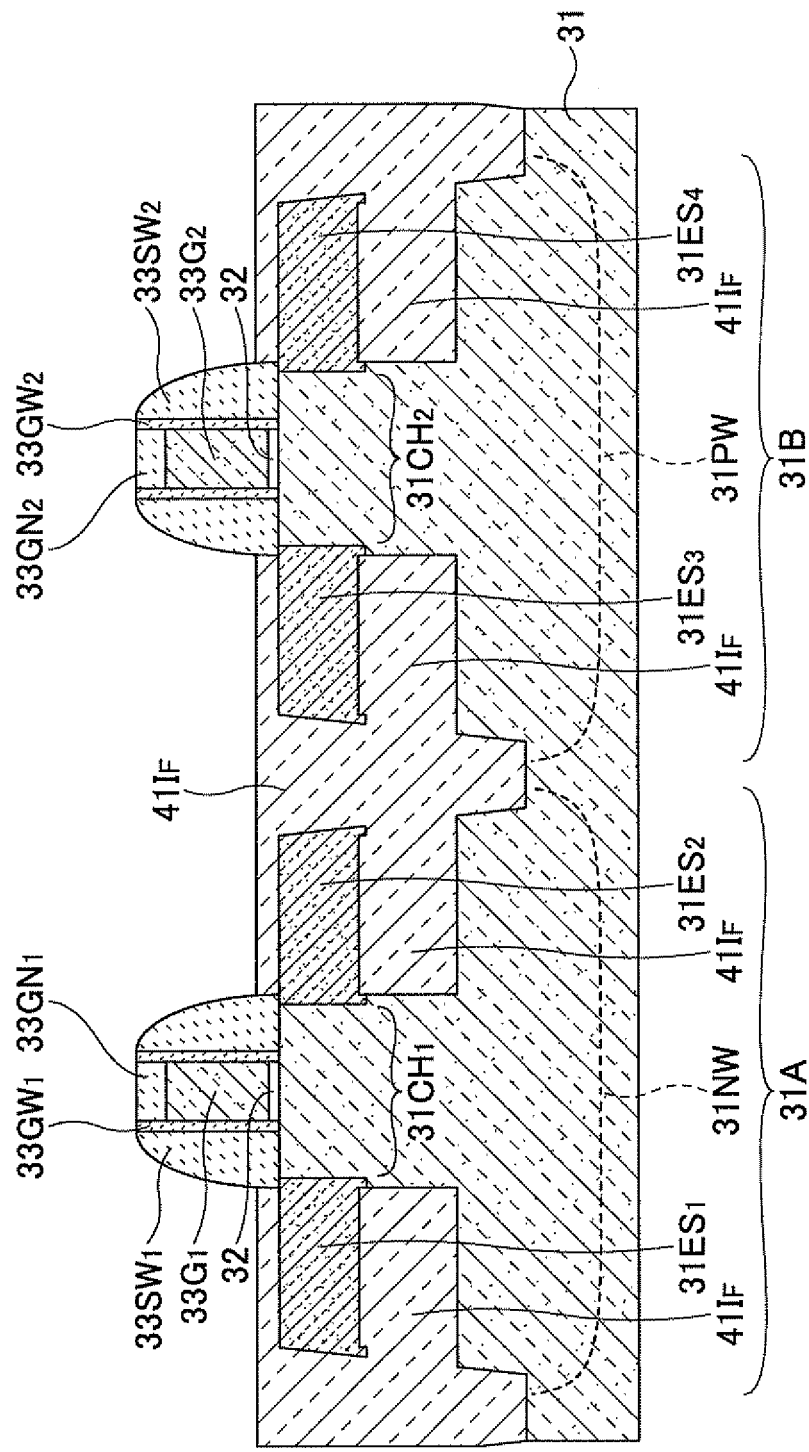
FIG. 7N is a cross-sectional diagram illustrating the method for fabricating the semiconductor device according to the fourth embodiment.

Next, as illustrated in FIG. 7M, the embedded insulating film $41I_F$ is planarized by a chemical mechanical polishing (CMP) or an etch back process. Further, as illustrated in FIG. 7N, the embedded insulating film $41I_E$ is etched by HF such that the side wall insulating films $33SW_1$ and $33SW_2$ are exposed while the surfaces of the silicon epitaxial layers $31ES_1$ to $31ES_4$ being covered with the embedded insulating film $41I_F$.

Further, as illustrated in FIG. 7O, the side wall insulating films $33SW_1$ and $33SW_2$ formed of the silicon nitride films are etched by wet etching utilizing phosphoric acid ($H_3PO_4$) as an etchant, and subsequently, the obtained structure is processed by HF again to expose the silicon epitaxial layers $31ES_1$ to $31ES_4$ in the process of FIG. 7P. Simultaneously, in this process, the side wall spacers $33GW_1$ and $33GW_2$ of the gate electrodes $31G_1$ and $32G_2$ are removed.

Figure 7P:
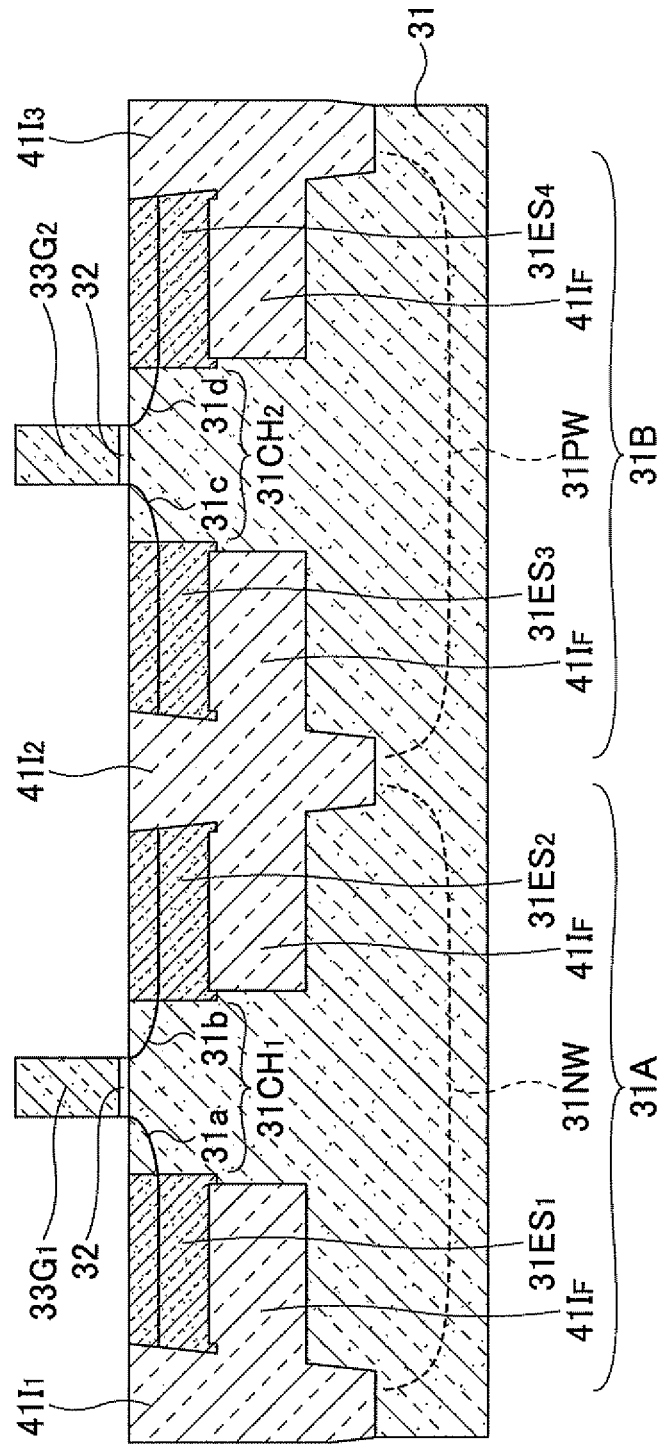
FIG. 7P is a cross-sectional diagram illustrating the method for fabricating the semiconductor device according to the fourth embodiment.

After having performed the process of FIG. 7P, the fabrication processes of the ordinary MOS transistor are conducted. Specifically, boron (B) is implanted in the silicon epitaxial layers $31ES_1$ and $31ES_2$ utilizing the gate electrode $33G_1$ as a mask while the device region 31B is covered with the resist mask (not illustrated). As a result, a p-type source extension region $31a$ and a p-type drain extension region $31b$ are formed. Similarly, arsenic (As) or phosphorus (P) is implanted in the silicon epitaxial layers $31ES_3$ and $31ES_4$ utilizing the gate electrode $33G_2$ as a mask while the device region 31A is covered with the resist mask (not illustrated). As a result, an n-type source extension region $31c$ and an n-type drain extension region $31d$ are formed.

Figure 7Q:
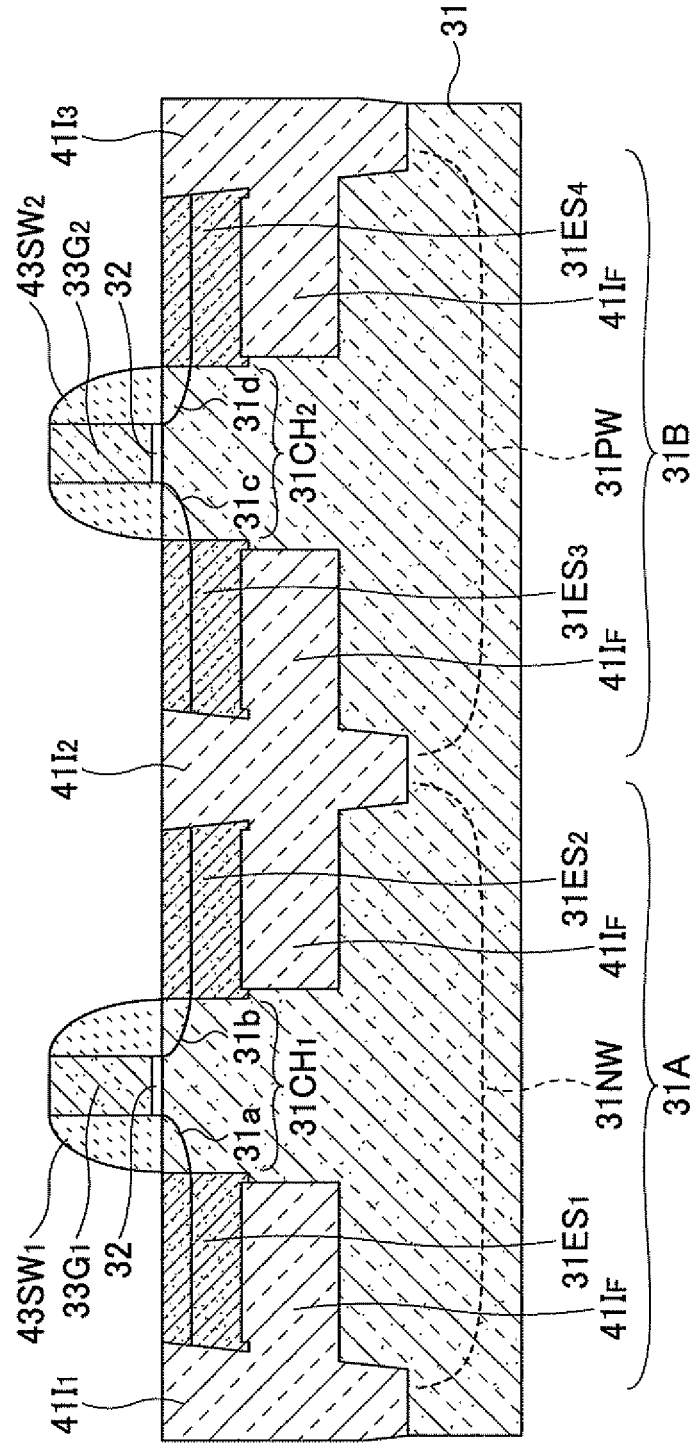
FIG. 7Q is a cross-sectional diagram illustrating the method for fabricating the semiconductor device according to the fourth embodiment.
Figure 7R:
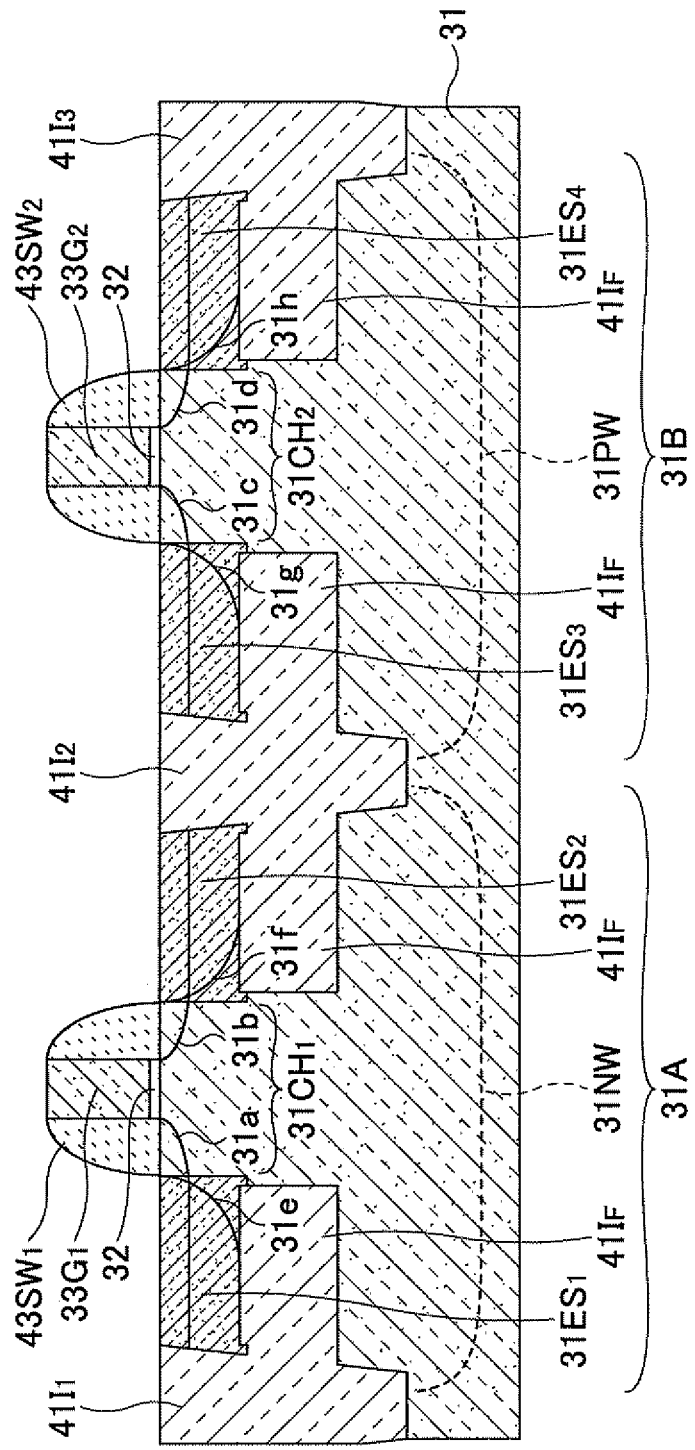
FIG. 7R is a cross-sectional diagram illustrating the method for fabricating the semiconductor device according to the fourth embodiment.

Further, as illustrated in FIG. 7Q, the side wall insulating films $43SW_1$ and $43SW_2$ formed of a silicon oxide film or a silicon nitride film are formed on the gate electrode $31G_1$ and $31G_2$. Subsequently, as illustrated in FIG. 7R, boron (B) is implanted in the silicon epitaxial layers $31ES_1$ and $31ES_2$ utilizing the gate electrode $33G_1$ and the side wall insulating films $43SW_1$ as a mask while the device region 31B is covered with the resist mask (not illustrated). As a result, a p-type source region $31e$ and a p-type drain region $31f$ are formed. Similarly, arsenic (As) or phosphorus (P) is implanted in the silicon epitaxial layers $31ES_3$ and $31ES_4$ utilizing the gate electrode $33G_2$ and the side wall insulating films $43SW_2$ as a mask while the device region 31A is covered with the resist mask (not illustrated). As a result, an n-type source region $31c$ and an n-type drain region $31d$ are formed.

Figure 8A:
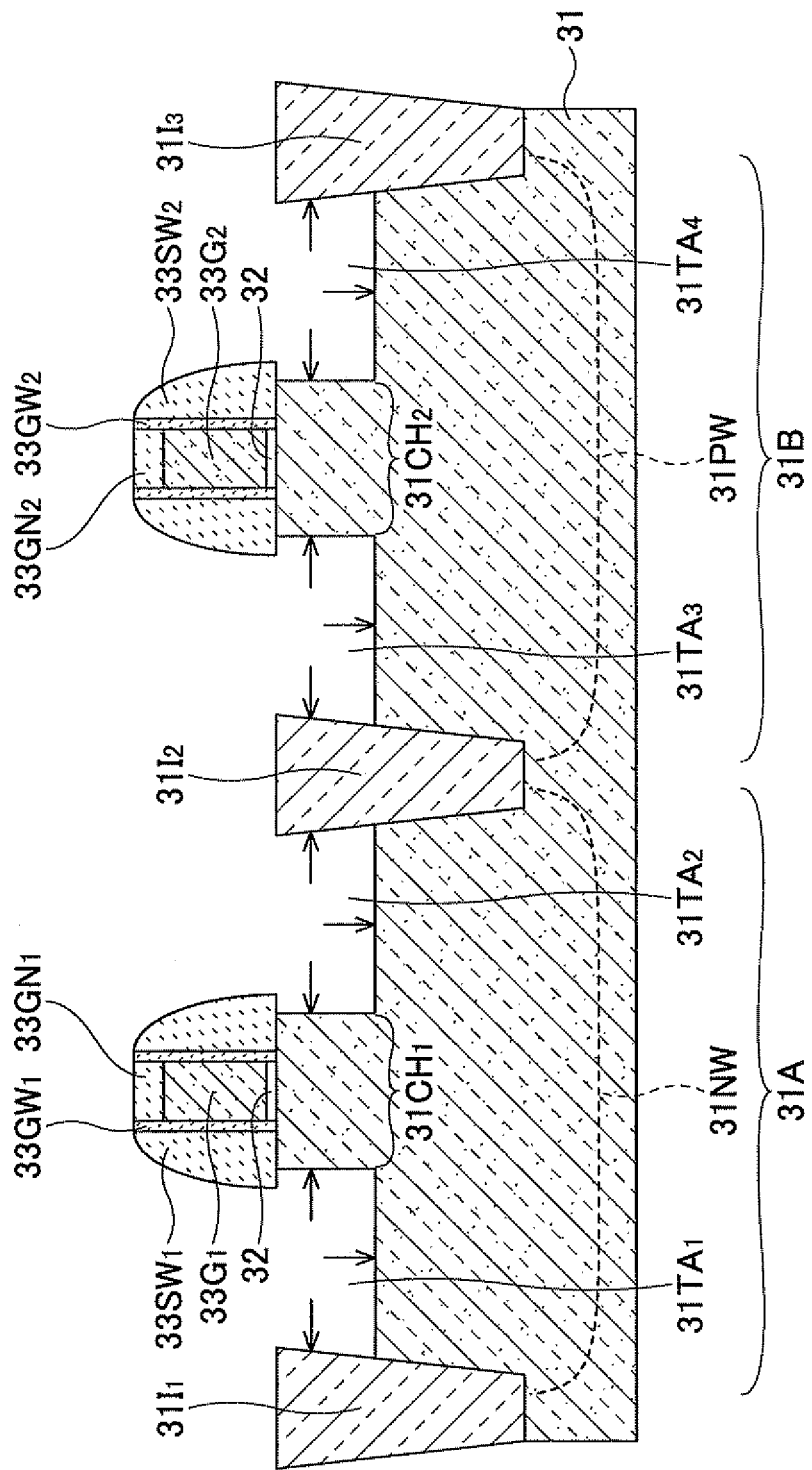
FIG. 8A is a cross-sectional diagram illustrating a method for fabricating a semiconductor device according to a modification of the fourth embodiment.

Note that in the fourth embodiment, an additional process, in which isotropic etching is performed on the structure obtained in FIG. 7B by utilzinig TMAH to extend (widen) the trenches $31TA_1$ to $31TA_4$ as indicated by arrows in FIG. 8A, may be carried out between the process of FIG. 7B and the process of FIG. 7C. In the process of FIG. 8A, the side surfaces of the trenches $31TA_1$ to $31TA_4$ that form the substrate part $31CH_1$ may be depressed and at the same time, the silicon residues $21s$ may be removed.

Figure 8B:
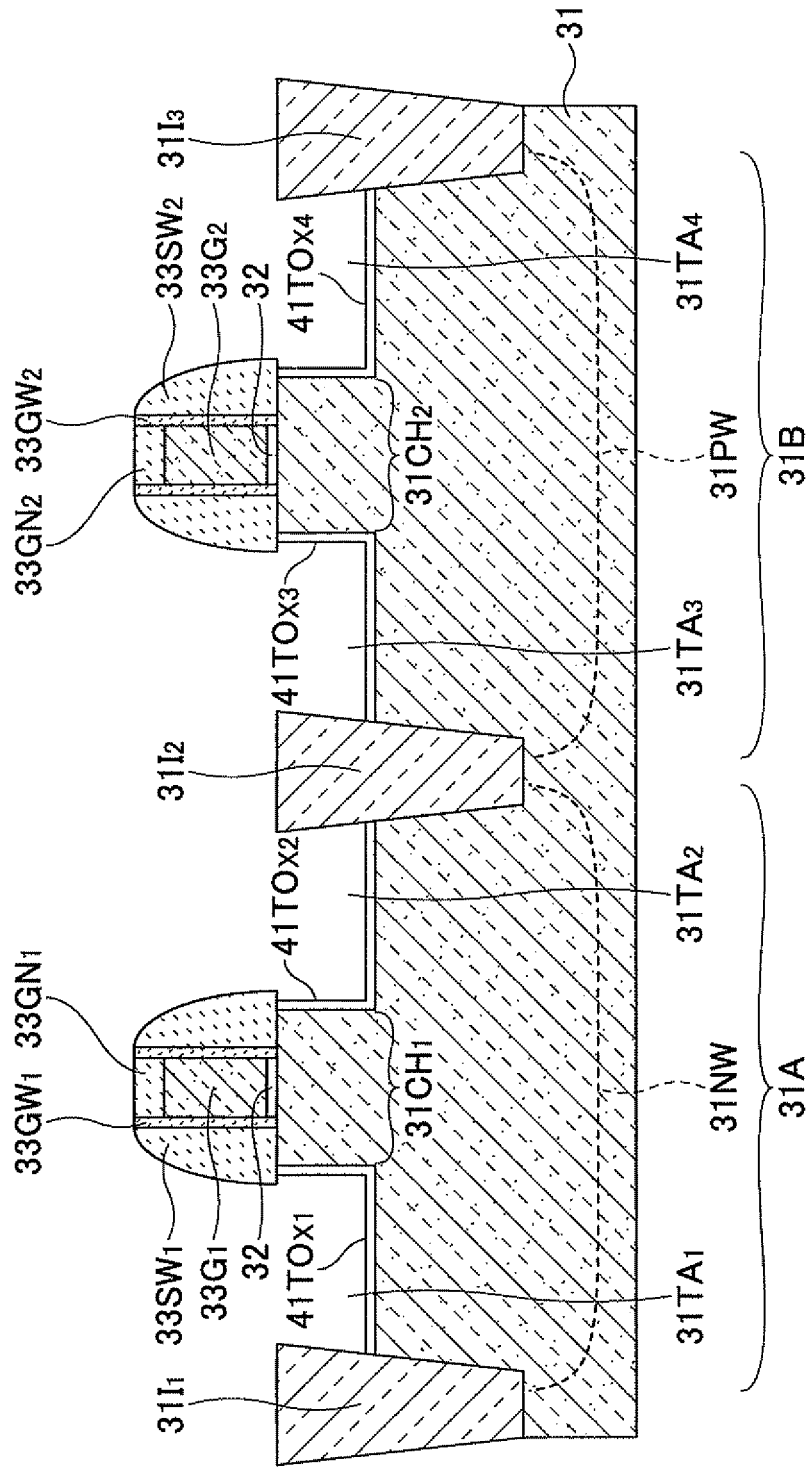
FIG. 8B is a cross-sectional diagram illustrating the method for fabricating the semiconductor device according to the modification of the fourth embodiment.

In such a modification, if the silicon oxide films $41TOx_1$ to $41TOx_4$ are formed by performing the oxidation process of FIG. 8B corresponding to the process of FIG. 7C, the silicon oxide films formed on the depressed side surfaces of the trenches $31TA_1$ to $31TA_4$ are protected by the side wall insulating film $33SW_1$ or $33SW_2$ of the gate electrode $33GN_1$ or $33GN_2$. Accordingly, even if the subsequently performed dry etching of FIG. 7D includes obliquely incident radicals, the silicon oxide films $41TOx_1$ to $41TOx_4$ will not be removed. Thus, the growth of the SiGe mixed crystal layers on the side surfaces of the trenches $31TA_1$ to $31TA_4$ may be reliably prevented.

According to the embodiments, even if the first and the second semiconductor layers formed beneath the third and the fourth semiconductor layers are selectively removed to form the voids, the third and the fourth semiconductor layers may still be supported and may not collapse due to the third and the fourth semiconductor layers respectively forming the source region and the drain region being bonded with the side surfaces of the first and the second trenches that form the semiconductor substrate. Accordingly, the voids may be filled with the embedded insulating film to form a semiconductor device locally having the SOI structure in the source region and the drain region.

Note that the modification of the fourth embodiment illustrated in FIGS. 8A and 8B may also be applicable to the first to the third embodiments.

The embodiments described so far are not limited thereto. Various modifications or alterations may be made within the scope of the inventions described in the claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

What is claimed is:

1. A method for fabricating a semiconductor device, the method comprising:
    forming a gate electrode on a first region of a semiconductor substrate formed of a first semiconductor, forming a first side wall insulating film on a first side surface of the gate electrode and forming a second side wall insulating film on a second side surface of the gate electrode;
    forming a first opening part and a second opening part with the first region interposed therebetween;
    forming a first insulating film on side surfaces and a bottom surface of the first opening part and also on side surfaces and a bottom surface of the second opening part;
    removing the first insulating film while allowing at least parts of the first insulating film to remain on the side surfaces of the first and the second opening parts;
    forming a first semiconductor layer and a second semiconductor layer in the first opening part and the second opening part, respectively, the first and the second semiconductor layers being formed of a second semiconductor which has etching selectivity to the first semiconductor;
    removing the first insulating film from the side surface of the first opening part and also from the side surface of the second opening part;
    forming a third semiconductor layer and a fourth semiconductor layer on the first semiconductor layer and the second semiconductor layer, respectively, after removing the first insulating film from the side surface of the first opening part and also from the side surface of the second opening part, the third and the fourth semiconductor layers being formed of the first semiconductor;
    exposing respective parts of the first semiconductor layer and the second semiconductor layer after forming the third semiconductor layer and the fourth semiconductor layer on the first semiconductor layer and the second semiconductor layer, respectively;
    removing the first and second semiconductor layers to form a third opening part and a fourth opening part after exposing the respective parts of the first semiconductor layer and the second semiconductor layer;
    forming a second insulating film in the third opening part and the fourth opening part; and
    implanting an impurity element in the third semiconductor layer and the fourth semiconductor layer to form a first diffusion region and a second diffusion region, respectively.

2. The method as claimed in claim 1, further comprising:
    performing isotropic etching on the first opening part and the second opening part to depress the side surfaces of the first and the second opening parts, the isotropic etching being performed after forming the first and the second opening parts and before forming the first insulating film.

3. The method as claimed in claim 1, wherein
    forming the first and the second opening parts includes:
    forming a first device isolation trench and a second device isolation trench in the semiconductor substrate;
    forming a third insulating film in each of the first device isolation trench and the second device isolation trench to form a first device isolation region and a second isolation region, respectively; and
    forming the first opening part and the second opening part to contact with the first device isolation region and the second isolation region, respectively, wherein
    exposing the first and the second semiconductor layers includes:
    removing the third insulating film from the first device isolation region and the second isolation region to form respective openings in the first device isolation trench and the second device isolation trench such that the first and the second semiconductor layers are exposed, and wherein
    forming the second insulating film in the third opening part and the fourth opening part includes:
    forming, after removing the third insulating film from the first device isolation trench and the second device isolation trench to form openings of the first device isolation trench and the second device isolation trench, the second insulating film in the openings of the first device isolation trench and the second device isolation trench.

4. The method as claimed in claim 1, wherein
    exposing the respective parts of the first semiconductor layer and the second semiconductor layer includes:
    covering the third semiconductor layer and the fourth semiconductor layer with a mask pattern; and
    etching the third semiconductor layer and the fourth semiconductor layer to form the first device isolation trench and the second device isolation trench, respectively, such that the first and the second semiconductor layers are exposed, and wherein
    forming the second insulating film in the third opening part and the fourth opening part includes:
    forming the second insulating film in the first device isolation trench and the second device isolation trench.

5. The method as claimed in claim 1, wherein
    the first insulating film is a silicon oxide film formed by one of a thermal oxidation process, a plasma oxidation process and a chemical vapor deposition process.

6. The method as claimed in claim 1, further comprising:
    forming a fifth semiconductor layer and a sixth semiconductor layer on the first semiconductor layer and the second semiconductor layer, respectively, before removing the first insulating film from the side surface of the first opening part and also from the side surface of the second opening part, the first insulating film being removed from the side surface of the first opening part and the side surface of the second opening part after forming the first semiconductor layer and the second semiconductor layer.

7. The method as claimed in claim 1, further comprising:
etching the bottom surfaces of the first opening part and the second opening part before forming the first semiconductor layer and the second semiconductor layer, the first semiconductor layer and the second semiconductor layer being formed after removing the first insulating layer from the bottom surfaces of the first opening part and the second opening part.

8. The method as claimed in claim 7, wherein
etching the bottom surfaces of the first opening part and the second opening part includes:
anisotropically etching the bottom surfaces of the first opening part and the second opening part; and
isotropically etching the bottom surfaces of the first opening part and the second opening part after anisotropically etching the bottom surfaces of the first opening part and the second opening part.

9. The method as claimed in claim 1, wherein
removing the first insulating film from the side surface of the first opening part and from the side surface of the second opening part includes:
removing the first insulating film from the side surface of the first opening part and from the side surface of the second opening part, excluding at least a part between the first semiconductor layer and the side surface of the first opening part and at least apart between the second semiconductor layer and the side surface of the second opening part.

10. The method as claimed in claim 1, wherein
forming the first and the second opening parts includes:
etching the semiconductor substrate utilizing the first side wall insulating film and the second side wall insulating film as a mask.

11. The method as claimed in claim 1, further comprising:
forming a gate electrode in the first region after forming the second insulating film in the third opening part and the fourth opening part; and
forming the first side wall insulating film on the first side surface of the gate electrode and the second side wall insulating film on the second side surface of the gate electrode.

* * * * *